(12) United States Patent
Shimizu et al.

(10) Patent No.: US 7,760,125 B2
(45) Date of Patent: Jul. 20, 2010

(54) A/D CONVERSION CIRCUIT FOR USE WITH LOW-POTENTIAL AND HIGH-POTENTIAL POWER SUPPLIES

(75) Inventors: Yoshiaki Shimizu, Kasugai (JP); Hisao Suzuki, Kasugai (JP); Kenji Ito, Kasugai (JP); Masashi Kijima, Kasugai (JP)

(73) Assignee: Fujitsu Microelectronics Limited, Yokohama (JP)

( * ) Notice: Subject to any disclaimer, the term of this patent is extended or adjusted under 35 U.S.C. 154(b) by 52 days.

(21) Appl. No.: 12/026,901

(22) Filed: Feb. 6, 2008

(65) Prior Publication Data

US 2009/0015450 A1 Jan. 15, 2009

Related U.S. Application Data

(60) Division of application No. 11/371,289, filed on Mar. 9, 2006, now Pat. No. 7,397,407, which is a continuation of application No. PCT/JP03/013401, filed on Oct. 21, 2003.

(51) Int. Cl.
*H03M 1/36* (2006.01)
(52) U.S. Cl. ...................... 341/159; 341/155
(58) Field of Classification Search .............. 341/155, 341/158, 159
See application file for complete search history.

(56) References Cited

U.S. PATENT DOCUMENTS 4,462,021 A 7/1984 Watanabe et al.
4,745,393 A 5/1988 Tsukada et al.
5,065,159 A 11/1991 Kuwana
5,302,869 A 4/1994 Hosotani et al.
5,327,135 A 7/1994 Hosotani et al.
5,579,006 A 11/1996 Hasegawa et al.

(Continued)

FOREIGN PATENT DOCUMENTS

JP 55-60333 A 5/1980

(Continued)

OTHER PUBLICATIONS

André Abrial et al.; "A Low-Power 8-b 13.5-MHz Video CMOS ADC for Visiophony ISDN Applications", 8107, IEEE Journal of Solid-State Circuits; vol. 28, No. 7, Jul. 1993; pp. 725-729.

(Continued)

*Primary Examiner*—Khai M Nguyen
(74) *Attorney, Agent, or Firm*—Arent Fox LLP

(57) ABSTRACT

An A/D conversion circuit including a plurality of resistor elements connected in series between a low-potential power supply and a high-potential power supply. The A/D conversion circuit includes a plurality of comparators that compare a reference voltage divided by each of the resistor elements with an analog input voltage, the comparators having a sample-and-hold function for holding a sampled analog input voltage. The plurality of comparators also include a high-order bit comparator and a low-order bit comparator having different sampling sources. The high-order bit comparator may be configured to compare the analog input voltage and one of the reference voltages to obtain a determination result. The low-order bit comparator may old the analog voltage from the time that the low-order bit comparator retrieves the analog input voltage until the low-order bit comparator performs comparison.

6 Claims, 40 Drawing Sheets

U.S. PATENT DOCUMENTS

| | | | |
|---|---|---|---|
| 5,708,434 | A | 1/1998 | Hasegawa |
| 5,798,725 | A * | 8/1998 | Okada .................. 341/158 |
| 6,075,477 | A | 6/2000 | Kokubun et al. |
| 6,150,967 | A | 11/2000 | Nakamura |
| 6,166,672 | A | 12/2000 | Park |
| 6,313,780 | B1 | 11/2001 | Hughes et al. |
| 6,356,223 | B1 | 3/2002 | Tanaka |
| 6,392,582 | B1 | 5/2002 | Nakamura |
| 6,680,685 | B2 * | 1/2004 | Nozaki .................. 341/158 |

FOREIGN PATENT DOCUMENTS

| | | |
|---|---|---|
| JP | 64-78526 A | 3/1989 |
| JP | 03-206729 A | 9/1991 |
| JP | 6-81048 B2 | 10/1994 |
| JP | 7-86941 A | 3/1995 |
| JP | 7-202698 A | 8/1995 |
| JP | 8-79080 A | 3/1996 |
| JP | 9-83369 A | 3/1997 |
| JP | 11-214998 A | 8/1999 |
| JP | 2001-51661 A | 2/2001 |
| WO | 00/19614 A2 | 4/2000 |

OTHER PUBLICATIONS

Masumi Kasahara et al., "A CMOS 9 bit 25MHz 100mW ADC for Mixed Analog/Digital LSIs", Proceedings of the Custom Integrated Circuits Conference. San Diego, May 12, 15, 1991; [Proceedings of the Custom Integrated Circuits Conference], New York, IEEE, US, vol. Conf. 13, May 12, 1991, pp. 26.7/1-26.7/4.

Michio Yotsuyanagi et al., "Special Issue Brief Papers", IEEE Journal of Solid-State Circuits, IEEE Service Center, Dec. 31, 1995, pp. 1533-1537, vol. 30, No. 12, Piscataway, NJ, US.

Andrew Cable et al., "A 6-Bit 50MH$_z$ Current-Subtracting Two Step Flash Converter", International Symposium on Circuits and Systems. (ISCAS). Digital Signal Processing (DSP). London, May 30-Jun. 2, 1994; International Symposium on Circuits and Systems. (ISCAS), May 30, 1994, pp. 465-468, vol. 5, New York, US.

Soung Hoon Shim et al., "A 10-Bit Current-Mode Low-Power CMOS A/D Converter with a Current Predictor and A Modular Current Reference", Circuits and Systems, 1997, Proceedings of the 40$^{th}$ Midwest Symposium on Sacramento, CA, USA Aug. 3-6, 1997, pp. 342-345, vol. 1, New York, NY.

* cited by examiner

C: Compare
R: Retrieve

Fig.8

| VIN Voltage | D1 Output | SW Selection |
|---|---|---|
| VIN<V22 | 0 | SW1 |
| VIN≥V22 | 1 | SW2 |

Fig.9

| VIN Voltage | | D0 Output |
|---|---|---|
| VIN<V22 | VIN<V21 | 0 |
| | VIN≥V21 | 1 |
| VIN≥V22 | VIN<V23 | 0 |
| | VIN≥V23 | 1 |

Fig.10

| VIN Voltage | D1 Output | D0 Output |
|---|---|---|
| VRL≤VIN<V21 | 0 | 0 |
| V21≤VIN<V22 | 0 | 1 |
| V22≤VIN<V23 | 1 | 0 |
| V23≤VIN≤VRH | 1 | 1 |

| CMP1 Operation State | SWA | SWB | SWC |
|---|---|---|---|
| V22 Retrieval | OFF | ON | ON |
| Voltage Comparison | ON | OFF | OFF |

| CMP2 Operation State | SWA | SWB | SWC |
|---|---|---|---|
| VIN Retrieval | ON | OFF | ON |
| Voltage Comparison | OFF | ON | OFF |

Fig.18

| A | B | C | D | CO1 | CO2 | CO3 | DO1 | DO0 |
|---|---|---|---|-----|-----|-----|-----|-----|
| H | H | H | H | L | L | L | L | L |
| H | H | H | L | L | L | H | L | H |
| H | H | L | L | L | H | H | H | L |
| H | L | L | L | H | H | H | H | H |

Fig.19

| A | B | C | D | CO1 | CO2 | CO3 | DO1 | DO0 |
|---|---|---|---|-----|-----|-----|-----|-----|
| H | H | H | H | L | L | L | H | H |
| H | H | H | L | L | L | H | H | L |
| H | H | L | L | L | H | H | L | H |
| H | L | L | L | H | H | H | L | L |

Fig.20

| 1st Stage Unit | | | | A Unit | | B Unit | | C Unit | | D Unit | |
|---|---|---|---|---|---|---|---|---|---|---|---|
| IN | Input Range | D3 | D2 | D1a | D0a | D1b | D0a | D1c | D0c | D1d | D0d |
| 0.5 | 0-1 | L | L | L | L | L | L | L | L | L | L |
| 1.5 | 1-2 | L | L | L | L | L | L | L | L | L | H |
| 2.5 | 2-3 | L | L | L | L | L | L | L | L | H | L |
| 3.5 | 3-4 | L | L | L | L | L | L | L | L | H | H |
| 4.5 | 4-5 | L | H | L | L | L | L | L | L | H | H |
| 5.5 | 5-6 | L | H | L | L | L | L | L | H | H | H |
| 6.5 | 6-7 | L | H | L | L | L | L | H | L | H | H |
| 7.5 | 7-8 | L | H | L | L | L | L | H | H | H | H |
| 8.5 | 8-9 | H | L | L | L | L | L | H | H | H | H |
| 9.5 | 9-10 | H | L | L | L | L | H | H | H | H | H |
| 10.5 | 10-11 | H | L | L | L | H | L | H | H | H | H |
| 11.5 | 11-12 | H | L | L | L | H | H | H | H | H | H |
| 12.5 | 12-13 | H | H | L | L | H | H | H | H | H | H |
| 13.5 | 13-14 | H | H | L | H | H | H | H | H | H | H |
| 14.5 | 14-15 | H | H | H | L | H | H | H | H | H | H |
| 15.5 | 15-16 | H | H | H | H | H | H | H | H | H | H |

| A | B | C | D | W0 | W1 | W2 | W3 | W4 | CO1 | CO2 | CO3 | DO1 | DO0 |
|---|---|---|---|----|----|----|----|----|-----|-----|-----|-----|-----|
| H | H | H | H | H  | H  | H  | H  | L  | L   | L   | L   | L   | L   |
| H | H | H | L | H  | H  | H  | L  | L  | L   | L   | H   | L   | H   |
| H | H | L | L | H  | H  | L  | L  | L  | L   | H   | H   | H   | L   |
| H | L | L | L | H  | L  | L  | L  | L  | H   | H   | H   | H   | H   |

| IN | Input Range | 1st Stage Unit W Output | | | | | D3 | D3 | A Unit | | B Unit | | C Unit | | D Unit | |
|---|---|---|---|---|---|---|---|---|---|---|---|---|---|---|---|---|
| | | W0 | W1 | W2 | W3 | W4 | | | D1a | D0a | D1b | D0b | D1c | D0c | D1d | D0d |
| 0.5 | 0-1 | H | H | H | H | L | L | L | L | L | L | L | L | L | L | L |
| 1.5 | 1-2 | H | H | H | H | L | L | L | L | L | L | L | L | L | L | H |
| 2.5 | 2-3 | H | H | H | H | L | L | L | L | L | L | L | L | L | H | L |
| 3.5 | 3-4 | H | H | H | H | L | L | L | L | L | L | L | L | L | H | H |
| 4.5 | 4-5 | H | H | H | L | L | L | H | L | L | L | L | L | L | H | H |
| 5.5 | 5-6 | H | H | H | L | L | L | H | L | L | L | L | L | H | H | H |
| 6.5 | 6-7 | H | H | H | L | L | L | H | L | L | L | L | H | L | H | H |
| 7.5 | 7-8 | H | H | H | L | L | L | H | L | L | L | L | H | H | H | H |
| 8.5 | 8-9 | H | H | L | L | L | H | L | L | L | L | L | H | H | H | H |
| 9.5 | 9-10 | H | H | L | L | L | H | L | L | L | L | H | H | H | H | H |
| 10.5 | 10-11 | H | H | L | L | L | H | L | L | L | H | L | H | H | H | H |
| 11.5 | 11-12 | H | H | L | L | L | H | L | L | L | H | H | H | H | H | H |
| 12.5 | 12-13 | H | L | L | L | L | H | H | L | L | H | H | H | H | H | H |
| 13.5 | 13-14 | H | L | L | L | L | H | H | L | H | H | H | H | H | H | H |
| 14.5 | 14-15 | H | L | L | L | L | H | H | H | L | H | H | H | H | H | H |
| 15.5 | 15-16 | L | L | L | L | L | H | H | H | H | H | H | H | H | H | H |

Fig.30

| 1st Stage | | | 2nd Stage | | | | | | | | |
|---|---|---|---|---|---|---|---|---|---|---|---|
| Input Current Range | D3 | D2 | Input Current Range | A Unit | | B Unit | | C Unit | | D Unit | |
| | | | | D1a | D0a | D1b | D0b | D1c | D0c | D1d | D0d |
| 0-1 | L | L | 4-3 | — | — | — | — | — | — | L | L |
| 1-2 | L | L | 3-2 | — | — | — | — | — | — | L | H |
| 2-3 | L | L | 2-1 | — | — | — | — | — | — | H | L |
| 3-4 | L | L | 1-0 | — | — | — | — | — | — | H | H |
| 4-5 | L | H | 4-3 | — | — | — | — | L | L | — | — |
| 5-6 | L | H | 3-2 | — | — | — | — | L | H | — | — |
| 6-7 | L | H | 2-1 | — | — | — | — | H | L | — | — |
| 7-8 | L | H | 1-0 | — | — | — | — | H | H | — | — |
| 8-9 | H | L | 4-3 | — | — | L | L | — | — | — | — |
| 9-10 | H | L | 3-2 | — | — | L | H | — | — | — | — |
| 10-11 | H | L | 2-1 | — | — | H | L | — | — | — | — |
| 11-12 | H | L | 1-0 | — | — | H | H | — | — | — | — |
| 12-13 | H | H | 4-3 | L | L | — | — | — | — | — | — |
| 13-14 | H | H | 3-2 | L | H | — | — | — | — | — | — |
| 14-15 | H | H | 2-1 | H | L | — | — | — | — | — | — |
| 15-16 | H | H | 1-0 | H | H | — | — | — | — | — | — |

Fig.33

| In1 (Ina, Inb) | Comparator Output | | 1st Stage Output Current | | | | | CON OUT | ON SW | INOUT |
|---|---|---|---|---|---|---|---|---|---|---|
| | Lower Stage C00~C03 | Upper Stage C04~C07 | A | B | C | D | E | | | |
| 0-1 | LLLL | LLLL | 20-18 | 16-14 | 12-10 | 8-6 | 4-2 | L | SWE | 4-2 |
| 2-4 | LLLL | LLLH | 18-16 | 14-12 | 10-8 | 6-4 | 2-0 | H | SWD | 6-4 |
| 4-6 | LLLH | LLLH | 16-14 | 12-10 | 8-6 | 4-2 | 0 | L | SWD | 4-2 |
| 6-8 | LLLH | LLHH | 14-12 | 10-8 | 6-4 | 2-0 | 0 | H | SWC | 6-4 |
| 8-10 | LLHH | LLHH | 12-10 | 8-6 | 4-2 | 0 | 0 | L | SWC | 4-2 |
| 10-12 | LLHH | LHHH | 10-8 | 6-4 | 2-0 | 0 | 0 | H | SWB | 6-4 |
| 12-14 | LHHH | LHHH | 8-6 | 4-2 | 0 | 0 | 0 | L | SWB | 4-2 |
| 14-16 | LHHH | HHHH | 6-4 | 2-0 | 0 | 0 | 0 | H | SWA | 6-4 |

Fig. 35

| 1st Stage Unit | | | | SW | | | | 2nd Stage | | | | | | | |
|---|---|---|---|---|---|---|---|---|---|---|---|---|---|---|---|
| | | | | | | | | A Unit | | B Unit | | C Unit | | D Unit | |
| Input Range | D3 | D2 | CON OUT | A1 | B1 | C1 | D1 | D1a | D0a | D1b | D0b | D1c | D0c | D1d | D0d |
| 0-1 | L | L | L | b | b | b | b | – | – | – | – | – | – | L | L |
| 1-2 | L | L | L | b | b | b | b | – | – | – | – | – | – | L | H |
| 2-3 | L | L | H | b | b | b | a | – | – | – | – | – | – | H | L |
| 3-4 | L | L | H | b | b | b | a | – | – | – | – | – | – | H | H |
| 4-5 | L | H | L | b | b | b | b | – | – | – | – | L | L | – | – |
| 5-6 | L | H | L | b | b | b | b | – | – | – | – | L | H | – | – |
| 6-7 | L | H | H | b | b | a | b | – | – | – | – | H | L | – | – |
| 7-8 | L | H | H | b | b | a | b | – | – | – | – | H | H | – | – |
| 8-9 | H | L | L | b | b | b | b | – | – | L | L | – | – | – | – |
| 9-10 | H | L | L | b | b | b | b | – | – | L | H | – | – | – | – |
| 10-11 | H | L | H | b | a | b | b | – | – | H | L | – | – | – | – |
| 11-12 | H | L | H | b | a | b | b | – | – | H | H | – | – | – | – |
| 12-13 | H | H | L | b | b | b | b | L | L | – | – | – | – | – | – |
| 13-14 | H | H | L | b | b | b | b | L | H | – | – | – | – | – | – |
| 14-15 | H | H | H | a | b | b | b | H | L | – | – | – | – | – | – |
| 15-16 | H | H | H | a | b | b | b | H | H | – | – | – | – | – | – |

Fig.37

| In1 (Ina, Inb) | 2nd Stage Output Current | | | | |
|---|---|---|---|---|---|
| | A | B | C | D | E |
| 0.0-0.5 | 20-18 | 16-14 | 12-10 | 8-6 | 4-2 |
| 0.5-1.0 | 18-16 | 14-12 | 10-8 | 6-4 | 2-0 |
| 1.0-1.5 | 16-14 | 12-10 | 8-6 | 4-2 | 0 |
| 1.5-2.0 | 14-12 | 10-8 | 6-4 | 2-0 | 0 |
| 2.0-2.5 | 12-10 | 8-6 | 4-2 | 0 | 0 |
| 2.5-3.0 | 10-8 | 6-4 | 2-0 | 0 | 0 |
| 3.0-3.5 | 8-6 | 4-2 | 0 | 0 | 0 |
| 3.5-4.0 | 6-4 | 2-0 | 0 | 0 | 0 |

Fig.38

| In1 (Ina, Inb) | 2nd Stage Output Current | | | | |
|---|---|---|---|---|---|
| | A | B | C | D | E |
| 4.0-4.5 | 20-18 | 16-14 | 12-10 | 8-6 | 4-2 |
| 4.5-5.0 | 18-16 | 14-12 | 10-8 | 6-4 | 2-0 |
| 5.0-5.5 | 16-14 | 12-10 | 8-6 | 4-2 | 0 |
| 5.5-6.0 | 14-12 | 10-8 | 6-4 | 2-0 | 0 |

R: Retrieve
C: Compare

| CMP Operation State | SWA | SWB | SWC |
|---|---|---|---|
| Retrieve VIN | ON | OFF | ON |
| Hold Voltage | OFF | OFF | OFF or ON |
| Compare Voltage | OFF | ON | OFF |

R:Retrieve
C:Compare

A/D CONVERSION CIRCUIT FOR USE WITH LOW-POTENTIAL AND HIGH-POTENTIAL POWER SUPPLIES

CROSS-REFERENCE TO RELATED APPLICATIONS

This application is a Divisional application, which claims the benefit of U.S. patent application Ser. No. 11/371,289 filed, Mar. 9, 2006 now U.S. Pat. No. 7,397,407, which also claims the benefit of continuation international patent application No. PCT/JP2003/013401, filed Oct. 21, 2003, the entire contents being incorporated herein by reference.

BACKGROUND OF THE INVENTION

The present invention relates to a D/A conversion circuit and an A/D conversion circuit used as an interface circuit for connecting a digital signal and an analog signal in a semiconductor integrated circuit (LSI).

Recently, LSI circuits have become systematized, and an analog or digital circuit, which was produced from a plurality of chips, has been integrated into a single chip as a system LSI. Such LSI circuits include an A/D conversion circuit or D/A conversion circuit functioning as an interface circuit connecting a digital signal and an analog signal. The operation speed is required to be increased and the control accuracy is required to be enhanced in a system LSI circuit. Therefore, an advanced technique is also required for the interface circuit used therein (A/D conversion circuit and D/A conversion circuit) to perform signal conversion between digital and analog signals at high speed and high accuracy.

FIG. 45 is a circuit diagram showing a conventional D/A conversion circuit 1. The D/A conversion circuit 1 is a resistor string type 4-bit D/A conversion circuit, and a plurality of (sixteen) resistor elements R0 to R15 having the same resistance value are connected in series between a high-potential power supply VRH and a low-potential power supply VRL. Switches SW0 to SW15 are respectively connected to connection nodes of the resistor element R0 to R15 for selectively outputting divided voltages (V0 to V15) of the connection nodes. The outputs of the switches SW0 to SW15 are connected to an output terminal OUT.

The D/A conversion circuit 1 is controlled so that one of the switches SW0 to SW15 is turned on (while the other switches are turned off) in accordance with an input signal (4-bit digital signal), and a predetermined divided voltage is output from the output terminal OUT through the turned-on switch.

In the D/A conversion circuit 1, an analog switch formed by a MOS transistor is used as each of the switches SW0 to SW15. When switching the switches SW0 to SW15 in accordance with the input signal, it is necessary to stabilize (converge) fluctuations in the output voltage associated with the switching by supplying charge to parasitic capacitors C0 to C15 of the switches SW0 to SW15 from the resistor string (the connection nodes of the resistor elements).

Since all of the switches SW0 to SW15 are connected to the output terminal OUT in the conventional D/A conversion circuit 1, the charge transfer amount is equal to the sum of the parasitic capacitors C0 to C15 of the switches SW0 to SW15. Accordingly, the parasitic capacitor (sum of the capacitances C0 to C15) as viewed from the output terminal OUT is large. This poses a problem in that it takes time to charge the parasitic capacitors C0 to C15, and the conversion speed is decreased.

Japanese Laid-Open Patent Publication No. 9-83369 discloses a technique to reduce the parasitic capacitor as viewed from the output terminal OUT and improve the conversion speed in a similar resistor string type D/A conversion circuit as described above. FIG. 46 shows the 3-bit D/A conversion circuit 2 disclosed in the above patent publication. The D/A conversion circuit 2 includes switches SW0 to SW13 forming a tree structure having a plurality of stages (three stages). The D/A conversion circuit 2 is capable of reducing the parasitic capacitor of the switches SW0 to SW13 as viewed from the output terminal OUT and increases the conversion speed. Japanese Laid-Open Patent Publication No. 3-206729 and Japanese Laid-Open Patent Publication No. 55-60333 also disclose D/A conversion circuits having the switches SW0 to SW13 forming a tree structure with a plurality of stages in a similar manner to the D/A conversion circuit 2 shown in FIG. 46.

FIG. 47 is a circuit diagram showing a conventional serial and parallel A/D conversion circuit 3, and FIG. 48 is an explanatory diagram illustrating operation thereof.

The A/D conversion circuit 3 is a 2-bit serial and parallel A/D converter. A plurality of comparators CMP1, CMP2, and CMP3 are used to divide the bits into high-order bits and low-order bits for sequentially performing A/D conversion. In the A/D conversion circuit 3, four resistor elements R21 to R24 having an identical resistance value are connected in series between a high-potential power supply VRH and a low-potential power supply VRL. The comparators CMP1, CMP2, and CMP3 each retrieve an input voltage VIN to compare the input voltage VIN with reference voltages V21, V22, V23 divided by the resistor element string, and output digital signals D0 and D1 in accordance with the comparison results.

More specifically, a first switch SW21 is connected between the resistor elements R21 and R22 for transferring the reference voltage V21, and a second switch SW22 is connected between the resistor elements R23 and R24 for transferring the reference potential V3. The outputs of the switch SW21 and SW22 are connected to each other, and the connection nodes thereof are connected to the comparator CMP2 through the third switch SW23, while being connected to the comparator CMP3 through the fourth switch SW24. The connection nodes of the switches SW21 to SW24 are connected to the low-potential power supply VRL through a capacitor C20. The output terminal of the comparator CMP2 is connected to a fifth switch SW25, while the output terminal of the comparator CMP3 is connected to a sixth switch SW26.

The comparator CMP1 retrieves an input voltage VIN to compare the input voltage VIN with the reference voltage V22 between the resistor elements R22 and R23 and outputs a high-order bit signal D1. The comparator CMP2 and CMP3 retrieve the input voltage VIN to compare the input voltage VIN with the reference voltage V21 between the resistor elements R21 and R22 or the reference voltage V23 between the resistor elements R22 and R23 and output a low-order bit signal D0.

The first switch SW21 and the second switch SW22 are complementarily turned on and off by a first selection circuit 4 operating based on the output signal D1 from the comparator CMP1. The third switches SW23 and SW25 and the fourth switches SW24 and SW26 are complementarily turned on and off by a second selection circuit 5 operating based on an external clock CLK.

FIG. 49 is a circuit diagram of the first selection circuit 4, and FIG. 50 is a circuit diagram of the second selection circuit 5 and the comparator CMP1.

As shown in FIG. 49, the first selection circuit 4 includes two inverter circuits 4a and 4b connected in series, and the output signal D1 from the comparator CMP1 is input to the input terminal of the inverter circuit 4a. An output signal from the inverter circuit 4a is provided to the first switch SW21, and an output signal from the inverter circuit 4b is provided to the second switch SW22.

If the input voltage VIN is higher than the reference voltage V22, the output signal D1 from the comparator CMP1 shifts to an H level. In this case, an L level signal is provided to the first switch SW21 from the inverter circuit 4a of the first selection circuit 4, and an H level signal is provided to the second switch SW22 from the inverter circuit 4b. Thus, the first switch SW21 is turned off and the second switch SW22 is turned on. Further, the reference voltage V23 is input to the comparator CMP2 or the comparator CMP3 through the switch SW22. In contrast, if the input voltage VIN is lower than the reference voltage V22, the output signal D1 of the comparator CMP1 shifts to an L level. In this case, an H level signal is provided to the first switch SW21 from the inverter circuit 4a of the first selection circuit 4, and an L level signal is provided to the second switch SW22 from the inverter circuit 4b. Thus, the first switch SW21 is turned on and the second switch SW22 is turned off. Further, the reference voltage V21 is input to the comparator CMP2 or the comparator CMP3 through the switch SW21.

As shown in FIG. 50, the comparator CMP1 is a chopper type comparator including an inverter circuit 7, a capacitor C21, and switches SWA, SWB and SWC. In the comparator CMP1, a first electrode of the capacitor C21 is connected to a first input terminal IN1 via the switch SWA and is connected to a second input terminal IN2 via the switch SWB. A second electrode of the capacitor C21 is connected to an output terminal OUT1 via the inverter circuit 7, and the input and output terminals of the inverter circuit 7 are connected to each other via the switch SWC.

The comparator CMP1 repeatedly performs operations to retrieve the input voltage VIN and to compare the input voltage VIN with the reference voltage V22 based on a clock CLK supplied via the second selection circuit 5.

When the comparator CMP1 retrieves the input voltage VIN, the switch SWA is turned on, the switch SWB is turned off, and the switch SWC is turned on. In the meantime, the capacitor C21 is charged by the input voltage VIN applied thereto via the switch SWA. Since the switch SWC is turned on, the input and output terminals of the inverter circuit 7 are short-circuited so that the input/output voltage of the inverter circuit 7 is reset to a threshold voltage.

Thereafter, when the comparator CMP1 compares the input voltage VIN with the reference voltage V22, the switch SWA is turned off, the switch SWB is turned on, and the switch SWC is turned off. In the meantime, the reference voltage V22 is input to the capacitor C21 via the switch SWB. If the input voltage VIN is higher than the reference voltage V22 (VIN>V22), the voltage input to the inverter circuit 7 via the capacitor C21 becomes lower than the threshold voltage, and the output signal output from the inverter circuit 7 shifts to an H level. In contrast, if the input voltage VIN is lower than the reference voltage V22 (VIN<V22), the voltage input to the inverter circuit 7 via the capacitor C21 becomes higher than the threshold voltage, and the output signal output from the inverter circuit 7 shifts to an L level.

Although not shown, the other comparators CMP2 and CMP3 also have the same circuit configuration as the comparator CMP1 shown in FIG. 50 and operate in accordance with a clock CLK.

The second selection circuit 5 has a plurality of inverter circuits 5a to 5c and a D-type flip-flop circuit (D-FF) 5d. The flip-flop circuit 5d receives, at its clock terminal CK, an inverted signal of the clock CLK through the inverter circuit 5a. The input terminal D of the flip-flop circuit 5d is connected to the inverting output terminal XQ. An output signal output from the output terminal Q of the flip-flop circuit 5d is provided to the switches SW23 and SW25 and also provided to the switches SW24 and SW26 after being inverted by the inverter circuit 5c. Accordingly, the output signal from the flip-flop circuit 5d is changed alternately between an H level and an L level in each cycle of the clock CLK.

When the output signal of the flip-flop circuit 5d is at an H level, the switches SW23 and SW25 are turned on, while the switches SW24 and SW26 are turned off. An output signal D0 according to the result of voltage comparison by the comparator CMP2 is output through the switch SW25. In contrast, when the output signal of the flip-flop circuit 5d is at an L level, the switches SW23 and SW25 are turned off, while the switches SW24 and SW26 are turned on. An output signal D0 according to the result of voltage comparison by the comparator CMP3 is output through the switch SW26.

Operation of the A/D conversion circuit 3 will now be described.

As shown in FIG. 48, the comparator CMP1 repeatedly performs the operation of retrieving the input voltage VIN and the operation of comparing the voltages VIN and V22 in synchronization with the clock CLK. The third switch SW23 (fifth switch SW25) and the fourth switch SW24 (sixth switch SW26) are switched on and off every single period during which the comparator CMP1 performs the retrieval and comparison.

More specifically, the third switch SW23 (fifth switch SW5) is off and the fourth switch SW24 (sixth switch SW26) is on during the period from time t1 to t3. During the period from time t3 to t5, the third switch SW23 (fifth switch SW5) is on and the fourth switch SW24 (sixth switch SW26) is off. Further, during the period from time t5 to t7, the third switch SW23 (fifth switch SW5) is off and the fourth switch SW24 (sixth switch SW26) is on.

During the period from time t1 to t2, the comparators CMP1 and CMP2 retrieve the input voltage VIN having a voltage value equal to that of the high-potential power supply VRH. During the subsequent period from time t2 to t3, the comparator CMP1 compares the input voltage VIN with the reference voltage V22 and outputs an H level signal D1. The comparator CMP2 holds the input voltage VIN retrieved in the previous period (t1 to t2) during the period from time t2 to t3.

At time t3, the first switch SW21 is turned off and the second switch SW22 is turned on by the H level output signal D1 output from the comparator CMP1. Therefore, the reference voltage V23 is input to the comparator CMP2 through the second switch SW22 and the third switch SW23, during the period from time t3 to t5. During this period, the comparator CMP2 compares the input voltage VIN with the reference voltage V23 and outputs an H level signal D0 through the fifth switch SW25.

During the period from time t3 to t4, the comparators CMP1 and CMP3 retrieve the input voltage VIN. In the period from time t4 to t5, the comparator CMP1 compares the input voltage VIN with the reference voltage V22, and outputs an H level signal D1. During this period, the comparator CMP3 holds the input voltage VIN retrieved in the previous period (t3 to t4).

At time t5, the first switch SW21 is kept off and the second switch SW22 is kept on by the H level output signal D1 output from the comparator CMP1. Consequently, the reference voltage V23 is input to the comparator CMP3 through the second switch SW22 and the fourth switch SW24 during the period from time t5 to t7. The comparator CMP3 compares the input voltage VIN with the reference voltage V23 and outputs an H level signal D0 through the sixth switch SW26.

In this manner, the A/D conversion circuit 3 converts a continuous analog signal (input voltage VIN) into 2-bit digital signals D0 and D1 by repeatedly performing the operation as described above.

An A/D conversion circuit designed to output a digital signal by using a hierarchical tree structure including a current mirror circuit for distributing input current has also been proposed (for example, see Japanese Laid-Open Patent Publication No. 7-202698). FIG. 51 is a circuit diagram showing such an A/D conversion circuit 8.

Operation of the A/D conversion circuit 8 will now be described. First, an analog input voltage Vin is voltage-to-current converted by a converter 8a, and the analog current Iin obtained by the conversion is transferred to a first current adder/subtractor circuit 9. Next, the output current from the first current adder/subtractor circuit 9 is transferred to two current adder/subtractor circuits 9. The values of the currents transferred to these two circuits are equivalent to each other. Upon receipt of the current, the two current adder/subtractor circuits 9a and 9b add or subtract different current values to or from the received current value. Each of the currents obtained by the addition or subtraction processing in the two current adder/subtractor circuits 9a and 9b (output currents from the current adder/subtractor circuits 9a and 9b) is transferred to two current adder/subtractor circuits 9aa and 9ab, and 9ba and 9bb and undergoes addition or subtraction processing. Such an addition or subtraction processing is repeated sequentially up to the final-stage current adder/subtractor circuits. It is determined by comparators H1 to H16 whether the outputs of the final-stage current adder/subtractor circuits are high or low. The outputs of the comparators H1 to H16 are converted to a digital code by an encoder circuit 10 and the digital code is output.

FIG. 52 is a conceptual diagram of the A/D conversion circuit 8 shown in FIG. 51. In FIG. 52, each numeric value shown below each branching point indicates the current value that is to be added or subtracted at the branching point.

In the D/A conversion circuit 2 shown in FIG. 46, the switches are connected in a tree structure with a plurality of stages (three stages) so as to reduce the parasitic capacitor of the switches connected to the output terminal OUT. However, the switches in the respective stages are switched in accordance with an input signal. This causes movement of charge in the parasitic capacitor of the switches in accordance with the output voltage. Therefore, it is difficult to shorten the conversion time period.

In the A/D conversion circuit 3 shown in FIG. 47, loss time due to conversion is avoided by continuously operating the comparator CMP1 for converting high-order bits. However, two other comparators CMP2 and CMP3 are required to convert low-order bits. This poses a problem of increase in power consumption.

In the A/D conversion circuit 8 shown in FIG. 51, it is necessary to add or subtract different current values in the two current adder/subtractor circuits 9a and 9b to which current is transferred. Therefore, if a multiple bit configuration is employed as in the A/D conversion circuit 8, circuit blocks with the same configuration cannot be repeatedly arranged. This makes the circuit configuration complicated and induces an error in the relative accuracy between the current adder/subtractor circuits, which in turn deteriorates the A/D conversion accuracy.

When the D/A conversion circuit 1 or 2 or the A/D conversion circuit 3 is incorporated in a semiconductor integrated circuit (LSI) as an interface circuit, the LSI will have problems in increase of operation speed, reduction of power consumption, and improvement in accuracy.

It is an object of the present invention to provide a D/A conversion circuit capable of performing D/A conversion at high speeds. It is also an object of the present invention to provide an A/D conversion circuit capable of reducing the current consumption. Further, it is also an object of the present invention to provide an A/D conversion circuit capable of performing A/D conversion with high accuracy.

SUMMARY OF THE INVENTION

A first aspect of the present invention provides a D/A conversion circuit. The D/A conversion circuit is provided with a resistor string including a plurality of resistor elements connected in series between a low-potential power supply and a high-potential power supply. A plurality of first switch groups, connected between the resistor elements, selectively outputs any of divided voltages generated between the resistor elements in accordance with a digital signal. The first switch groups each have a common output connected to a corresponding one of a plurality of nodes. A second switch group, connected between the plurality of nodes and an output terminal of the D/A conversion circuit, selectively connects one of the nodes to the output terminal to output the divided voltage. A third switch group, connected in parallel to a predetermined switch in each of the first switch groups, applies a predetermined voltage to the nodes.

A second aspect of the present invention provides a serial and parallel A/D conversion circuit for separating a high-order bit and a low-order bit and sequentially performing A/D conversion. The A/D conversion circuit includes a plurality of resistor elements connected in series between a low-potential power supply and a high-potential power supply. A plurality of comparators compare a reference voltage divided by each of the resistor elements with an analog input voltage. The comparators have a sample-and-hold function for holding a sampled analog input voltage. The plurality of comparators include a high-order bit comparator and a low-order bit comparator having different sampling sources.

A third aspect of the present invention provides a serial and parallel A/D conversion circuit for separating a high-order bit and a low-order bit and sequentially performing A/D conversion. The A/D conversion circuit includes a plurality of resistor elements connected in series between a low-potential power supply and a high-potential power supply. A plurality of comparators compare a reference voltage divided by each of the resistor elements with an analog input voltage. The comparators have a sample-and-hold function for holding a sampled analog input voltage. The plurality of comparators include a high-order bit comparator and a low-order bit comparator having sampling sources that are the same. The high-order bit comparator remains in a standby state from when comparison is completed to when the low-order bit comparator completes comparison.

A fourth aspect of the present invention provides an A/D conversion circuit. The A/D conversion circuit includes a plurality of circuit units, connected in a tree structure, for outputting an N-bit A/D conversion result. Each of the circuit units includes an input terminal for receiving an analog input current. A current transfer circuit transfers current in accordance with the analog input current to a plurality of current paths. A plurality of constant current sources, connected to the plurality of current paths, supply the plurality of current paths with currents evenly divided in accordance with the number of conversion bits (N) in the amplitude range of the analog input current. A plurality of current output terminals, connected between the plurality of constant current sources and the current transfer circuit, output current obtained by subtracting the current transferred to the current paths from the current supplied from each of the constant current sources. An encoder circuit encodes an output signal that is in accordance with the current obtained from the subtraction and generates a digital signal in accordance with the analog input current. The plurality of circuit units include a preceding stage circuit unit and a plurality of subsequent stage circuit units having an input terminal connected to a plurality of current output terminals of the preceding stage circuit unit.

A fifth aspect of the present invention provides an A/D conversion circuit. The A/D conversion circuit includes a plurality of pipeline-connected circuit units for outputting an N-bit A/D conversion result. Each of the circuit units includes an input terminal for receiving an analog input current. A current transfer circuit transfers current in accordance with the analog input current to a plurality of current paths. A plurality of constant current sources, connected to the plurality of current paths, supply currents evenly divided in accordance with the number of conversion bits (N) in the amplitude range of the analog input current. A plurality of current output terminals, connected between the plurality of constant current sources and the current transfer circuit, output current obtained by subtracting the current transferred to the current paths from the current supplied from each of the constant current sources. An encoder circuit encodes an output signal that is in accordance with the current obtained from the subtraction and generates a digital signal in accordance with the analog input current. A sample-and hold circuit is connected between a plurality of current output terminals of the preceding stage circuit unit and an input terminal of a subsequent stage circuit unit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 8 is an explanatory diagram showing a determination table of a comparator in the A/D conversion circuit of FIG. 6;

FIG. 9 is an explanatory diagram showing a determination table of a comparator in the A/D conversion circuit of FIG. 6;

FIG. 10 is an explanatory diagram showing a conversion table of a comparator in the A/D conversion circuit of FIG. 6;

FIG. 18 is an explanatory diagram showing a truth table for the first-stage basic unit;

FIG. 19 is an explanatory diagram showing a truth table for the second-stage basic unit;

FIG. 20 is an explanatory diagram showing a truth table for the A/D conversion circuit of FIG. 14;

FIG. 25 is an explanatory diagram showing a truth table for the A/D conversion circuit of FIG. 21;

FIG. 30 is an explanatory diagram illustrating operation of the A/D conversion circuit of FIG. 14;

FIG. 33 is an explanatory diagram illustrating operation of the circuit in FIG. 32;

FIG. 35 is an explanatory diagram showing a truth table for the A/D conversion circuit of FIG. 31;

FIG. 37 is an explanatory diagram illustrating the output current to the second-stage basic unit;

FIG. 38 is an explanatory diagram illustrating the output current to the second-stage basic unit;

DETAILED DESCRIPTION OF THE PREFERRED EMBODIMENTS

A first embodiment of the present invention will now be described with reference to the drawings.

Figure 1:
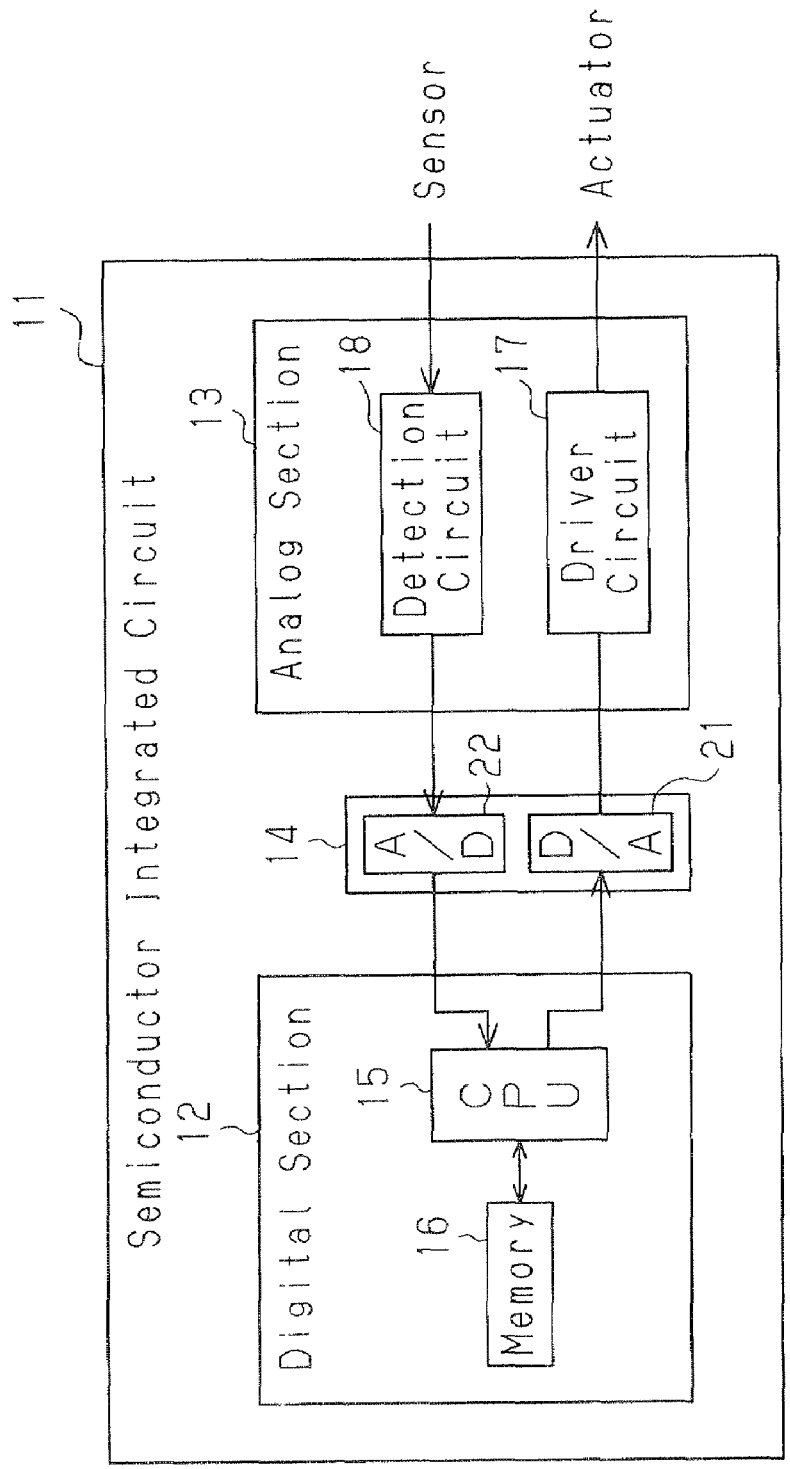
FIG. 1 is a schematic block diagram showing a semiconductor integrated circuit.

FIG. 1 is a schematic block diagram showing a semiconductor integrated circuit (LSI) 11.

The LSI 11 mainly includes a digital section 12 for handling digital signals, an analog section 13 for handling analog signals, and an interface section 14 arranged between the digital section 12 and the analog section 13.

The digital section 12 has known logic arithmetic circuits including a CPU 15 and a memory 16. The analog section 13 has a driver circuit 17 for outputting a drive signal to an actuator, and a detection circuit 18 for processing a sensor signal from a sensor to detect the operating state of the actuator.

The interface section 14 includes a D/A conversion circuit 21 for converting a digital signal into an analog signal and an A/D conversion circuit 22 for converting an analog signal into a digital signal. The D/A conversion circuit 21 converts a digital signal input from the CPU 15 into an analog signal, and outputs the analog signal to the driver circuit 17. The driver circuit 17 outputs a drive signal produced by amplifying the analog signal to drive the actuator. The A/D conversion circuit 22 converts an analog signal (detection signal) input from the detection circuit 18 into a digital signal, and outputs the digital signal to the CPU 15.

The CPU 15 executes various controls according to a program stored in the memory 16 to determine the operating state of the actuator based on the digital signal from the A/D conversion circuit 22, or to adjust the digital signal that is to be input to the D/A conversion circuit 21 for driving the actuator.

Figure 2:
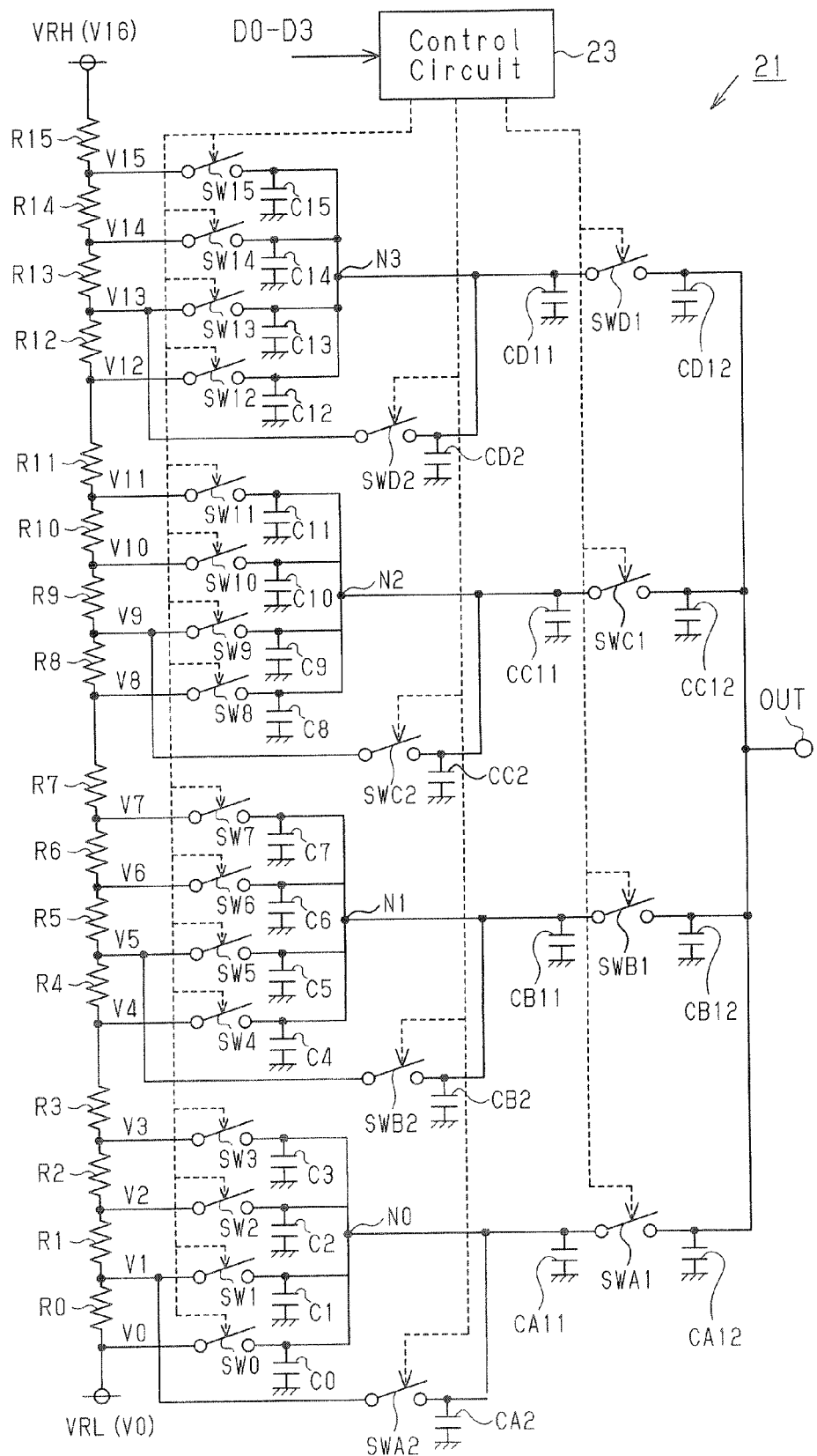
FIG. 2 is a circuit diagram showing a D/A conversion circuit according to a first embodiment of the present invention.
Figure 3:
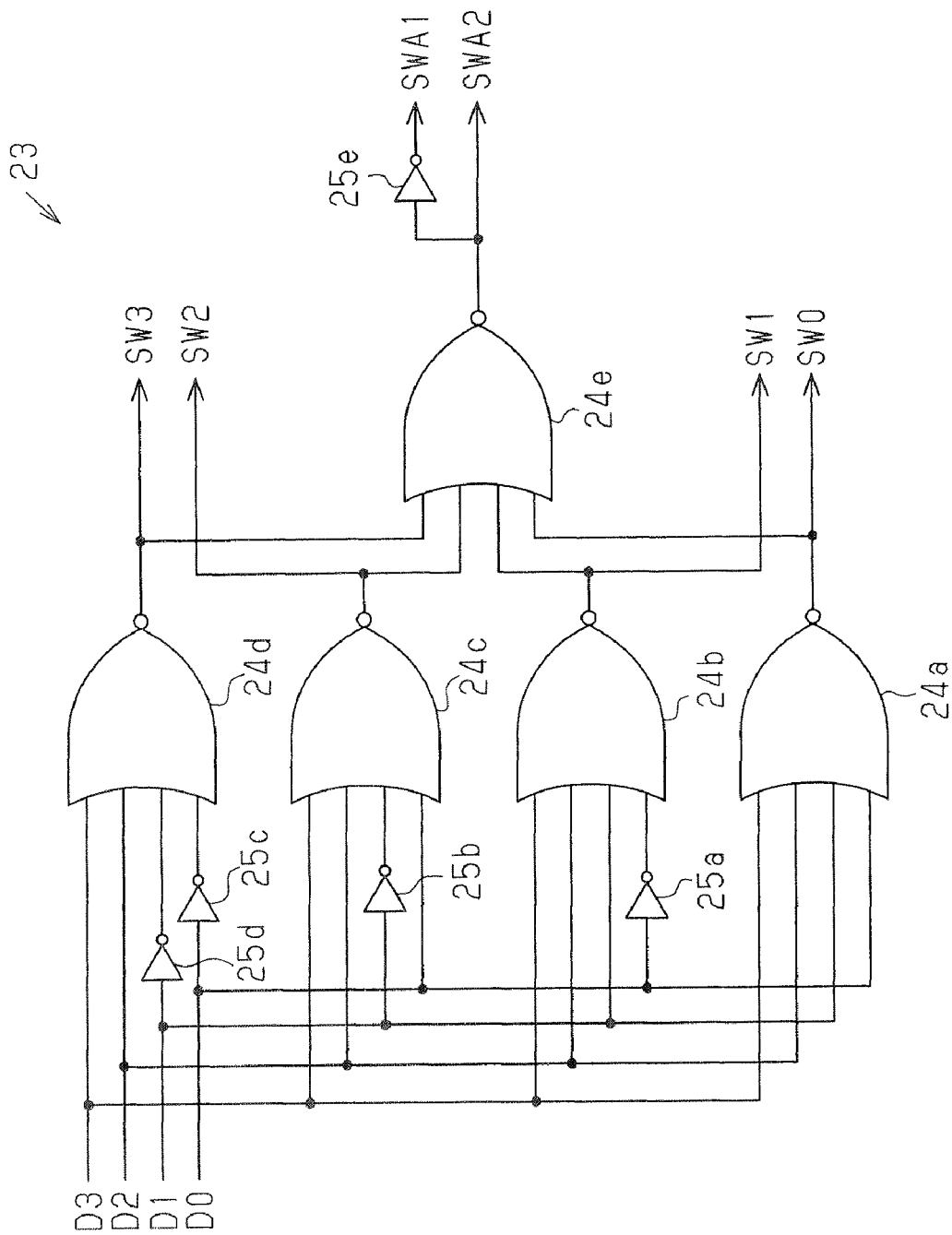
FIG. 3 is a circuit diagram showing a control circuit of the D/A conversion circuit shown in FIG. 1.

FIG. 2 is a circuit diagram showing the D/A conversion circuit 21 of the first embodiment, and FIG. 3 is a circuit diagram showing a control circuit 23 for controlling switches of the D/A conversion circuit 21.

As shown in FIG. 2, the D/A conversion circuit 21 is a resistor string type 4-bit D/A conversion circuit, and has a plurality of resistor elements R0 to R15 (16 resistor elements for the 4-bit type) connected in series between a high-potential power supply VRH and a low-potential power supply VRL. A first group of switches (switches SW0 to SW15) are respectively connected to the connection nodes of the resistor elements R0 to R15 for selectively outputting voltages (V0 to V15) at the connection nodes. Every four adjacent switches of the switches SW0 to SW15 of the first switch group are connected to have a common output, and the connection nodes (nodes) N0 to N3 thereof are connected to an output terminal OUT through a second switch group (switches SWA1 to SWD1).

More specifically, the switches SW0 to SW3 are connected to the node N0, and the node N0 is connected to the output terminal OUT via the switch SWA1. The switches SW4 to SW7 are connected to the node N1, and the node N1 is connected to the output terminal OUT via the switch SWB1. The switches SW8 to SW11 are connected to the node N2, and the node N2 is connected to the output terminal OUT via the switch SWC1. The switches SW12 to SW15 are connected to the node N3, and the node N3 is connected to the output terminal OUT via the switch SWD1.

The node N0 is also connected to the connection node between the resistor element R0 and the resistor element R1 (the connection node for outputting voltage V1) via a switch SWA2. That is, the switch SWA2 is connected to the two ends of the switch SW1 so as to be connected in parallel with the switch SW1. Similarly, the node N1 is connected to the connection node between the resistor element R4 and the resistor element R5 (the connection node for outputting voltage V5) via a switch SWB2, and the node N2 is connected to the connection node between the resistor element R8 and the resistor element R9 (the connection node for outputting voltage V9) via a switch SWC2. Further, the node N3 is connected to the connection node between the resistor element R12 and the resistor element R13 (the connection node for outputting voltage V13) via a switch SWD2. That is, the switch SWB2 is connected in parallel to the switch SW5, the switch SWC2 is connected in parallel to the switch SW9, and the switch SWD2 is connected in parallel to the switch SW13. The switches SWA2, SWB2, SWC2 and SWD2 form a third switch group.

As shown FIG. 3, the control circuit 23 has a plurality of NOR circuits 24a to 24e and a plurality of inverter circuits 25a to 25e, and controls the switches based on input signals, or 4-bit digital signals D0 to D3.

FIG. 3 shows the portion part of the circuit for controlling the switches SW0 to SW3 and the switches SWA1 and SWA2. Circuits for controlling the other switches are also formed in the same manner by a plurality of NOR circuits and inverter circuits.

Specifically, the first NOR circuit 24a receives a digital signal D0 at its first input terminal, a digital signal D1 at its second input terminal, a digital signal D2 at its third input terminal, and a digital signal D3 at its fourth input terminal. The first NOR circuit 24a outputs a control signal for controlling the switch SW0 from the output terminal thereof.

The second NOR circuit 24b receives an inverted signal of the digital signal D0 at its first input terminal through an inverter circuit 25a, the digital signal D1 at its second input terminal, the digital signal D2 at its third input terminal, and the digital signal D3 at its fourth input terminal. The second NOR circuit 24b outputs a control signal for controlling the switch SW1 from the output terminal thereof.

The third NOR circuit 24c receives the digital signal D0 at its first input terminal, an inverted signal of the digital signal D1 at its second input terminal through an inverter circuit 25b, the digital signal D2 at its third input terminal, and the digital signal D3 at its fourth input terminal. The third NOR circuit 24c outputs a control signal for controlling the switch SW2 from the output terminal thereof.

The fourth NOR circuit 24d receives an inverted signal of the digital signal D0 at its first input terminal through an inverter circuit 25c, an inverted signal of the digital signal D1 at its second input terminal through an inverter circuit 25d, the digital signal D2 at its third input terminal, and the digital signal D3 at its fourth input terminal. The fourth NOR circuit 24d outputs a control signal for controlling the switch SW3 from the output terminal thereof.

An output signal from the first NOR circuit 24a is input to a first input terminal of the fifth NOR circuit 24e, and an output signal from the second NOR circuit 24b is input to a second input terminal of the fifth NOR circuit 24e. Further, an output signal from the third NOR circuit 24c is input to a third input terminal of the fifth NOR circuit 24e, and an output signal from fourth NOR circuit 24d is input to a fourth input terminal of the fifth NOR circuit 24e. An output signal from the fifth NOR circuit 24e is inverted by an inverter circuit 25e, and the inverted signal is output as a control signal for controlling the switch SWA1. An output signal from the fifth NOR circuit 24e is also output as a control signal for controlling the switch SWA2.

Figure 4:
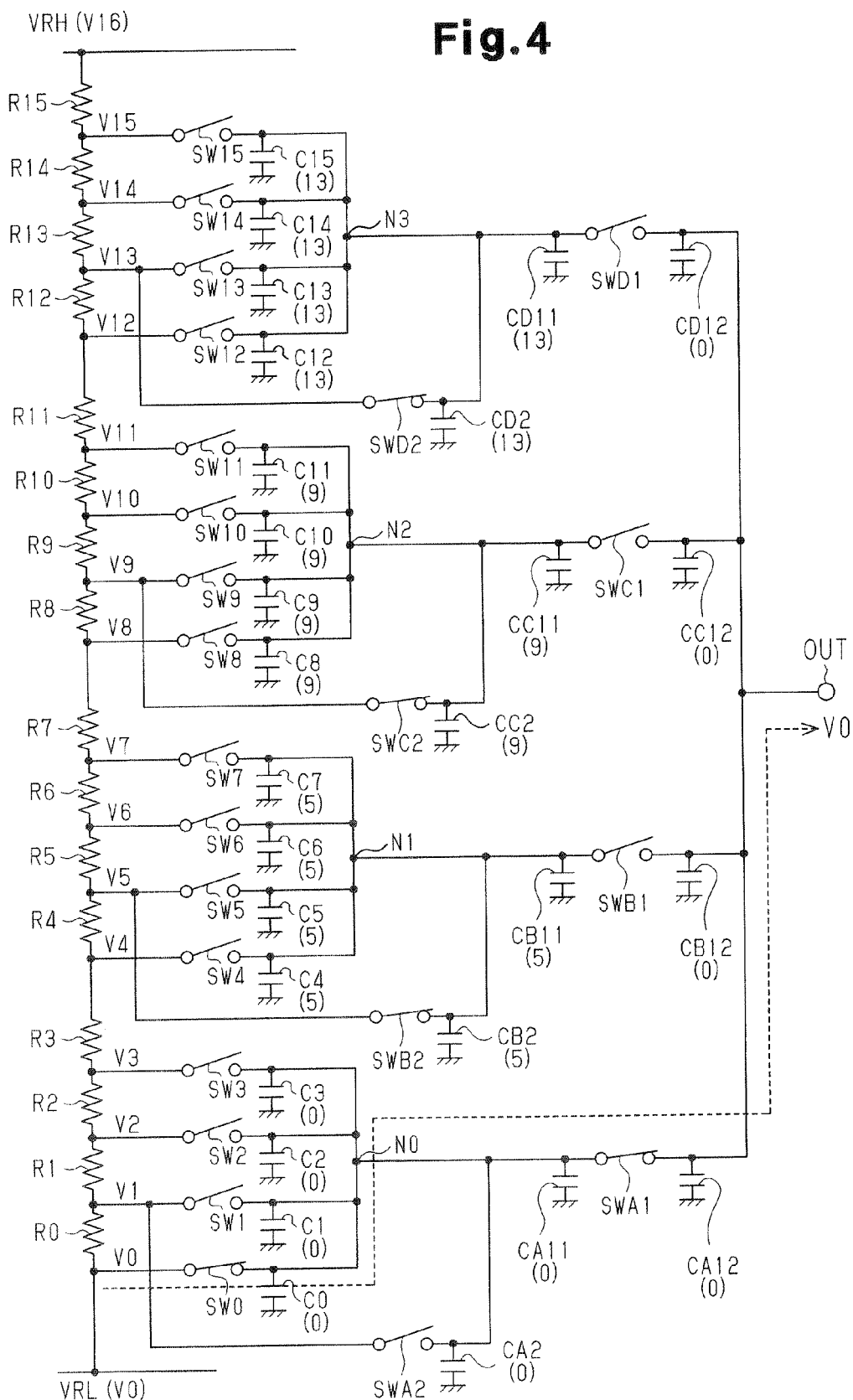
FIG. 4 is a circuit diagram showing an operation state for outputting voltage V0.

If all the digital signals D0 to D3 input to the control circuit 23 are at an L level, the output signal from the first NOR circuit 24a shifts to an H level, while the output signals from the second to fourth NOR circuits 24b to 24d shift to an L level. The output signal from the fifth NOR circuit 24e shifts to an L level, while the control signal output from the inverter circuit 25e shifts to an H level. In this case, as shown in FIG. 4, the switch SW0 is turned on, and the switches SW1 to SW3 are turned off. Additionally, the switch SWA1 is turned on, and the switch SWA2 is turned off. That is, when all the digital signals D0 to D3 are at an L level, the voltage V0 at the connection node between the resistor element R0 and the low-potential power supply VRL (the voltage of the low-potential power supply VRL=0) is selected, and the voltage V0 is output from the output terminal OUT via the switches SW0 and SWA1.

At this time, the switches SW4 to SW15 are turned off, and the switches SWB1, SWC1 and SWD1 are also turned off. The switches SWB2, SWC2 and SWD2 are turned on. Accordingly, the node N1 is provided with a voltage V5 between the resistor elements R4 and R5 via the switch SWB2, and parasitic capacitors C4 to C7 and CB11 of the switches SW4 to SW7 and SWB1 connected to the node N1 are charged with a charge in accordance with the voltage V5. The node N2 is supplied with voltage V9 between the resistor elements R8 and R9 via the switch SWC2, and parasitic capacitors C8 to C11 and CC11 of the switches SW8 to SW11 and SWC1 connected to the node N2 are charged in accordance with the voltage V9. Further, the node N3 is supplied with voltage V13 between the resistor elements R12 and R13 via the switch SWD2, and parasitic capacitors C12 to C15 and CD11 of the switches SW12 to SW15 and SWD1 connected to the node N3 are charged in accordance with the voltage V9.

In FIG. 4, each of the numeric values x given in the parentheses for the parasitic capacitors C0 to C15, CA11 to CD11, CA12 to CD12, and CA2 to CD2 indicates the charge as a reference charge (1) when voltage V1 is applied to the capacitors.

When voltage V0 is output from the output terminal OUT, the output terminal OUT is connected to nine switches in total, namely the switches SW0 to SW3, SWA1, SWB1, SWC1, SWD1, and SWA2. Therefore, the parasitic capacitors of the nine switches can be viewed from the output side (can affect the output voltage of the output terminal OUT).

Figure 5:
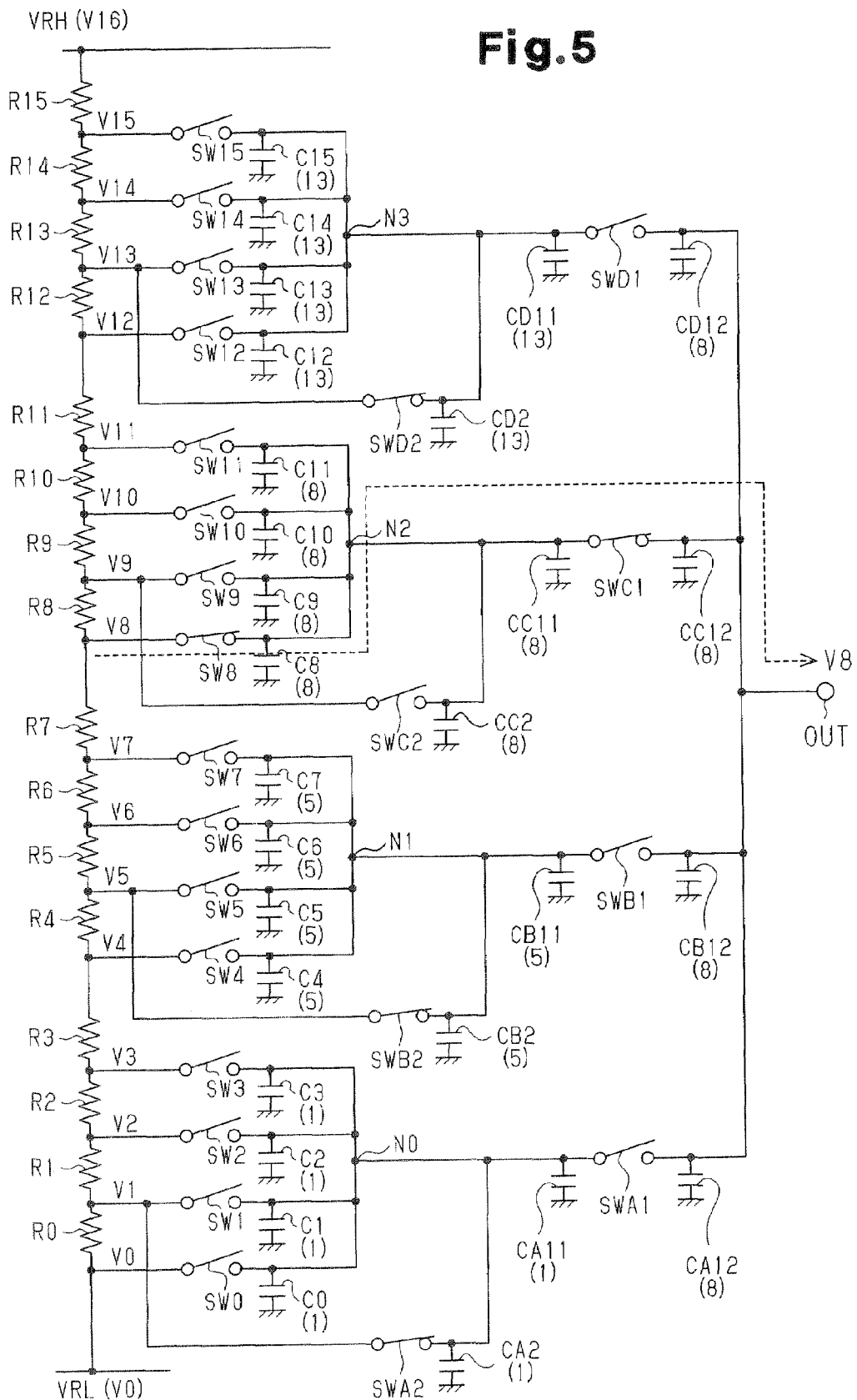
FIG. 5 is a circuit diagram showing an operation state for outputting voltage V8.

When voltage V8 between the resistor elements R7 and R8 is subsequently selected, a control signal according to the digital signals D0 to D3 is output from the control circuit 23 to the switches. Thus, as shown in FIG. 5, the switch SW8 is turned on and the switches SW0 to SW7 and SW9 to SW15 are turned off. Additionally, the switch SWC1 is turned on, and the switches SWA1, SWB1 and SWD1 are turned off. Further, the switches SWA2, SWB2 and SWD2 are turned on and the switch SWC2 is turned off.

More specifically, the switches SWA1, SWB1 and SWD1 of the second switch group are controlled to be off, while the switches SWA2, SWB2 and SWD2 of the third switch group connected to the switches SWA1, SWB1 and SWD1 are controlled to be on. Additionally, the switch SWC1 of the second switch group is controlled to be on, while the switch SWC2 of the third switch group connected to the switch SWC1 is controlled to be off.

In this case, the switches SW8 and SWC1 are turned on, such that the voltage V8 between the resistor elements R7 and R8 is transferred to the output terminal OUT via the switches SW8 and SWC1, and the voltage V8 is output from the output terminal OUT. The node N2 for transferring the voltage V8 is connected to the switches SW8 to SW11, SWC1 and SWC2. Hence, the voltage applied to the switches SW8 to SW11, SWC1 and SWC2 (parasitic capacitors) is converted from the voltage V9 before the conversion (when the voltage V0 is output) to the voltage V8. The parasitic capacitors of the switches SW8 to SW11, SWC1 and SWC2 are charged according to the voltage V8. Consequently, a charge corresponding the amount of voltage variation (=V9−V8) from the voltage V9 to the voltage V8 is moved to the parasitic capacitors of the switches SW8 to SW11, SWC1 and SWC2.

The features of the D/A conversion circuit 21 of the first embodiment will now be described.

In the D/A conversion circuit 21, the switches SW0 to SW15, and SWA1 to SWD1 are connected in a two-stage tree structure. Thus, the parasitic capacitor of the switches as viewed from the output side is reduced in comparison with that of the conventional D/A conversion circuit 1 shown in FIG. 45. This reduces the conversion speed.

In the D/A conversion circuit 21, the third switch group (switches SWA2 to SWD2) is used to apply a predetermined voltage to the nodes N0 to N3. Thus, the parasitic capacitors of the switches connected to the nodes N0 to N3 are charged beforehand. This configuration reduces the amount of the transferred charge due to the switching operation of the switches during the conversion. Therefore, the time required for the conversion is decreased. Further, the processing speed of the LSI 11 is increased by using the D/A conversion circuit 21.

The control circuit 23 of the D/A conversion circuit 21 is formed by a logic circuit including the plurality of the NOR circuits 24a to 24e and the plurality of the inverter circuits 25a to 25e. This accurately controls the switching timing of the switches.

Patent Document 1 discloses a D/A conversion circuit that is designed to reduce the charge transfer amount by applying a reset voltage generated by a resistor string to the nodes between the switches connected in a tree structure. In this D/A conversion circuit, it is necessary to provide the reset voltage from an intermediate tap of the dividing resistors (the connection node between the two resistors). This increases the number of resistor elements is required to form the resistor string. In contrast, in the D/A conversion circuit 21 of the first embodiment, a predetermined voltage is applied to the nodes N0 to N3 by the switches SWA2 to SWD2 of the third switch group connected in parallel to the switches SW1, SW5, SW9 and SW13 of the first switch group. Therefore, the D/A conversion circuit 21 does not require an increase in the number of resistor elements in the resistor string. This relatively simplifies the circuit configuration.

Figure 6:
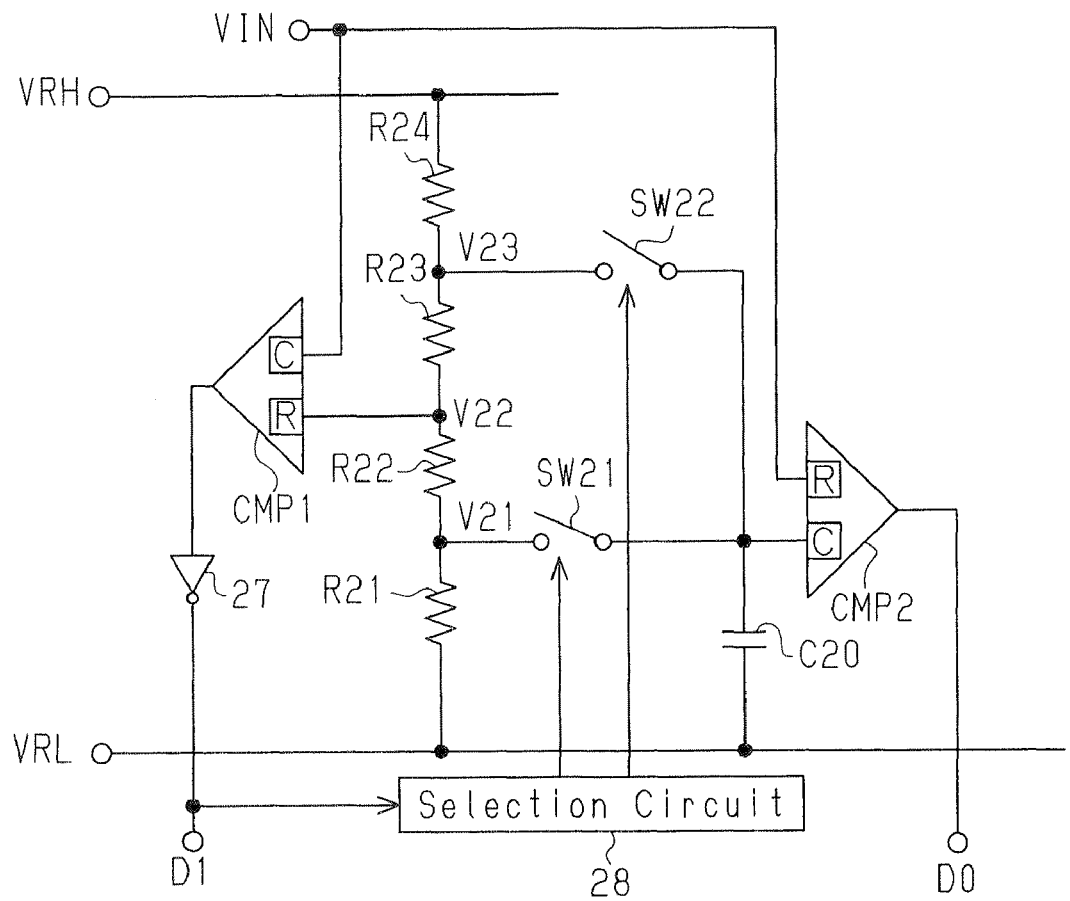
FIG. 6 is a circuit diagram showing an A/D conversion circuit according to a first embodiment of the present invention.
Figure 7:
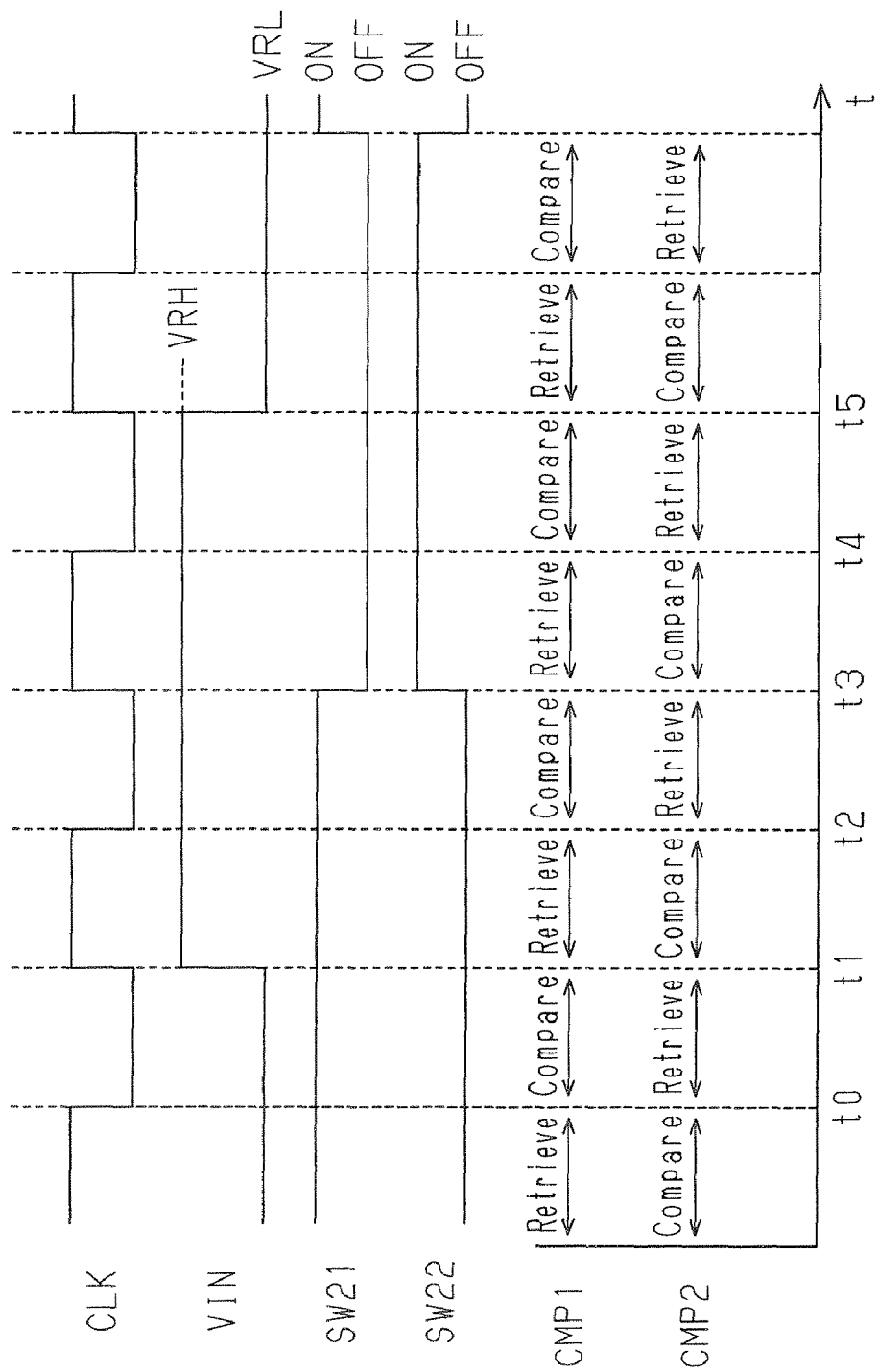
FIG. 7 is a timing chart showing operation of the A/D conversion circuit of FIG. 6.

FIG. 6 is a circuit diagram showing an A/D conversion circuit 22 according to the first embodiment of the present invention, and FIG. 7 is an explanatory diagram illustrating its operation.

As shown in FIG. 6, the A/D conversion circuit 22 is a 2-bit series-parallel A/D converter, which uses two comparators CMP1 and CMP2 to perform A/D conversion separately and sequentially on a high-order bit and a low-order bit.

In the A/D conversion circuit 22, four resistor elements R21 to R24 having the same resistance value are connected in series between a high-potential power supply VRH and a low-potential power supply VRL. The voltage between the power supplies VRH and VRL is divided by the resistor elements R21 to R2, so that reference voltages V21, V22 and V23 are defined by the voltages divided by the resistor element string. The reference voltage V22 is input to the comparator CMP1, the reference voltage V21 is input to the comparator CMP2 via a first switch SW21, and the reference voltage V23 is input to the comparator CMP2 via a second switch SW22. The comparator CMP1 determines whether the input voltage VIN is lower or higher than the reference voltage V22, and outputs a high-order bit signal D1 via an inverter circuit 27 based on the determination result.

The high-order bit signal D1 is input to a selection circuit 28, and the selection circuit 28 selectively turns on one of the first and second switches SW21 and SW22 according to the level of the signal D1. Specifically, if the high-order bit signal D1 has an L level, the first switch SW21 is turned on, the second switch SW22 is turned off, and the reference voltage V21 is input to the comparator CMP2 via the first switch SW21. If the high-order bit signals D1 has an H level, the first switch SW21 is turned off, the second switch SW22 is turned on, and the reference voltage V23 is input to the comparator CMP2 via the second switch SW22.

The comparator CMP2 determines whether the input voltage VIN is lower or higher than the reference voltage V21 or V23, and outputs a low-order bit signal D0 based on the determination result.

FIG. 8 shows a determination table for the comparator CMP1, and FIG. 9 shows a determination table for the comparator CMP2. FIG. 10 shows a conversion table for the A/D conversion circuit 22.

When the input voltage VIN is lower than the reference voltage V22 (VIN<V22), the comparator CMP1 outputs an output signal D1 at an L level (=0) via the inverter circuit 27. In this case, the selection circuit 28 selects and turns on the first switch SW21, while turning off the second switch SW22. In contrast, if the input voltage VIN is equal to or higher than the reference voltage V22 (VIN≧V22), the comparator CMP1 outputs an output signal D1 at an H level (=1) via the inverter circuit 27. In this case, the selection circuit 28 selects and turns on the second switch SW22, while turning off the first switch SW21.

When the first switch SW21 is selected (VIN<V22), the reference voltage V21 is input to the comparator CMP2. As shown in FIG. 9, the comparator CMP2 outputs the output signal D0 at an L level (=0) when the reference voltage V21 is higher than the input voltage VIN (VIN<V21). The comparator CMP2 outputs the output signal D0 at an H level (=1) from the output terminal when the reference voltage V21 is equal to or higher than the input voltage VIN (VIN≧V21).

When the second switch SW22 is selected (VIN≧V22), the reference voltage V23 is input to the comparator CMP2. The comparator CMP2 outputs the output signal D0 at an L level (=0) when the reference voltage V23 is higher than the input voltage VIN (VIN<V23). The comparator CMP2 outputs the output signal D0 at an H level (=1) when the reference voltage V23 is equal to or higher than input voltage VIN (VIN≧V23).

Accordingly, as shown in FIG. 10, the signals D1 and D0 output from the A/D conversion circuit 22 are both zero when the input voltage VIN is equal to or higher than the voltage of the low-potential power supply VRL and lower than the reference voltage V21. When the input voltage VIN is equal to or higher than the reference voltage V21 and is lower than the reference voltage V22, D1=0 and D0=1 are satisfied. Further, the signals D1 and D0 are respectively one and zero when the input voltage VIN is equal to or higher than the reference voltage V22 and lower than the reference voltage V23. When the input voltage VIN is equal to or higher than the reference voltage V23 and lower than the voltage of the high-potential power supply VRH, D1=1 and D0=1 are satisfied.

Figures 11, 12, 13:
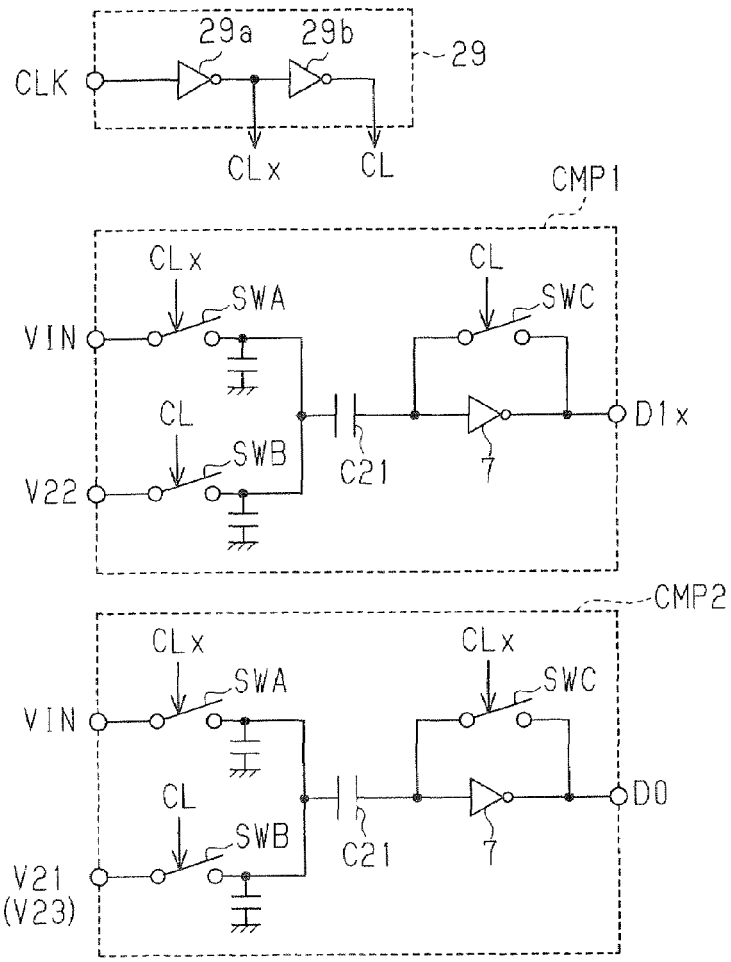
FIG. 11 is a circuit diagram showing comparators and a control circuit of the A/D conversion circuit shown in FIG. 6.
FIG. 12 is an explanatory diagram illustrating operation of a comparator of FIG. 11.
FIG. 13 is an explanatory diagram illustrating operation of a comparator of FIG. 11.
Figure 50:
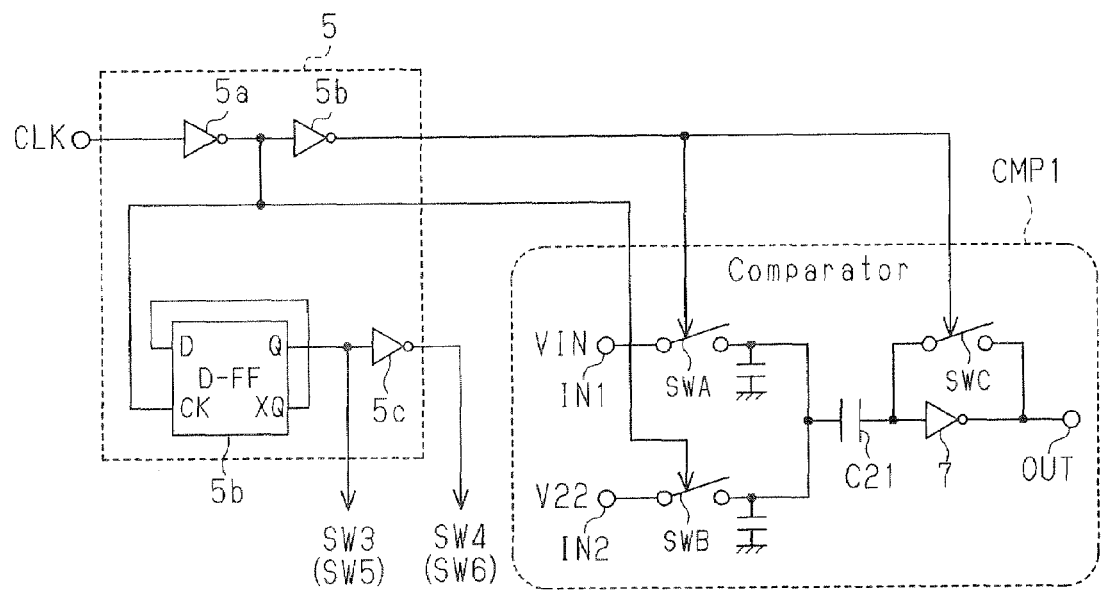
FIG. 50 is a circuit diagram showing a second selection circuit and a comparator of the A/D conversion circuit of FIG. 47.
Figure 51:
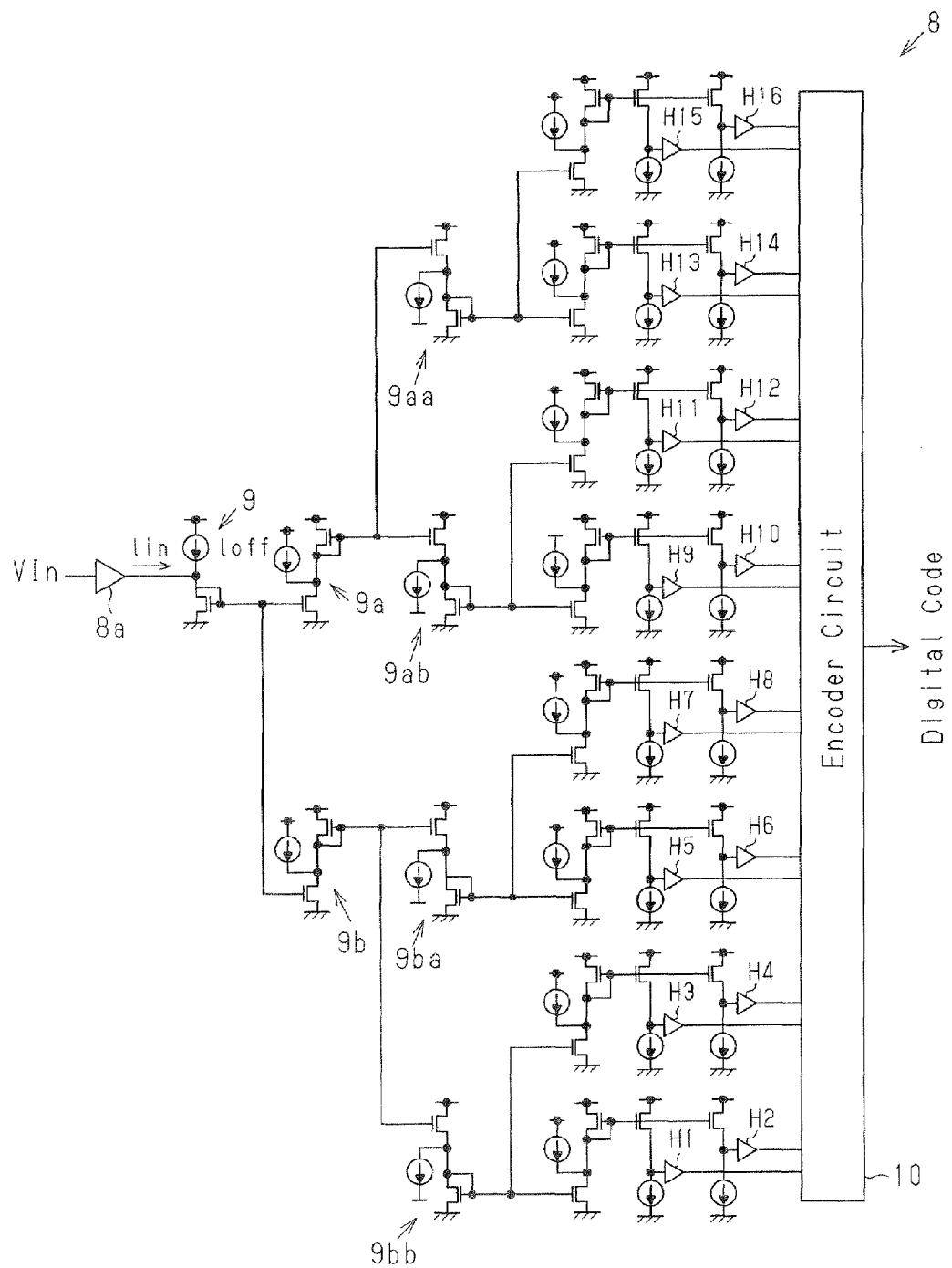
FIG. 51 is a circuit diagram showing a conventional A/D conversion circuit.
Figure 52:
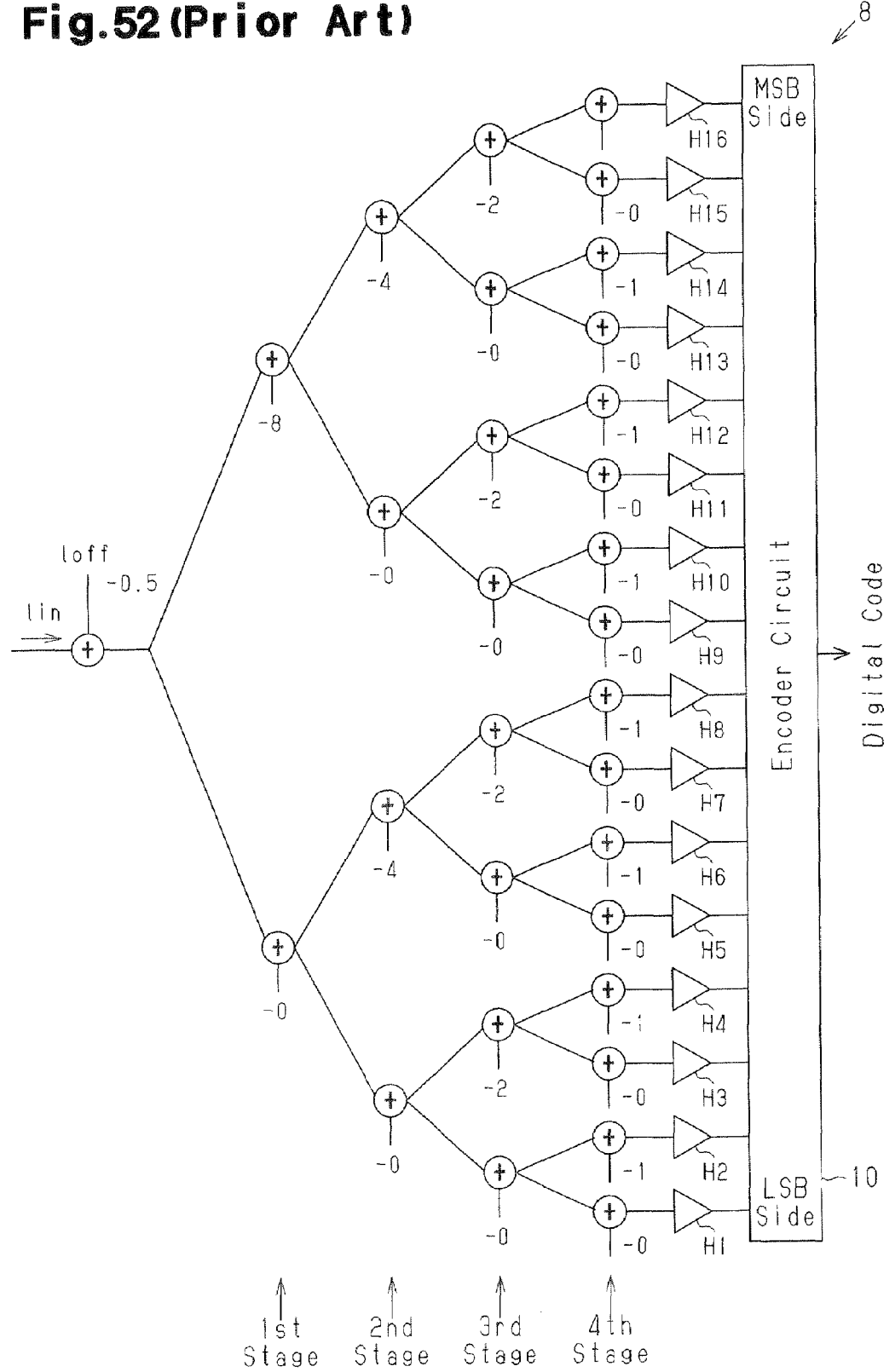
FIG. 52 is a conceptual diagram of the A/D conversion circuit of FIG. 51.

FIG. 11 is a circuit diagram showing the comparators CMP1 and CMP2 and a control circuit 29 for controlling operation of the comparators. The comparators CMP1 and CMP2 have a circuit configuration similar to the conventional one (see FIG. 50) and includes an inverter circuit 7, a capacitor C21, and switches SWA, SWB and SWC. The comparators CMP1 and CMP2 each have a sampling hold function for holding a sampled analog voltage.

The control circuit 29 has two inverter circuits 29a and 29b connected in series. An external clock CLK is input to an inverter circuit 29a, and a control signal CLx is output from the inverter circuit 29a, while a control signal CL is output from the inverter circuit 29b. This means that the control circuit 29 outputs an L level control signal CLx and an H level control signal CL when the external clock CLK has an H level, and outputs an H level control signal CLx and an L level control signal CL when the external clock CLK has an L level. The control signals CLx and CL are complementary signals having opposite signal levels.

In the comparator CMP1, a switch SWA is turned on by the H level control signal CLx, and switches SWB and SWC are turn on by the H level control signal CL. In the comparator CMP2, switches SWA and SWC are turned on by the H level control signal CLx, and a switch SWB is turned on by the H level control signal CL.

FIG. 12 is an explanatory diagram for describing the operation of the comparator CMP1, and FIG. 13 is an explanatory diagram for describing the operation of the comparator CMP2.

The comparator CMP1 retrieves the reference voltage V22 if the switch SWA is turned off and the switches SWB and SWC are turned on when the external clock CLK has an H level (when the control signal CLx has an L level and the control signal CL has an H level). The comparator CMP1 compares the reference voltage V22 with the input voltage VIN as the if the switch SWA is turned on and the switches SWB and SWC are turned off when the external clock CLK has an L level (the control signal CLx has an H level and the control signal CL has an L level).

On the other hand, the comparator CMP2 retrieves the input voltage VIN if the switches SWA and SWC are turned on and the switch SWB is turned off when the external clock CLK has an L level (the control signal CLx has an H level and the control signal CL has an H level). The comparator CMP2 compares the input voltage VIN with the reference voltage V21 (or the reference voltage V23) if the switches SWA and SWC are turned off and the switch SWB is turned on when the external clock CLK has an H level (the control signal CLx has an L level and the control signal CL has an H level).

The operation of the A/D conversion circuit 22 of the first embodiment will now be described with reference to FIG. 7. In this operation example, an input voltage VIN that is equivalent to the high-potential power supply VRH is input during the period from time t1 to t5.

The comparator CMP1 retrieves the reference voltage V22 during the period from time t1 to t2. Specifically, in the comparator CMP1, the switch SWA is turned off, the switches SWB and SWC are turned on, and the capacitor C21 is charged by the reference voltage V22 applied through the switch SWB. In the meantime, the comparator CMP2 compares the reference voltage V21 with the voltage of the capacitor C21 (the voltage of the low-potential power supply VRL) based on the comparison result (L-level signal D1) of the comparator CMP1 in the period prior to period t1 (the period from time t0 to t1) and outputs an L level (=0) signal D0.

In the period from time t2 to t3, the comparator CMP1 compares the reference voltage V22 retrieved in the capacitor C21 with the input voltage VIN (the voltage of the high-potential power supply VRH). Specifically, in the comparator CMP1, the switch SWA is turned on, the switches SWB and SWC are turned off, and the input voltage VIN is input to the capacitor C21 through the switch SWA. Since the input voltage VIN is higher than the reference voltage V22, the voltage input to the inverter circuit 7 through the capacitor C21 is higher than the threshold voltage. Thus the output signal D1x from the inverter circuit 7 shifts to an L level (=0). The output signal D1x from the comparator CMP1 is inverted by the inverter circuit 27 and output as an H level (=1) signal D1.

In the comparator CMP2, during the period from time t2 to t3, the switches SWA and SWC are turned on, the switch SWB is turned off, and the capacitor C21 is charged by the input voltage VIN applied via the switch SWA (the voltage VIN is retrieved in the capacitor C21).

In the period from time t2 to t3, the comparison operation by the comparator CMP1 is completed at the same timing as when the voltage retrieval operation is completed by the comparator CMP2. Further, at the same time as when the comparison operation of the comparator CMP1 ends, the selection circuit 28 switches the first switch SW21 from on to off and the second switch SW22 from off to on. Consequently, from time t3, the reference voltage V23 is input to the comparator CMP2 through the second switch SW22.

Then, in the period from time t3 to t4, the comparator CMP1 retrieves the reference voltage V22 as the switch SWA is turned off and the switches SWB and SWC are turned on.

The comparator CMP2 compares the input voltage VIN retrieved in the capacitor C21 with the reference voltage V23 that is input through the switch SWB, when the switches SWA and SWC are turned off and the switch SWB is turned on, and outputs an H level (=1) signal D0.

The A/D conversion circuit 22 repeatedly performs the above-described operation in the period from time t1 to t4, and the continuous analog signal (the input voltage VIN) is converted to 2-bit digital signals D0 and D1.

The features of the A/D conversion circuit 22 of the first embodiment of the present invention will now be described.

In comparison with the conventional A/D conversion circuit 3, the A/D conversion circuit 22 reduces the number of low-order bit comparators CMP to just one. This accordingly reduces the power consumption. Additionally, the circuit scale of the A/D conversion circuit 22 may also be reduced. Since the voltage retrieval operation and the voltage comparison operation are repeatedly executed in synchronization with the external clock CLK, the conversion speed equivalent to that of the conventional A/D conversion circuit 3 is ensured.

The use of the A/D conversion circuit 22 makes it possible to reduce the size as well as the power consumption of the LSI 11 without deteriorating the processing speed.

An A/D conversion circuit according to a second embodiment of the present invention will now be described.

Figure 14:
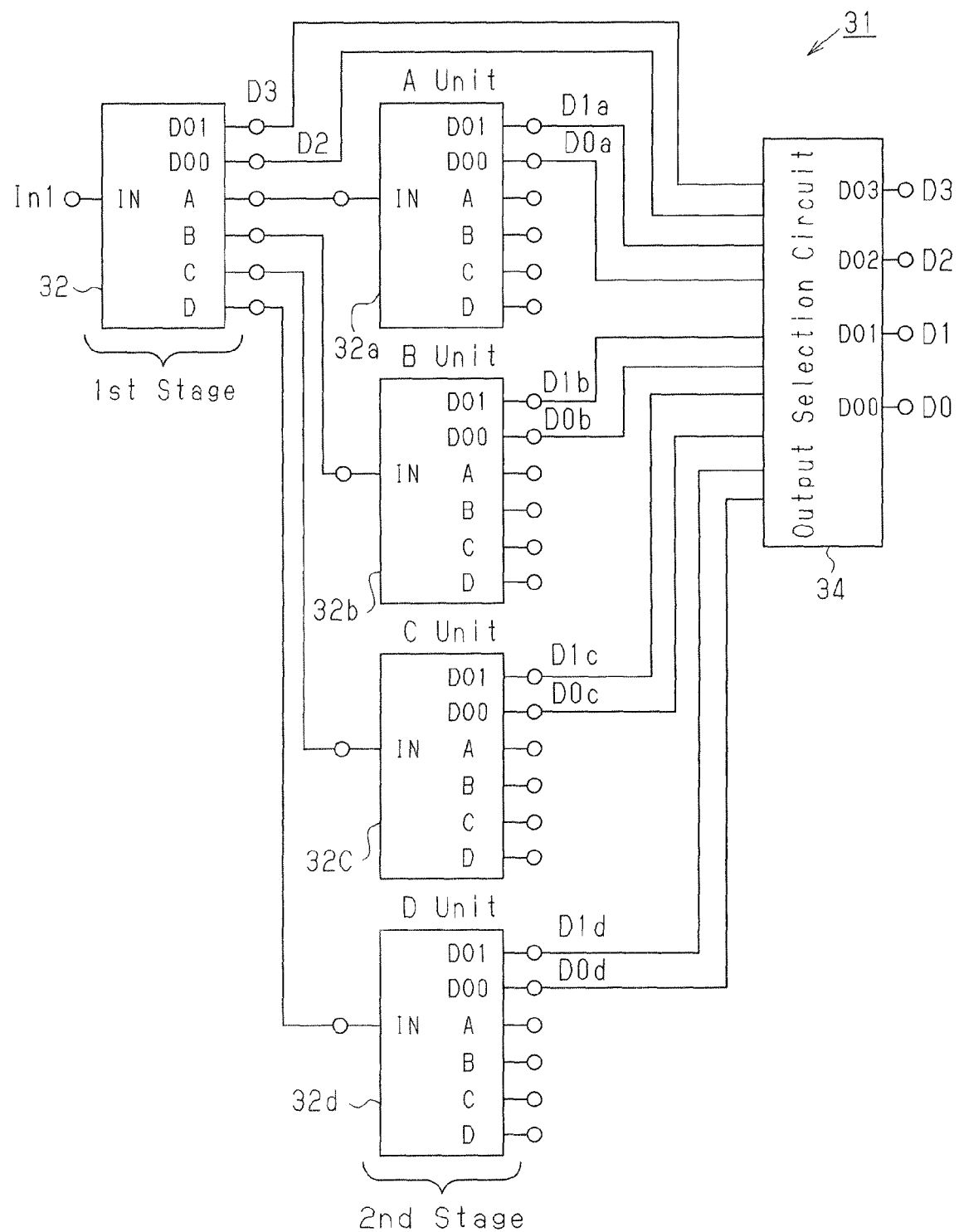
FIG. 14 is a circuit diagram showing an A/D conversion circuit according to a second embodiment of the present invention.

Like the first embodiment described above, an A/D conversion circuit 31 of the second embodiment shown in FIG. 14 is also incorporated in the interface section 14 of the LSI 11 to convert an analog signal received from the analog section 13 into a digital signal and to output the digital signal to the digital section 12.

The A/D conversion circuit 31 is a 4-bit A/D conversion circuit, in which a plurality of basic units (circuit units) 32, and 32a to 32d are connected to form a two-stage tree structure. Each of the basic units 32, and 32a to 32d includes one input terminal IN, two data output terminals DO0 and DO1, and four output terminals for outputting current (current output terminals) A to D. The output terminal A of the basic unit 32 in the first stage is connected to the input terminal IN of the second-stage basic unit (A unit) 32a, and the output terminal B is connected to the input terminal IN of the second-stage basic unit (B unit) 32b. The output terminal C of the first-stage basic unit 32 is connected to the input terminal IN of the second-stage basic unit (C unit) 32c, and the output terminal D is connected to the input terminal IN of the second-stage basic unit (D unit) 32d.

Data output terminals DO0 and DO1 of the first-stage basic units 32 and data output terminals DO0 and DO1 of each of the second-stage units 32a to 32d are connected to an output selection circuit 34. The output selection circuit 34 includes four data output terminals DO0 to DO3. The output terminals DO0 to DO3 output 4-bit signals (digital codes) D0 to D3, respectively.

Figure 15:
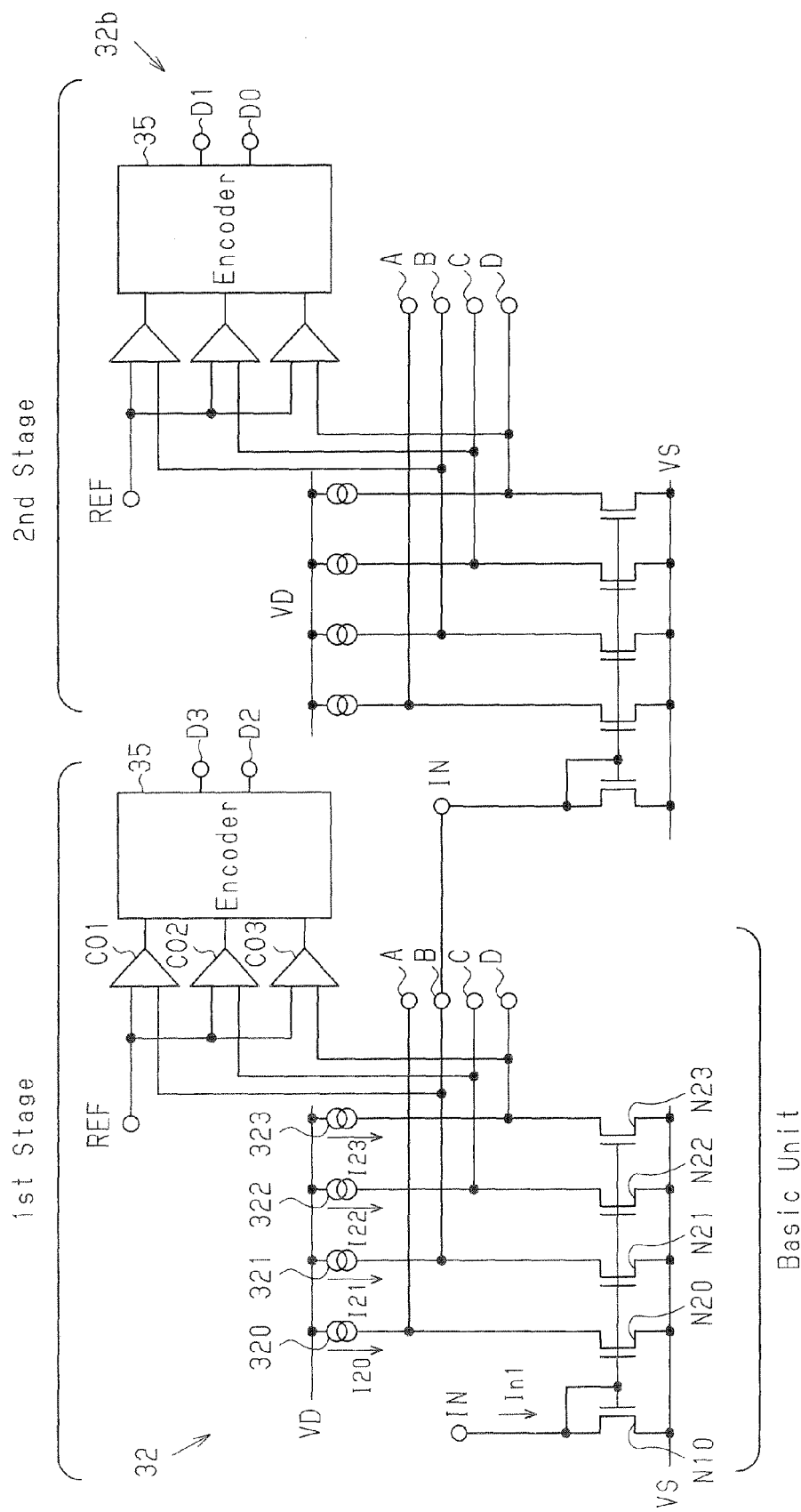
FIG. 15 is an explanatory diagram illustrating principles of the second embodiment of the present invention.

FIG. 15 is an explanatory diagram illustrating principles of the second embodiment. As shown in FIG. 15, in the first-stage basic unit 32, a diode connected transistor N10 is arranged between the input terminal IN and a low-potential power supply VS so that input current In1 supplied from the input terminal IN flows through the transistor N10. Four series-connected circuits including constant current sources 320 to 323 and transistors N20 to N23 are arranged between a high-potential power supply VD and the low-potential power supply VS.

The gate of the transistor N10 and the gates of the transistors N20 to N23 are connected to each other and to the drain of the transistor N10. Therefore, a current mirror circuit is formed by the transistor N10 and the transistors N20 to N23. In the second embodiment, the current mirror circuit corresponds to the current transfer circuit. The input current In1 flowing through the transistor N10 is copied by the current mirror circuit at the same ratio as its mirror ratio (specifically, 1:1), and transferred to the four current paths including the transistors N20, N21, N22 and N23, respectively. Constant current sources 320 to 323 connected to the drains of the transistors N20 to N23 functioning as the output of the current mirror circuit generate different reference currents I20 to I23.

The connection nodes between the constant current sources 320 to 323 and the transistors N20 to N23 are respectively connected to output terminals A to D. The current transferred to the transistors N20 to N23 (current equivalent to the input current In1) is subtracted from the reference currents I20 to I23, and currents corresponding to the subtraction result are output from the output terminals A to D.

Potential levels at the connection nodes between the constant current sources 320 to 323 and the transistors N20 to N23 are input to the comparators CO1 to CO3 so that the potential levels are determined by the comparators CO1 to CO3 as whether they are low or high. Determination signals (output signals) from the comparators CO1 to CO3 are input to the encoder 35. The determination signals from the comparators CO1 to CO3 are encoded by the encoder 35, and signals D3 and D2 corresponding to the two high order bits are output.

The output terminals A to D of the first-stage basic unit 32 are respectively connected to the input terminals IN of the second-stage units 32a to 32d. In FIG. 15, only the B unit 32b connected to the output terminal B is illustrated. In the second-stage B unit 32b, the input current supplied from the first-stage output terminal B is processed in the same manner as in the first stage, and signals D1 and D0 corresponding to the two low-order bits are output from the encoder 35.

Figure 16:
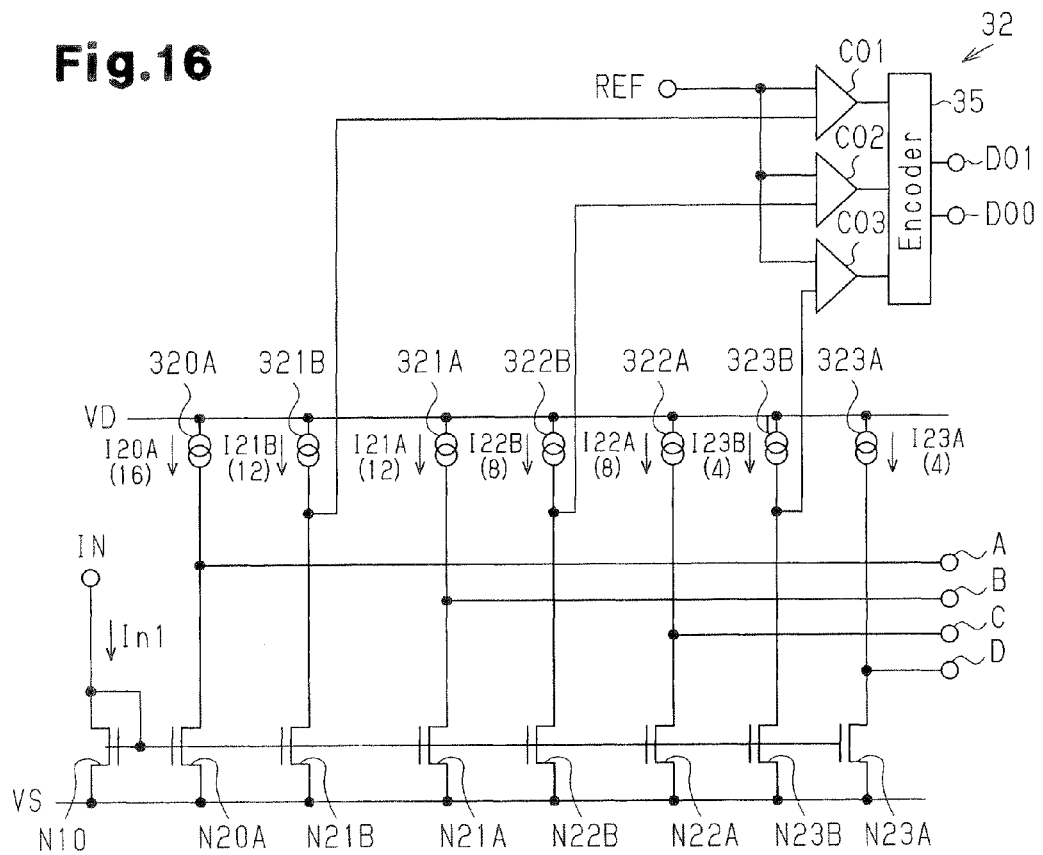
FIG. 16 is a circuit diagram showing a basic unit of the A/D conversion circuit shown in FIG. 14.

FIG. 16 is a circuit diagram showing a specific configuration of the basic unit 32 of the second embodiment. The 4-bit A/D conversion circuit 31 is formed by connecting the basic units 32 as shown in FIG. 16 in two stages.

More specifically, in the basic unit 32, seven series-connected circuits including constant current sources 320A, 321A, 321B, 322A, 322B, 323A and 323B and transistors N20A, N21A, N21B, N22A, N22B, N23A and N23B are arranged between the high-potential power supply VD and the low-potential power supply VS. The gate of the transistor N10 and the gates of the transistors N20A to N23B are connected to each other and to the drain of the transistor N10. Consequently, a current mirror circuit is formed by the transistor N10 and the transistors N20A to N23B. The input current flowing through the transistor N10 is copied by the current mirror circuit in the ratio of 1:1 according to its mirror ratio, and transferred to seven current paths including the transistors N20A, N21A, N21B, N22A, N22B, N23A and N23B.

The reference current I21A supplied by the constant current source 321A and the reference current I21B supplied by the constant current source 321B have the same current value. The reference current I22A supplied by the constant current source 322A and the reference current I22B provided by the constant current source 322B have the same current value. The reference current I23A supplied by the constant current source 323A and the reference current I23B supplied by the constant current source 323B have the same current value.

In the second embodiment, the reference current I20A is set to a maximum current value in the range of input currents input to the A/D conversion circuit 31. The reference currents I21A, I22A and I23A (I21B, I22B and I23B) are set by dividing the input current range by the number of bits (N) for the A/D conversion and evenly allocating the obtained values (divided current value) as shown below:

I20A is set to "maximum current";

I21A and I21B are set to "maximum current−(input current range÷N [decimal number])×1";

I22A and I22B are set to "maximum current−(input current range÷N [decimal number])×2"; and I23A and I23B are set to "maximum current−(input current range÷N [decimal number])×3".

Specifically, when the input current range is from 0 to 16, the reference currents are set as follows by dividing 16 by 4 (2 bits). The current value "1" corresponds to a unit current for the A/D conversion.

$I20A = 16$ $I21A = I21B = 16 − (16÷4)×1 = 12$ $I22A = I22B = 16 − (16÷4)×2 = 8$ $I23A = I23B = 16 − (16÷4)×3 = 4$

In the second embodiment, the current value "0" which the minimum input current, is not allocated to any of the reference currents I20A to I23B.

The transistor N20A is connected to the output terminal A, the transistor N21A is connected to the output terminal B, the transistor N22A is connected to the output terminal C, and the transistor N23A is connected to the output terminal D. Additionally, the transistor N21B is connected to a comparator CO1, the transistor N22B is connected to a comparator CO2, and the transistor N23B is connected to a comparator CO3.

In this basic unit 32, an encoder circuit is formed by the three comparators CO1 to CO3 and the encoder 35. In the second embodiment, a second subtraction circuit (the series-connected circuit formed by the constant current sources 320A to 323A and the transistors N20A to N23A) for outputting an output to the subsequent stage is used in addition to a first subtraction circuit (the series-connected circuit formed by the constant current sources 321B to 323B and the transistors N21B to N23B) to which the encoder circuit is connected.

Figure 17:
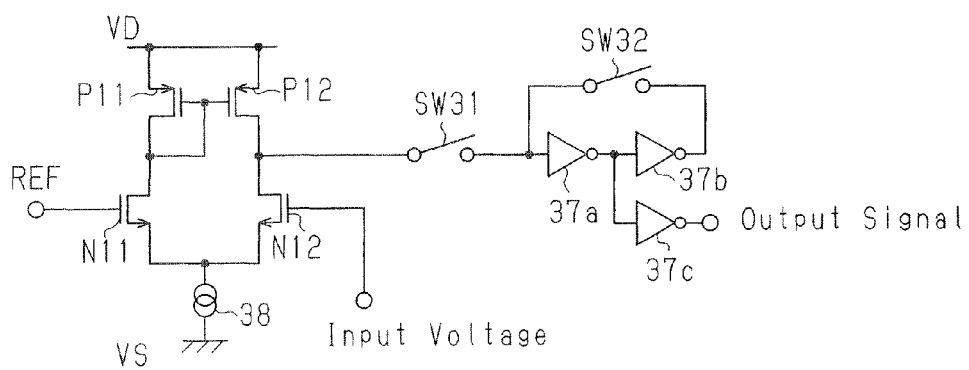
FIG. 17 is a circuit diagram showing a comparator of the basic unit shown in FIG. 16.

FIG. 17 is a circuit diagram showing the specific configuration of the comparators CO1 to CO3. The comparator CO1 to CO3 are differential comparators and each include a plurality of MOS transistors N11, N12, P11 and P12, switches SW31 and SW32, inverter circuits 37a, 37b and 37c, and a constant current source 38.

More specifically, a reference voltage REF is supplied to the gate of the N-channel MOS transistor N11, and an input voltage is supplied to the gate of the N-channel MOS transistor N12. The drain of the N-channel MOS transistor N11 is connected to the high-potential power supply VD through the P-channel MOS transistor P11, and the drain of the N-channel MOS transistor N12 is connected to the high-potential power supply VD through the P-channel MOS transistor P12. The gates of the P-channel MOS transistors P11 and P12 are connected to each other and to the drain of the P-channel MOS transistor P11. The sources of the N-channel MOS transistors N11 and N12 are connected to each other and to the constant current source 38. The connection node between the P-channel MOS transistor P12 and the N-channel MOS transistor N12 is connected to an inverter circuit 37a through the switch SW31. The inverter circuit 37a is connected in series to an inverter circuit 37b, and the output terminal of the inverter circuit 37b is connected to the input terminal of the inverter circuit 37a through the switch SW32. An output signal from the inverter circuit 37a is inverted by the inverter circuit 37c and output as a determination signal (output signal) of the comparators CO1 to CO3.

Accordingly, the comparators CO1 to CO3 output an L level signal when the input voltage is higher than the reference voltage REF, and output an H level signal when the input voltage is lower than reference voltage REF. When the switch SW31 is on and the switch SW32 is off, a determination signal according to the input voltage at that time is output. When the switch SW31 is switched off and the switch SW32 is switched on, the determination signal is held at the level before the switching.

When the current value of the input current In1 input to the basic unit 32 is 5.5, the output terminals A to D output currents with current values obtained by subtracting 5.5 from the reference currents I20A to I23A as described below.

$$A=I20A-5.5=16-5.5=+10.5$$

$$B=I21A-5.5=12-5.5=+6.5$$

$$C=I22A-5.5=8-5.5=+2.5$$

$$D=I23A-5.5=4-5.5=-1.5$$

Currents with the current values obtained by subtracting 5.5 from the reference currents I21B to I23B are input to the comparators CO1 to CO3. That is, the input currents to the comparators CO1 to CO3 have current values as described below:

Input current to $CO1=I21B-5.5=12-5.5=+6.5$

Input current to $CO2=I22B-5.5=8-5.5=+2.5$

Input current to $CO3=I23B-5.5=4-5.5=-1.5$

Accordingly, the input voltage to the comparator CO1 shifts to an H level, and the output signal shifts to an L level. The input voltage to the comparator CO2 shifts to an H level, and the output signal shifts to an L level. Further, the input voltage to the comparator CO3 shifts to an L level, and the output signal shifts to an H level.

When the input current In1 is 5.5, the output terminal A has an H level, the output terminal B has an H level, the output terminal C has an H level, the output terminal D has an L level, the output of the comparator CO1 has an L level, the output of the comparator CO2 has an L level, and the output of the comparator CO3 has an H level. Therefore, when the input current is 5.5, the encoder 35 outputs an L level signal from the output terminal DO1 and an H level signal from the output terminal DO0 based on the output levels (CO1=L, CO2=L, and CO3=H) of the comparators CO1 to CO3, as shown in the truth table of FIG. 18.

The above description is based under the assumption that the input current In1 is 5.5. However, processing is performed in the same manner even when the input current In1 assumes any other current value and signals (digital codes corresponding to the two high order bits) D3 and D2 are output at a level according to the input current In1 from the data output terminals DO1 and DO0 of the basic unit 32.

In the A/D conversion circuit 31, the currents output from the output terminals A to D of the first-stage basic unit 32 are supplied to the input terminals IN of the basic units 32a to 32d, respectively (see FIG. 14). Specifically, the output current from the output terminal A of the first-stage basic unit 32 is supplied to the second-stage A unit 32a, and the output current from the output terminal B is supplied to the B unit 32b. The output current from the output terminal C is supplied to the C unit 32c, and the output current from the output terminal D is supplied to the D unit 32d.

The units 32 and 32a to 32d used in the first and second stages have similar circuit configurations. However, in the second-stage units 32a to 32d, the current mirror circuit formed by the transistor N10 and the transistors N20A to N23A is set to have a mirror ratio of 1:4 (2 bits). That is, the mirror ratio in the second stage is set in accordance with the number of conversion bits in the basic unit 32.

The first-stage unit 32 and the second-stage units 32a to 32d have different encoding logics in the encoders 35. As shown in the truth table of FIG. 19, the signals output from the output terminals DO1 and DO0 from the second-stage encoder 35 assume an opposite logic signal level with respect to the signals from the first-stage unit 32 (the truth table of FIG. 18).

As described above, when the input current In1 to the first-stage basic unit 32 is 5.5, a current of +10.5 is supplied from the output terminal A of the basic unit 32 to the input terminal IN of the second-stage A unit 32a. In this case, since the mirror ratio in the A unit 32a is 1:4, the current flowing through the transistors N20A to N23B will have a current value of $+10.5 \times 4 = +42.0$.

The reference currents I20A to I23B of the constant current sources 320A to 323B in the A unit 32a have the same set values as those of the first-stage unit as described below:

$$I20A=16;$$

$$I21A=I21B=16-(16 \div 4) \times 1=12$$

$$I22A=I22B=16-(16 \div 4) \times 2=8$$

$$I23A=I23B=16-(16 \div 4) \times 3=4$$

Accordingly, the current value of +42.0 of the output from the mirror circuit (the current flowing through the transistors N20A to N23B) is greater than all of the set values of the reference currents I21B, I22B and I23B. Therefore, the A unit 32a outputs an L level signal from the data output terminals DO1 and DO0.

A current with a current value of +6.5 is provided from the first-stage output terminal B to the input terminal IN of the second-stage B unit 32b. The B unit 32b also has a mirror ratio of 1:4 like the A unit 32a. Therefore, the current value of the current flowing through the transistors N20A to N23B is $+6.5 \times 4 = +26.0$. Reference currents I20A to I23B of the constant current sources 320A to 323B of the B unit 32b have the same set values as those of the first-stage unit 32.

Accordingly, the current value of +26.0 of the output (the current flowing through the transistors N20A to N23B) from the current mirror circuit is greater than all of the set values of the reference currents I21B, I22B and I23B. Therefore, the B unit 32b outputs an L level signal from the data output terminals DO1 and DO0.

A current +2.5 is supplied to the input terminal IN of the second-stage C unit 32c from the first-stage output terminal C. The C unit 32c also has a mirror ratio of 1:4 like the A unit 32a. Therefore, the current flowing through the transistors N20A to N23B has a current value of $+2.5 \times 4 = +10.0$. The current values of the reference currents I20A to I23B of the constant current sources 320A to 323B in the C unit 32c are the same set values as those of the first-stage unit 32.

Since the current value of the output of the current mirror circuit (the current flowing through the transistors N20A to N23B) is +10.0, the output terminals A to D output currents as described below:

$$A=16-10.0=+6.0$$

$$B=12-10.0=+2.0$$

$$C=4-10.0=-2.0$$

$$D=4-10.0=-6.0$$

In this state, the input currents to the comparators CO1 to CO3 assume current values as follows:

Input current to $CO1=12-10.0=+2.0$

Input current to $CO2=8-10.0=-2.0$

Input current to $CO3=4-10.0=-6.0$

Accordingly, the input voltage to the comparator CO1 shifts to an H level, and the output signal shifts to an L level.

The input voltage to the comparator CO2 shifts to an L level, and the output signal shifts to an H level. The input voltage to the comparator CO3 shifts to an L level, and the output signal shifts to an H level. As a result, the C unit 32c outputs an L level signal from the data output terminal DO1 and an H level signal from the data output terminal DO0.

A current of −1.5 is supplied to the input terminal IN of the second-stage D unit 32d from the first-stage output terminal D. The D unit 32d also has a mirror ratio of 1:4 like the A unit 32a. Therefore, the current flowing through the transistors N20A to N23B assumes the current value of −1.5×4=−6.0. The current values of the reference currents I20A to I23B of the constant current sources 320A to 323B of the D unit 32d are the same set values as those of the first-stage unit 32.

Accordingly, the current value of −6.0 of the output current (the current flowing through the transistors N20A to N23B) from the current mirror circuit is smaller than all of the set values of the reference currents I21B, I22B and I23B. Therefore, the D unit 32d outputs an H level signal from the data output terminals DO1 and DO0.

When an input current to the A/D conversion circuit 31 is 5.5, the output selection circuit 34 selects the C unit 32c from the second-stage units 32a to 32d based on the output signals from the first-stage basic unit 32 (the L level signal D3 from the output terminal DO1 and the H level signal D2 from the output terminal DO0). The output selection circuit 34 then outputs 4-bit output signals D3 to D0 by combining the output signals from the data output terminals DO1 and DO0 of the first-stage basic unit 32 and the output signals from the data output terminals DO1 and DO0 of the second-stage C unit 32c as described below.

D3=L=0

D2=H=1

D1=L=0

D0=H=1

In this manner, when the input current In1, which is an analog signal, is 5.5, the A/D conversion circuit 31 converts the analog signal into a binary digital code of "0101".

FIG. 20 shows a truth table for the A/D conversion circuit 31. When the input current range is from 0 to 4 in the A/D conversion circuit 31, the first-stage basic unit 32 outputs L level output signals D3 and D2. The output selection circuit 34 outputs these L level output signals D3 and D2 as the output signals D3 and D2 corresponding to the two high order bits, and selects the D unit 32d based on the signals D3 and D2 to output the output signals D1d and D0d from the D unit 32d as the output signals D1 and D0 corresponding to the two low-order bits. The D unit 32d outputs L level output signals D1d and D0d when the input current range is from 0 to 1, and outputs an L level output signal D1d and an H level output signal D0d when the input current range is from 1 to 2. Further, the D unit 32d outputs an H level output signal D1d and an L level output signal D0d when the input current range is from 2 to 3, and outputs H level output signals D1d and D0d when the input current range is from 3 to 4.

When the input current range is from 4 to 8, the first-stage basic unit 32 outputs an L level output signal D3 and an H level output signal D2. The output selection circuit 34 selects the C unit 32c based on the L level output signal D3 and the H level output signal D2 to generate output signals D1c and D0c of the C unit 32c as the output signals D1 and D0 corresponding to the two low-order bits. The C unit 32c outputs L level output signals D1c and D0c when the input current range is from 4 to 5, and outputs an L level output signal D1c and an H level output signal D0c when the input current range is from 5 to 6. The C unit 32c outputs an H level output signal D1c and an L level output signal D0c when the input current range is from 6 to 7, and outputs H level output signals D1c and D0c when the input current range is from 7 to 8.

When the input current range is from 8 to 12, the first-stage basic unit 32 outputs an H level output signal D3 and an L level output signal D2. The output selection circuit 34 selects the B unit 32b based on the H level output signal D3 and the L level output signal D2 to generate output signals D1b and D0b of the B unit 32b as the output signals D1 and D0 corresponding to two low-order bits. The B unit 32b outputs L level output signal D1b and D0b when the input current range is from 8 to 9, and outputs an L level output signal D1b and an H level output signal D0b when the input current range is from 9 to 10. The B unit 32b outputs an H level output signal D1b and an L level output signal D0b when the input current range is from 10 to 11, and outputs H level output signals D1b and D0b when the input current range is from 11 to 12.

When the input current range is from 12 to 16, the first-stage basic unit 32 outputs H level output signals D3 and D2. The output selection circuit 34 selects the A unit 32a based on the H level output signals D3 and D2 to generate output signals D1a D0a of the A unit 32a as the output signals D1 and D0 corresponding to two low-order bits. The A unit 32a outputs L level output signals D1a and D0a when the input current range is from 12 to 13, and outputs an L level output signal D1a and an H level output signal D0a when the input current range is from 13 to 14. The A unit 32a outputs an H level output signal D1a and an L level output signal D0a when the input current range is from 14 to 15, and outputs H level output signals D1a and D0a when the input current range is from 15 to 16.

The features of the A/D conversion circuit 31 according to the second embodiment of the present invention will now be described.

The A/D conversion circuit 31 is formed by connecting the basic units 32, and 32a to 32d as the circuit units having the same configuration to form a tree structure. Therefore, the circuit configuration may be simplified. Additionally, the reference currents I20A to I23B can be set to the same value for the basic units 32 and 32a to 32d. This suppresses the relative accuracy error between the basic units and improves the accuracy of the A/D conversion. Further, the simplification of the circuit configuration reduces the production cost of the A/D conversion circuit 31.

The use of the A/D conversion circuit 31 makes it possible to produce an LSI 11 at a low cost, and enables the LSI 11 to accurately perform processing.

An A/D conversion circuit according to a third embodiment of the present invention will now be described.

The A/D conversion circuit of the third embodiment is similar to the A/D conversion circuit 31 of the second embodiment in terms of the basic circuit configuration for A/D conversion, but is additionally provided with a function for correcting A/D conversion errors.

Figure 21:
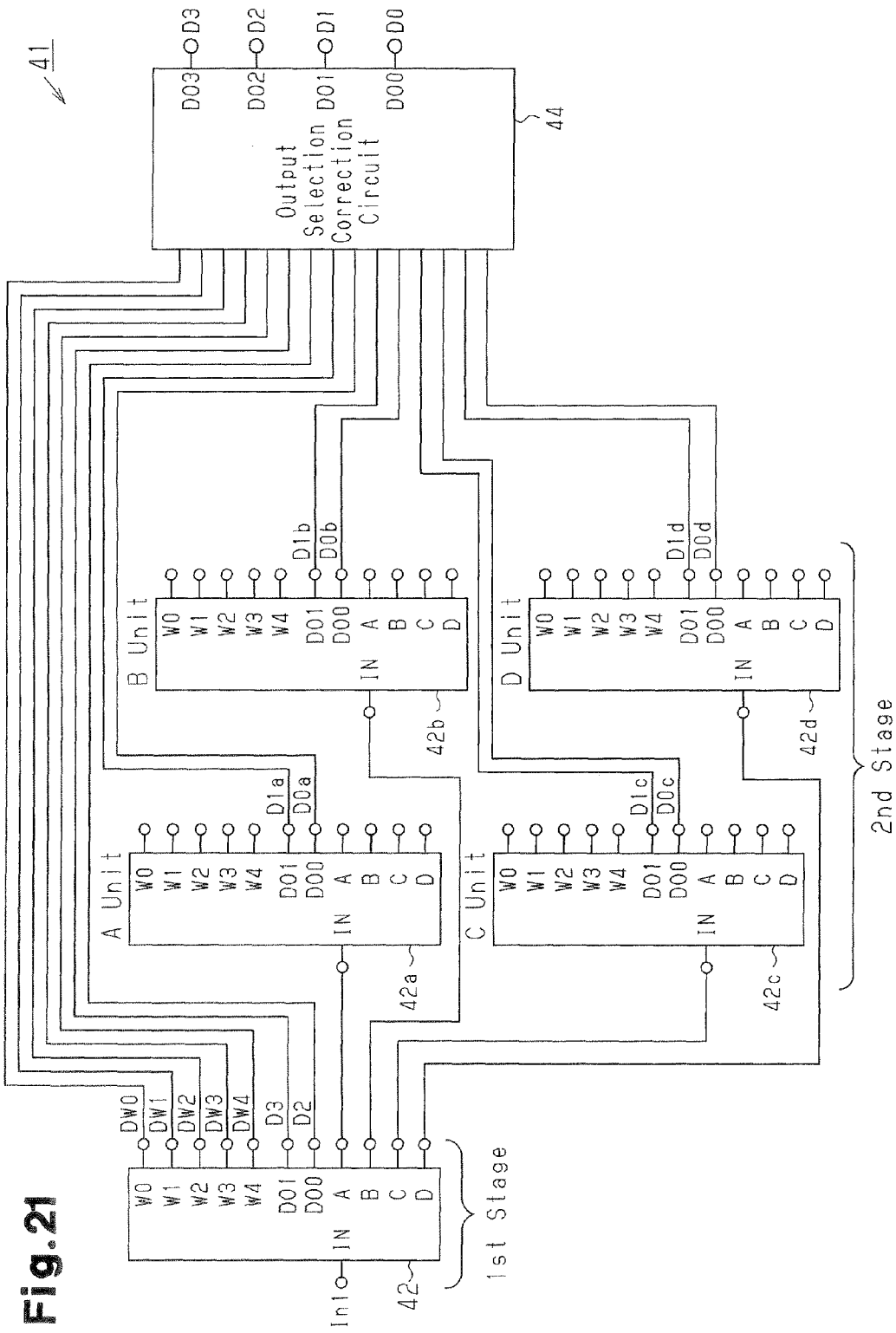
FIG. 21 is a circuit diagram showing an A/D conversion circuit according to a third embodiment of the present invention.

As shown in FIG. 21, an A/D conversion circuit 41 of the third embodiment is also a 4-bit A/D conversion circuit having a plurality of basic units 42, and 42a to 42d connected to form a two-stage tree structure. The basic units 42, and 42a to 42d are each provided with an input terminal IN, data output terminals DO0 and DO1, and output terminals A to D. Additionally, the basic units 42, and 42a to 42d are each provided with output terminals W0 to W4 for outputting error correction signals DW0 to DW4. In the A/D conversion circuit 41, the first-stage basic unit 42 is connected to the second-stage basic units 42*a* to 42*d* in the same manner as in the A/D conversion circuit 31 shown in FIG. 14. The data output terminals DO0 and DO1 and the output terminals W0 to W4 of the first-stage basic unit 42 and the data output terminals DO0 and DO1 of the second-stage units 42*a* to 42*d* are connected to an output selection correction circuit 44. The output selection correction circuit 44 is provided with four data output terminals DO0 to DO3, which output 4-bit signals (digital codes) D0 to D3, respectively.

Figure 22:
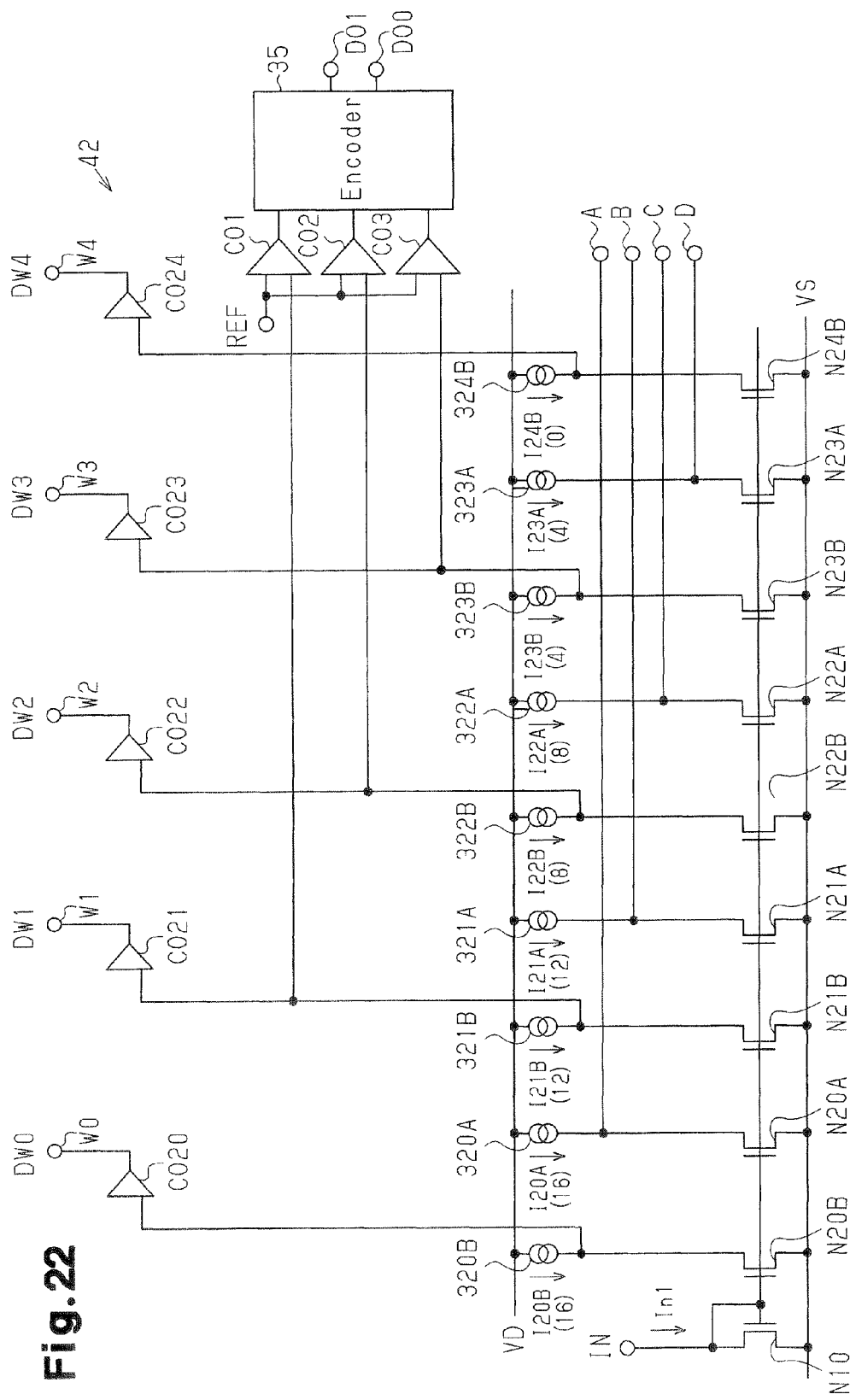
FIG. 22 is a circuit diagram showing a basic unit of the A/D conversion circuit shown in FIG. 21.
Figures 23, 24:
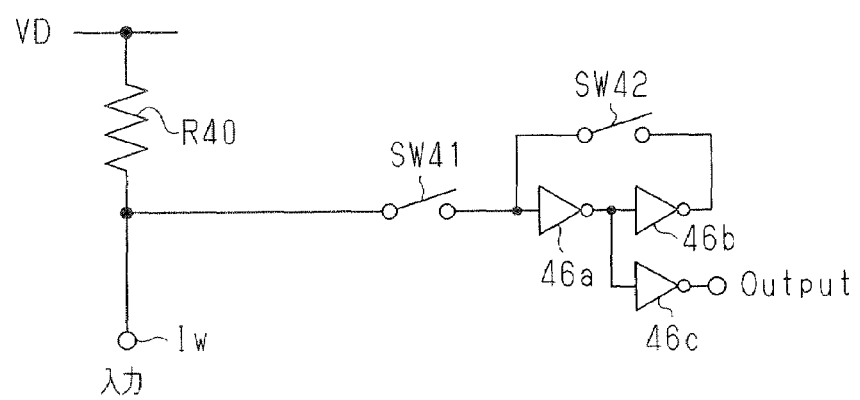
FIG. 23 is an explanatory diagram showing a truth table for the basic unit of FIG. 22.
FIG. 24 is a circuit diagram showing a comparator of the basic unit of FIG. 22.

FIG. 22 shows a circuit configuration of the basic unit 42 used in the A/D conversion circuit 41, and FIG. 23 shows a truth table for the basic unit 42. The circuit operation of the basic unit 42 is the same as the circuit operation of the basic unit 32 in FIG. 16 except in the operation of comparators CO20 to CO24. Therefore, the following description will be focused on the parts relating to the comparators CO20 to CO24.

As shown in FIG. 22, unlike the second embodiment described above, the basic unit 42 additionally has transistors N20B and N24B forming a current mirror circuit, comparators CO20 to CO24 for outputting error correction signals DW0 to DW4, and constant current source 320B and 324B for supplying reference currents I20B and I24B.

More specifically, a series-connected circuit including of the constant current source 320B and the transistor N20B, and a series-connected circuit including the constant current source 324B and the transistor N24B are arranged between a high-potential power supply VD and a low-potential power supply VS. The gates of the transistors N20B and N24B are connected to the gate of the transistor N10, and an input current flowing through the transistor N10 is transferred to the transistors N20B and N24B at the mirror ratio of 1:1.

The connection node between the constant current source 320B and the transistor N20B is connected to the input terminal of the comparator CO20, and the connection node between the constant current source 321B and the transistor N21B is connected to the input terminal of the comparator C021. The connection node between the constant current source 322B and the transistor N22B is connected to the input terminal of the comparator CO22, and the connection node between the constant current source 323B and the transistor N23B is connected to the input terminal of the comparator C023. Further, the connection node between the constant current source 324B and the transistor N24B is connected to the input terminal of the comparator CO24.

FIG. 24 is a circuit diagram showing a specific configuration of the comparators CO20 to CO24. Each of the comparators CO20 to CO24 has a resistor element R40, switches SW41 and SW42, and inverter circuits 46*a* to 46*c*.

The input terminal Iw of the comparators CO20 to CO24 is connected to the high-potential power supply VD through the resistor element R40 and also connected to the inverter circuit 46*a* through the switch SW41. The inverter circuit 46*a* and the inverter circuit 46*b* are connected in series, and the output terminal of the inverter circuit 46*b* is connected to the input terminal of the inverter circuit 46*a* through the switch SW42. An output signal of the inverter circuit 46*a* is inverted by the inverter circuit 46*c* and output as a determination signal (output signal) of the comparators CO20 to CO24.

The comparators CO20 to CO24 configured in this manner are characterized by giving more importance on the determination accuracy than the determination speed. In the comparators CO20 to CO24, when a current is supplied from the input terminal Iw (when the current flowing through the transistors N20B to N24B is larger than the reference currents I20B to I24B), the input voltage input to the inverter circuit 46*a* via the switch SW41 becomes lower than the threshold voltage of the inverter circuit 46*a*. Therefore, the inverter circuit 46*c* outputs an L level signal. In contrast, when no current is supplied from the input terminal Iw (when the current flowing through the transistors N20B to N24B is smaller than the reference currents I20B to I24B), the input voltage input to the inverter circuit 46*a* via the switch SW41 becomes higher than the threshold voltage of the inverter circuit 46*a*. Therefore, the inverter circuit 46*c* outputs an H level signal.

The comparators CO20 to CO24 have relatively simple configurations. Although the operation speed of the comparators CO20 to CO24 is lower than that of the differential comparators CO1 to CO3 shown in FIG. 17, the accuracy of determining whether or not the input current is present is higher than that of the differential comparators CO1 to CO3.

The operation of the A/D conversion circuit 41 according to the third embodiment will now be described. An example of a case in which the comparator CO2 outputs an erroneous determination signal will be described.

In the differential comparator CO2, an offset voltage occurs between the input terminals due to the relative accuracy or the like of the transistors N11 and N12 forming the same. If the offset voltage assumes a value of ±0.1 when converted to a current value, the comparator CO2 may make a erroneous determination when the output current of the transistor N22B is in the range of 7.9 to 8.1.

Specifically, if the comparator CO2 erroneously determines that the output current of the transistor N22B is 8.1 even though the transistor N22B is outputting an output current of 7.9, the comparator CO2 will output an H level signal instead of an L level signal even though the output terminal C accurately generates an output current of +0.1. As a result, the encoder 35 will output erroneous codes from the output terminals DO1 and DO0.

In this case, the comparator CO22 receives a differential current between the reference current I22B of the constant current source 322B and the output current of the transistor N22B. Since these currents are 8.0 and 7.9, no current is supplied from the input terminal of the comparator CO22. Therefore, the comparator CO22 outputs the correct H level determination signal from the output terminal W2 as the error correction signal DW2.

As described above, the comparator CO2 is able to generate a determination signal (output signal) earlier than the comparator CO22, but the determination accuracy is low. In contrast, the comparator CO22 takes more time to generate the output than the comparator CO2. However, the determination accuracy is high.

Accordingly, in the A/D conversion circuit 41 formed by connecting a plurality of basic units 42, and 42*a* to 42*d* in multiple stages (two stages) as in the third embodiment, the first-stage basic unit 42 and the second-stage basic units 42*a* to 42*d* first determine their outputs sequentially based on the determination operation of the comparators CO1 to CO3 having a higher operation speed. Then, the error correction signals DW0 to DW4 output from the first-stage comparators CO20 to CO24 are used to performs correction processing before determining the final outputs. This correction processing makes it possible to realize highly accurate A/D conversion.

FIG. 25 shows a truth table for the A/D conversion circuit 41.

When the input current In1, which is an analog signal assumes a value of 7.9, signal levels of D3=H and D2=L are output as the first-stage digital outputs if the comparator CO2 of the first-stage basic unit 42 erroneously determines that the input current In1 is 8.1. Since the second-stage basic unit 42*b* is supplied with normal current, signal levels of D1=H, D0=H are generated as the second-stage digital outputs.

Accordingly, the 4-bit digital output becomes 1011 (binary)=11 (decimal), and an erroneous digital code is output instead of a correct code (0111=7). The error correction signal DW2 output from the output terminal W2 of the first-stage basic unit 42 has the correct level, that is, the H level in this state. Reversely calculating from the levels of the signals D3 and D2, the signal DW2 should have an L level. Based on the signal levels, the output selection correction circuit 44 determines that the first-stage basic unit 42 has made an erroneous determination. The output selection correction circuit 44 then performs correction processing for example by subtracting one code of the first-stage digital output, corresponding to a value of four in the decimal number, from the digital codes of the signals D3 to D0. A correct A/D conversion result according to the input current In1 (=7.9) may be obtained by correcting the signal levels of the signals D3 to D0 as described below.

D3=H→L

D2=L→H

D1=H→H

D0=H→H

The features of the A/D conversion circuit 41 in the third embodiment of the present invention will now be described.

The A/D conversion circuit 41 determines whether or not the first-stage basic unit 42 has made an erroneous determination based on the output signals D3 and D2 and the error correction signals DW0 to DW4 from the first-stage basic unit 42. If it is determined that the unit 42 has made an erroneous determination, the signal levels of the output signals D3 and D2 are corrected through reverse calculation by referring to the error correction signals DW3, DW2 and DW1. Accordingly, the use of the A/D conversion circuit 41 enables highly accurate A/D conversion.

An A/D conversion circuit according to a fourth embodiment of the present invention will now be described.

Figure 26:
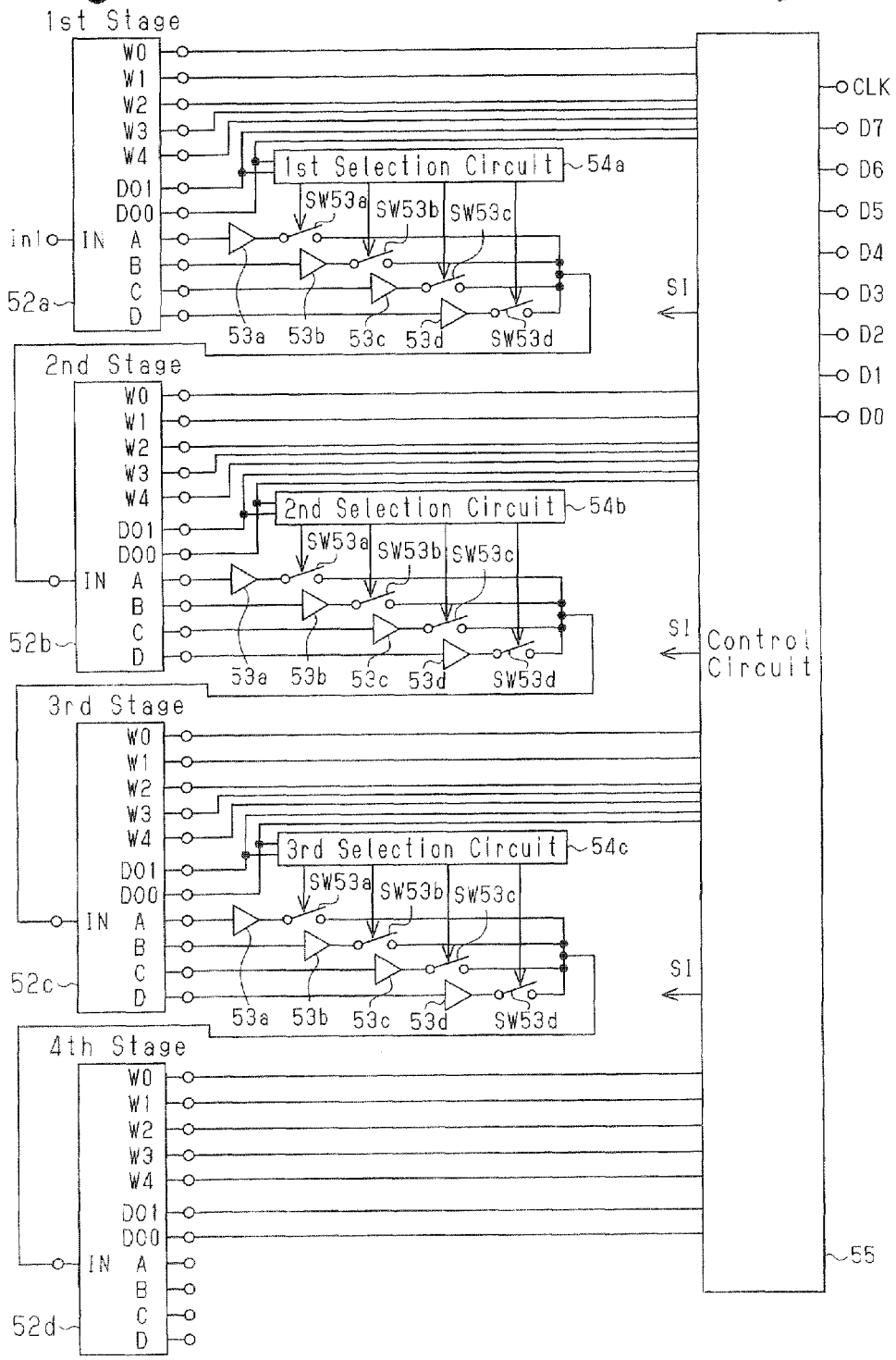
FIG. 26 is a circuit diagram showing an A/D conversion circuit according to a fourth embodiment of the present invention.

As shown in FIG. 26, an A/D conversion circuit 51 of the fourth embodiment is a pipeline-connected 8-bit A/D conversion circuit, in which basic units 52a to 52d are series-connected in four stages via sample-and-hold circuits (S/H circuits) 53a to 53d and switches SW53a to SW53d. In the fourth embodiment, the circuit configuration and operation of the basic unit 52a to 52d in the first to fourth stages are the same as those of the basic units 42 in the third embodiment and thus will not be described in detail. The following description will be focused on points differing from the third embodiment.

In the A/D conversion circuit 51, the output terminals A to D of the first-stage basic unit 52a are connected to the input terminal IN of the second-stage basic unit 52b via a series-connected circuit including S/H circuit 53a to 53d and switches SW53a to SW53d. A first selection circuit 54a is connected to data output terminals DO1 and DO0 of the first-stage basic unit 52a, and the selection circuit 54a selectively turns on one of the switches SW53a to SW53d based on the output signals from the data output terminals DO1 and DO0. As a result, in the first-stage basic unit 52a, an appropriate output terminal according to a range of input currents In1 is selected from the output terminals A to D, so that a current flowing through the selected output terminal is supplied to the second-stage basic unit 52b.

The output terminals A to D of the second-stage basic unit 52b are respectively connected to the input terminal IN of the third-stage basic unit 52c via a series-connected circuit including S/H circuits 53a to 53d and switches SW53a to SW53d. A second selection circuit 54b is connected to the data output terminals DO1 and DO0 of the second-stage basic unit 52b, and the selection circuit 54b selectively turns on one of the switches SW53a to SW53d based on output signals from the data output terminals DO1 and DO0. As a result, in the second-stage basic unit 52b, an appropriate output terminal that is in accordance with the range of input currents In1 is selected from the output terminals A to D so that a current flowing through the selected output terminal is supplied to the third-stage basic unit 52c.

Further, the output terminals A to D of the third-stage basic unit 52c are connected to the input terminal IN of the fourth-stage basic unit 52d via a series-connected circuit including S/H circuits 53a to 53d and switches SW53a to SW53d. A third selection circuit 54c is connected to the data output terminals DO1 and DO0 of the third-stage basic unit 52c, and the selection circuit 54c selectively turns on one of the switches SW53a to SW53d based on output signals from the data output terminals DO1 and DO0. As a result, in the third-stage basic unit 52c, an appropriate output terminal according to a range of input currents In1 is selected from the output terminals A to D so that a current flowing through the selected output terminal is supplied to the fourth-stage basic unit 52d.

The error correcting output terminal W4 to W0 and data output terminals DO1 and DO0 of the respective basic units 52a to 52d are connected to a control circuit 55. The control circuit 55 latches output signals from the basic units 52a to 52d at a predetermined timing in synchronism with an external clock CLK and outputs 8-bit output signals (digital codes) D7 to D0 based on the latched signals. In the meantime, the control circuit 55 outputs a control signal SI to the S/H circuits 53a to 53d to control the sampling (retrieval operation) and the holding (holding operation) of the S/H circuits 53a to 53d.

Figure 27:
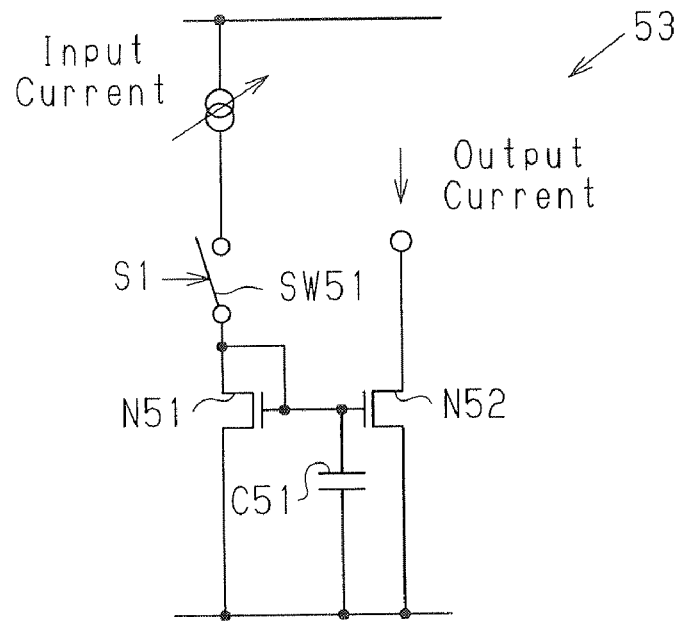
FIG. 27 is a circuit diagram showing an S/H circuit of the A/D conversion circuit shown in FIG. 26.
Figure 28:
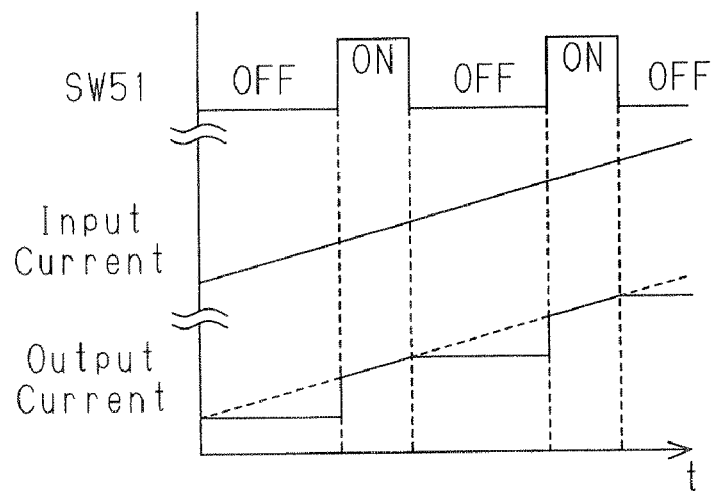
FIG. 28 is an explanatory diagram illustrating operation of the S/H circuit of FIG. 27.

FIG. 27 illustrates a specific circuit configuration of the S/H circuit 53 (53a to 53d), and FIG. 28 is an explanatory diagram showing the operation.

As shown in FIG. 27, the S/H circuit 53 includes a switch SW51, N-channel MOS transistors N51 and N52, and a capacitor C51. The switch SW51 is connected in series to the diode-connected transistor N51 and turned on and off by the control signal SI from the control circuit 55. The gate of the transistor N51 is connected to the gate of the transistor N52, while the source of the transistor N51 is connected to the source of the transistor N52. The capacitor C51 is arranged between the gates and the sources of the transistors N51 and N52.

As shown in FIG. 28, in the S/H circuit 53, when the switch SW51 is turned on to supply an input current to the transistor N51, the transistor N52 supplies an output current according to the input current. In the meantime, the capacitor C51 is charged by a gate voltage of the transistor N51. When the switch SW51 is subsequently turned off, the transistor N52 is driven by the voltage charged (sampled) in the capacitor C11, and the output current from the S/H circuit 53 is held at the current value before the switch SW51 is turned off.

Figure 29:
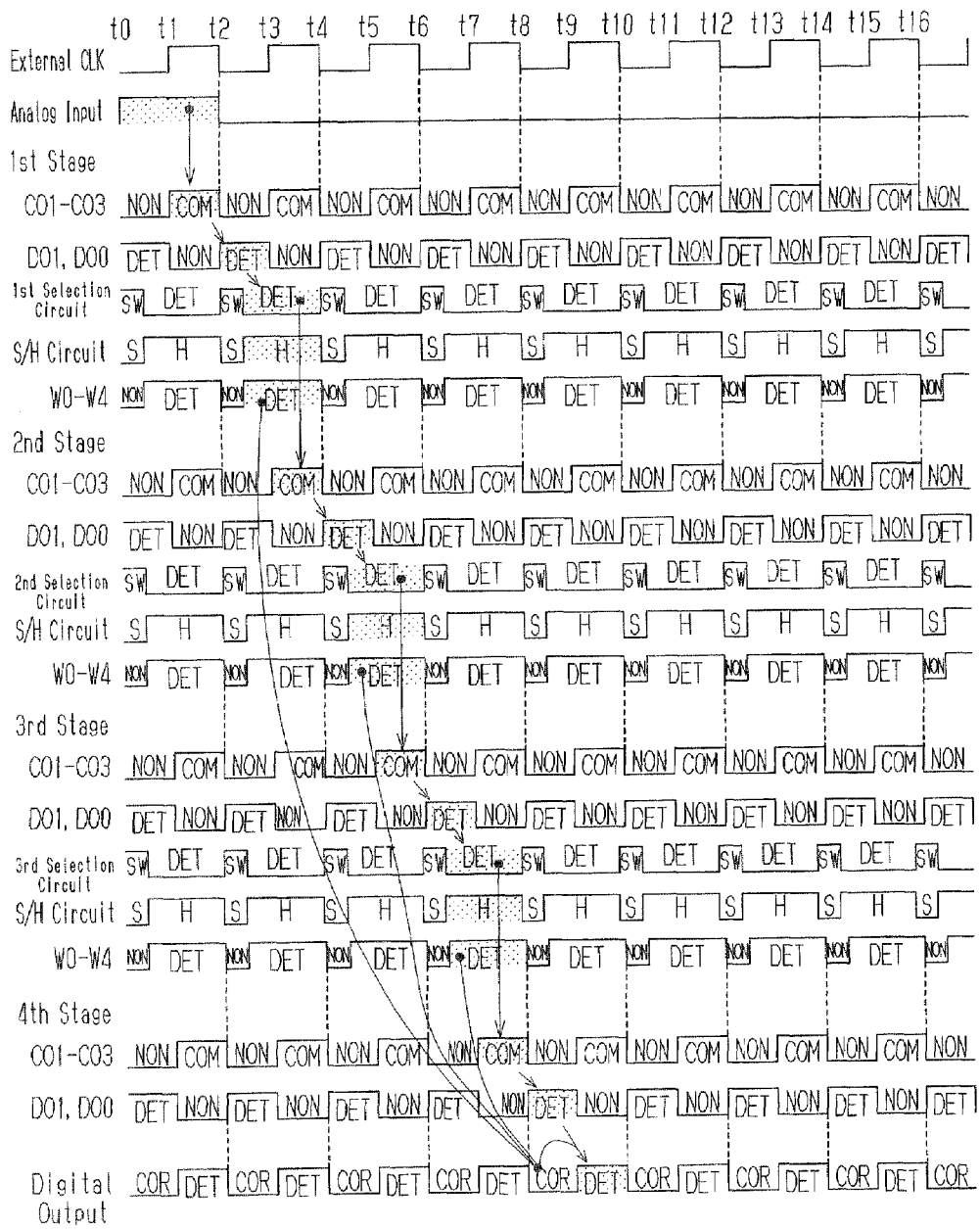
FIG. 29 is a timing chart illustrating operation of the A/D conversion circuit of FIG. 26.

The operation of the A/D conversion circuit 51 in the fourth embodiment will now be described with reference to FIG. 29. The characters of "NF", "C", "F", "SW", "S", "H", "CR" shown in FIG. 29 respectively represent the conditions or types of operation as described below.

NON: Not determined

COM: Comparison operation of comparator

DET: Determined state
SW: Switching operation of switch
S: Sampling (retrieval operation)
H: Hold (holding operation)
COR: Correction operation of digital code As shown in FIG. 29, in this operation example, the input current In1, which is an analog input, is held at a fixed value during the period from time t0 to t2 and changed at time t2.

The first-stage basic unit 52a determines the result of the comparison operation with the comparators CO1 to CO3 based on the input current In1 in the period from time t1 to t2, and determines the digital output according to the determination to output the digital output from the data output terminals DO1 and DO0 in the period from time t2 to t3. At time t2, the first selection circuit 54a starts operation to select and switch the output terminals A to D based on the levels of the output terminals DO1 and DO2. The first selection circuit 54a then completes the switching of the switches SW53 (SW53a to SW53d) at a predetermined timing, which does not depend on the external clock CLK, and determines and holds this state until time t4. The S/H circuit 53 samples the input current during the selecting and switching operation of the output terminals A to D, and holds the sampled input current during the period of determining and holding the switching to output a current according to the input current. During the period of determining and holding the switching (hold period), an output current from the S/H circuit 53 is supplied to the second-stage basic unit 52b via the switch SW53 selected by the first selection circuit 54a.

In the period from time t3 to t4, the second-stage basic unit 52b determines the result of the comparison operation by the comparators CO1 to CO3 based on the input current supplied by the first-stage basic unit 52a, and determines a digital output according to the determination in the period from time t4 to t5 to output the digital output from the data output terminals DO1 and DO0 At time t4, the second selection circuit 54b starts operation to select and switch the output terminal A to D based on the levels of the output terminals DO1 and DO2. The second selection circuit 54b completes the switching of the switch SW53 at a predetermined timing, which does not depend on the external clock CLK, and samples and holds the state until time t6. The S/H circuit 53 samples the input current during the operation to select and switch the output terminals A to D, and holds the sampled input current during the period of determining and holding the switching to output a current according to the input current. During the period of determining and holding the switching (hold period), output current from the S/H circuit 53 is supplied to the third-stage basic unit 52c via the switch SW53 selected by the second selection circuit 54b.

In the period from time t5 to t6, the third-stage basic unit 52c determines the result of the comparison operation with the comparators CO1 to CO3 based on the input current provided by the second-stage basic unit 52b and fixes a digital output according to the determination to output the digital output from the data output terminals DO1 and DO0 during the period from time t6 to t7. At time t6, the third selection circuit 54c starts operation to select and switch the output terminals A to D based on the levels of the output terminals DO1 and DO2. The third selection circuit 54c completes the switching of the switch SW53 at a predetermined timing, which does not depend on the external clock CLK, and determines and holds the state until time t8. The S/H circuit 53 samples the input current during the operation of selecting and switching the output terminals A to D, and holds the sampled input current to output an output current according to the input current during the period of determining and hold-ing the switching. In the period of determining and holding the switching (hold period), the output current from the S/H circuit 53 is supplied to the fourth-stage basic unit 52d via the switch SW53 selected by the third selection circuit 54c.

In the period from time t7 to t8, the fourth-stage basic unit 52d determined the result of the comparison operation by the comparators CO1 to CO3 based on the input current supplied by the third-stage basic unit 52c, and determined a digital output according to the determination to output the digital output from the data output terminals DO1 and DO0 in the period from time t8 to t9.

The period in which the first-stage to third-stage basic units 52a to 52c determine the outputs from the error correcting output terminals W0 to W4 is the same as the hold period of the S/H circuits 53 connected to the output of the respective basic units 52a to 52c. This provides more time for the determination of the comparators CO20 to CO24 in comparison with the comparators CO1 to CO3.

In the periods for fixing the error correcting outputs, the output signals DW0 to DW4 from the error correcting output terminals W0 to W4 are retrieved by the control circuit 55. In the periods for determining the digital output by the basic units 52a to 52d, the output signals from the data output terminals DO1 and DO1 are also retrieved by the control circuit 55.

The control circuit 55 performs error correction processing in the period from time t8 to t9, which is the period for determining the fourth-stage digital output, and then determines 8-bit digital outputs (output signals D7 to D0) as the result of the A/D conversion to output the digital outputs from the respective output terminals in the time t9 to time 10.

The features of the A/D conversion circuit 51 in the fourth embodiment of the present invention will now be described.

The A/D conversion circuit 51 is formed by series-connecting the basic units 52a to 52d having the same configuration in four stages. This simplifies the circuit configuration. Further, this also makes it possible to suppress the relative accuracy error among the basic units, and thus improves the accuracy of the A/D conversion. The simplification of the circuit configuration enables reduction in the production cost of the A/D conversion circuit 51.

In the A/D conversion circuit 51, error correction signals from the basic unit 52a to 52c of the preceding stages (output signals from the comparators CO20 to CO24) DW0 to DW4 are retrieved by the control circuit 55 serving as an error correction circuit before the basic unit 52d of the final stage outputs digital signals. The control circuit 55 performs correction processing to correct the A/D conversion result (output signals from the data output terminals DO1 and DO0) of the basic units 52a to 52c of the preceding stages based on the error correction signals DW0 to DW4. This correction processing makes it possible to realize highly accurate A/D conversion.

In the A/D conversion circuit 31 of the second embodiment described above (see FIG. 14), the input current supplied from the first-stage basic unit 32 to the second-stage basic units 32a to 32d may assume a current value of "0" or an extremely small value. Therefore, if the A/D conversion circuit 31 is arranged near the source of noise, it is difficult to ensure a high A/D conversion accuracy.

FIG. 30 is an explanatory diagram illustrating the operation of the A/D conversion circuit 31. As described above, when the input current In1 range is from 0 to 4, the D unit 32d is selected from the second-stage basic units 32a to 32d based on the L level signals D3 and D2 output by the first-stage basic unit 32. In this case, a current obtained by subtracting the input current In1 from the reference current I23 (=4) is supplied to the D unit 32d via the output terminal D. Accordingly, the range of the input current to the second-stage D unit 32d is 4 to 0.

When the range of the input current is 4 to 8, the C unit 32c is selected and supplied with current obtained by subtracting the input current In1 from the reference current I22 (=8). Thus, the range of the input current to the second-stage C unit 32c is 4 to 0. When the range of the input current In1 is 8 to 12, the B unit 32b is selected and supplied with current obtained by subtracting the input current from the reference current I21 (=12). Thus, the input current range to the second-stage B unit 32b is 4 to 0. When the range of the input current In1 is 12 to 16, the A unit 32a is selected and supplied with current obtained by subtracting the input current from the reference current I20 (=16). Thus, the input current range to the second-stage A unit 32a is 4 to 0.

In this manner, the input current to the second-stage units 32a to 32d may take a value of "0" or a very small value. In such a case, it becomes difficult to perform normal conversion operation because, for example, the operation speed of the circuit for receiving the input current in the second-stage units 32a to 32d (the current mirror circuit including the transistors N10 and N20 to N23) is substantially reduced. Further, if the input current from the first stage to the second stage becomes very small, the current signal will be obscured by noise from peripheral circuits or the like, and it will become difficult to accurately transfer the signal.

Accordingly, in an A/D conversion circuit according to a fifth embodiment described below, a circuit configuration is employed for preventing the input current of the second-stage basic unit from assuming a value of "0" or an extremely small current value.

Figure 31:
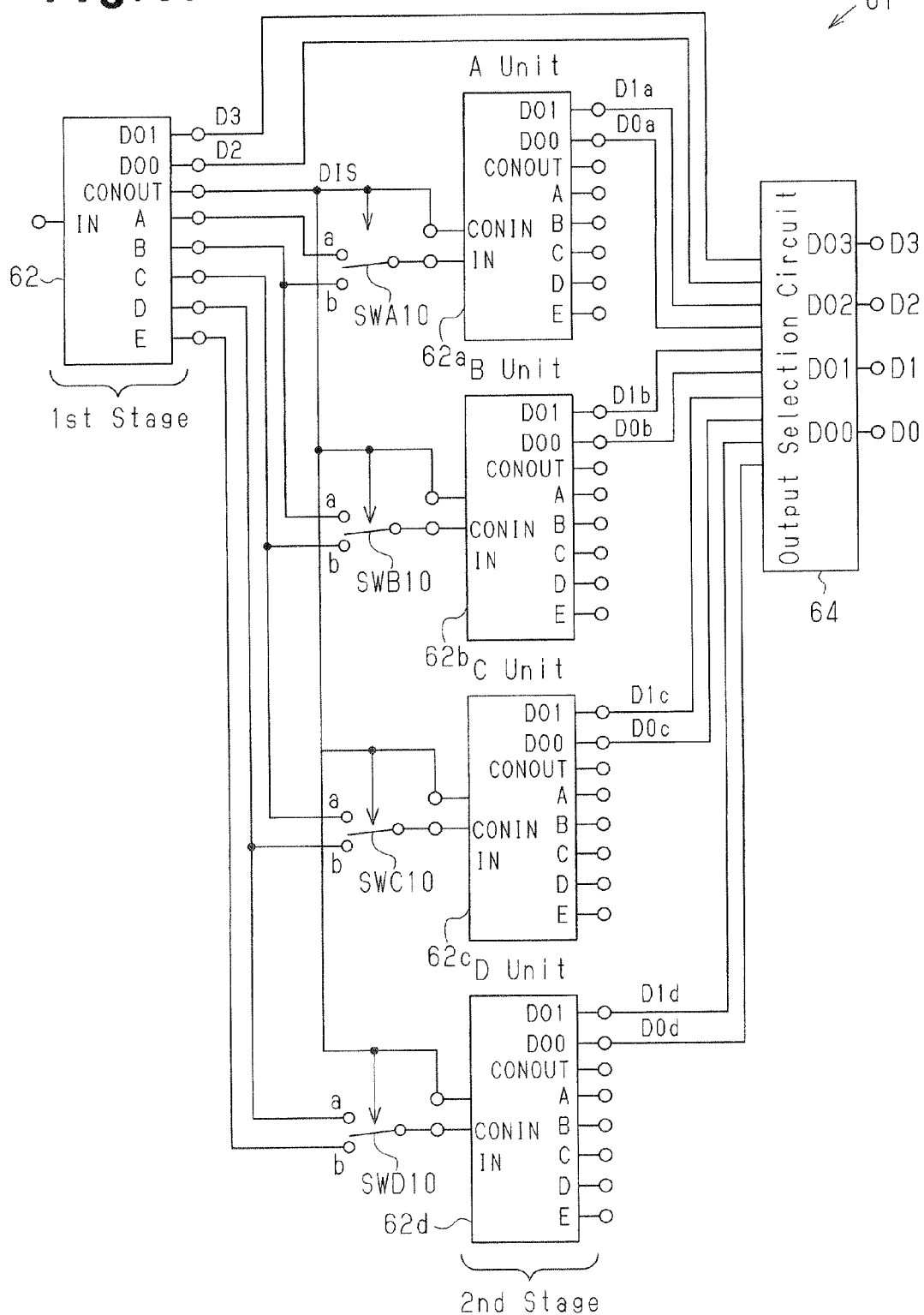
FIG. 31 is a circuit diagram showing an A/D conversion circuit according to a fifth embodiment of the present invention.

FIG. 31 shows an A/D conversion circuit 61 of the fifth embodiment.

Like the second embodiment described above, the A/D conversion circuit 61 of the fifth embodiment is also a 4-bit A/D conversion circuit in which a plurality of basic units 62, and 62a to 62d are connected to form a two-stage tree structure.

The basic unit 62, and 62a to 62d each include an output terminal CONOUT for outputting an identification signal DIS of the input current in addition to one input terminal IN, two data output terminals DO0 and DO1, and five output terminals A to E for outputting a current. Further, the second-stage basic units 62a to 62d include an input terminal CONIN for receiving the identification signal DIS from the first-stage basic unit 62.

The output terminals A and B of the first-stage basic unit 62 are connected to the input terminal IN of the second-stage A unit 62a via a switch SWA10, and the output terminals B and C are connected to the input terminal IN of the second-stage B unit 62b via a switch SWB10. The output terminals C and D of the first-stage basic unit 62 are connected to the input terminal IN of the second-stage C unit 62c via a switch SWC10, and the output terminals D and E are connected to the input terminal IN of the second-stage B unit 62b via a switch SWD10.

The data output terminals DO0 and DO1 of the first-stage basic unit 62 and the data output terminals DO0 and DO1 of the second-stage units 62a to 62d are connected to an output selection circuit 64. The output selection circuit 64 includes four data output terminal DO0 to DO3, and 4-bit signals (digital codes) D0 to D3 are output from the output terminals DO0 to DO3.

Figure 32:
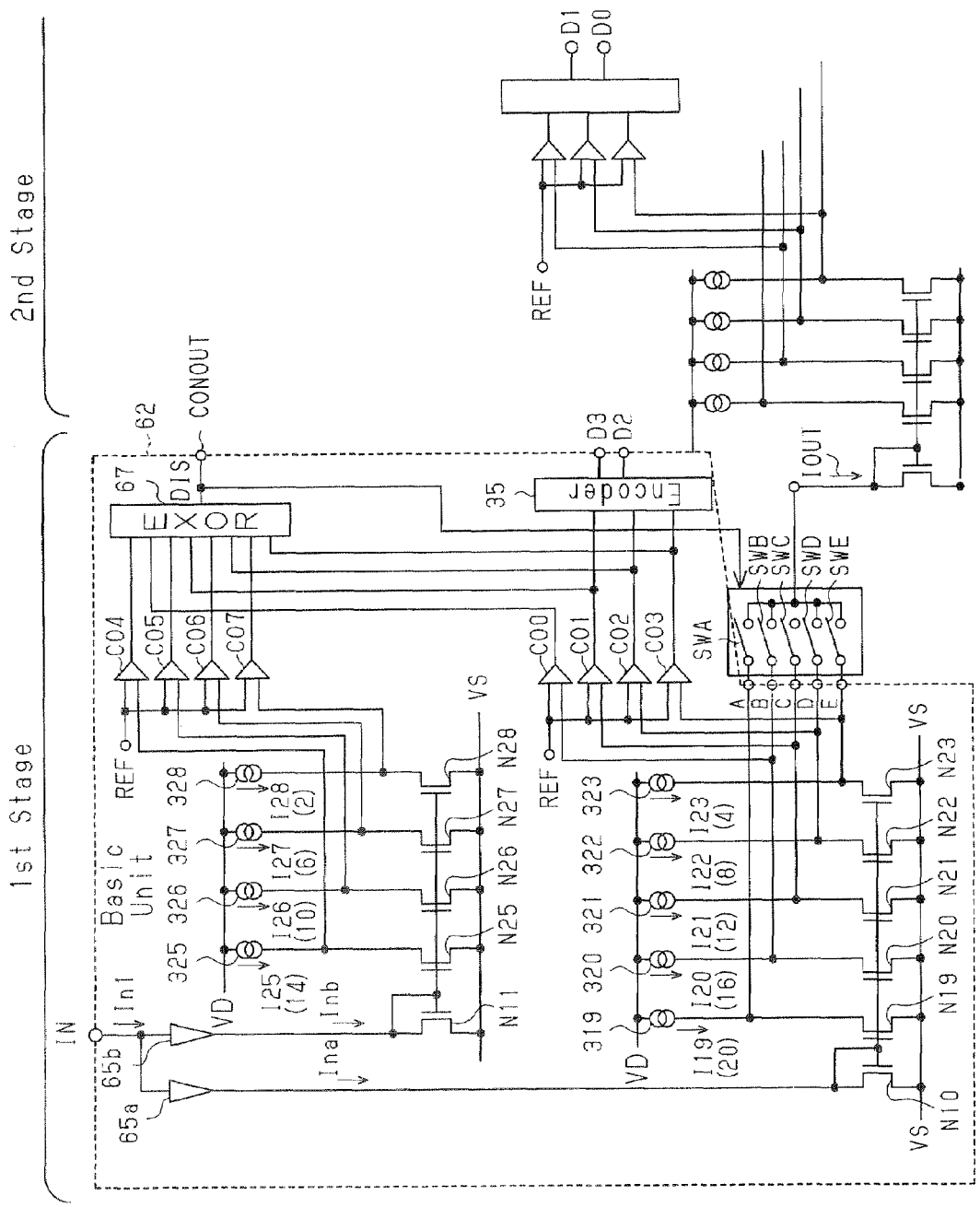
FIG. 32 is an explanatory diagram illustrating principles of the fifth embodiment.

FIG. 32 is an explanatory diagram illustrating the principle of the fifth embodiment. In FIG. 32, same reference numerals are given to those components that are the same in the second embodiment.

Two current buffers 65a and 65b are connected to an input terminal IN. One of the current buffers 65a is connected in series to a transistor N10, and the other current buffer 65b is connected in series to a transistor N11. The current buffers 65a and 65b are provided with an input current In1, which is an analog signal, from the input terminal IN. The current buffer 65a and 65b supply transistors N10 and N11 with currents Ina and Inb, which are equivalent to the input current In1.

In the circuit section of the lower stages of the basic unit 62, a current mirror circuit is formed by the transistor N10 and transistors N19 to N23, and the current Ina (=In1) flowing through the transistor N10 is transferred to the respective current paths including the transistors N19 to N23. In the circuit sections of the upper stages of the basic unit 62, a current mirror circuit by the transistor N11 and transistors N25 to N28, and the current Inb (=In1) flowing through the transistor N11 is transferred to the respective current paths including the transistors N25 to N28.

The drains of the transistors N19 to N23, and N25 to N28 serving as the outputs of the current mirror circuits are connected to constant current sources 319 to 323 and 325 to 328, respectively. The constant current sources 319 to 323 and 325 to 328 supply different reference currents I19 to I23 and I25 to I28, respectively.

Specifically, when the range of input currents In1 is from 0 to 16, reference currents I19 to I2, and I25 to I28 are set for the respective current sources as: I19=20, I20=16, I21=12, I22=8, I23=4, I25=14, I26=10, I27=6, and I28=2.

The connection nodes between the constant current sources 319 to 323 and the transistors N19 to N23 are respectively connected to output terminals A to E so that the currents transferred to the transistors N19 to N23 are subtracted from the reference currents I19 to I23 and the currents obtained by the subtraction are output from the output terminals A to E.

The connection nodes between the constant current sources 320 to 323 and the transistors N20 to N23 are connected to the input terminals of comparators CO0 to CO3, and the connection nodes between the constant current sources 325 to 328 and the transistors N25 to N28 are connected to the input terminals of comparators CO4 to CO7. The comparators CO0 to CO7 are differential comparators as shown in FIG. 17.

The output terminals of the comparator C0 to CO3 are connected to an encoder 35. The encoder 35 outputs signals D3 and D2 corresponding to two high-order bits based on determination signals (output signals) from the comparators CO1 to CO3.

The output terminals of the comparators CO0 to CO7 are connected to an exclusive OR (EXOR) circuit 67, and the EXOR circuit 67 outputs an identification signal DIS from its output terminal CONOUT, based on determination signals (output signals) of the comparators CO0 to CO7. Switches SWA to SWE connected to the output terminal A to E are controlled based on the identification signal DIS from the output terminal CONOUT, and an output current IOUT is supplied to second-stage basic units 62a to 62d through a switch that is turned on.

FIG. 33 is an explanatory diagram illustrating the operation of the circuit shown in FIG. 32. In association with the ranges of the input currents In1, FIG. 33 shows outputs of the comparator CO0 to CO7, currents output from the output terminals A to E, signal levels of the output terminal CONOUT, switches that are turned on, and output currents IOUT supplied from the first stage to the second-stage.

When the input current In1 is 0 to 2, the outputs of the lower comparators CO0 to CO3 assume levels of "LLLL", which is the same as the output levels of "LLLL" of the upper comparators CO4 to CO7. Therefore, the output terminal CONOUT (the identification signal DIS) of the EXOR circuit 67 shifts to an L level. In this case, the switch SWE is turned on, and the output current IOUT is supplied to the second-stage basic unit through the output terminal E. Thus, the range of the currents IOUT is from 4 to 2.

When the input current In1 is from 2 to 4, the outputs of the lower comparators CO0 to CO3 assume levels of "LLLL", which differ from the output levels of "LLLH" of the upper comparators CO4 to CO7. Therefore, the output terminal CONOUT (the identification signal DIS) of the EXOR circuit 67 shifts to an H level. If the switch SWE is turned on in the same manner as when the input current In1 is in the range of 0 to 2, the range of the output current IOUT provided to the second-stage basic unit will be 0 to 2. Accordingly, it is determined that the input current In1 is in the range of 2 to 4 based on the level of the output (the identification signal DIS=H level) from the output terminal CONOUT, and the switch SWD that is connected to the output terminal D instead of the output terminal E is turned on. Thus, an output current from the output terminal D that is greater by 4 than the output current from the output terminal E is provided to the second-stage basic unit. This means that the output current IOUT in the range of 6 to 4 is supplied to the second-stage basic unit.

Similarly, when the input current In1 is from 6 to 8, to 12, or 14 to 16, the output levels of the lower comparators CO0 to CO3 differ from the output levels of the comparators CO4 to CO7. Therefore, the output terminal CONOUT (the identification signal DIS) of the EXOR circuit 67 shifts to an H level. One of the switches is turned on, based on the output level of the output terminal CONOUT, so that the output current IOUT supplied to the second-stage basic unit assumes the range of 6 to 4 instead of the range of 0 to 2. The output current IOUT supplied from the first stage to the second stage is thus prevented from assuming a value of "0" or an extremely small current value.

Figure 34:
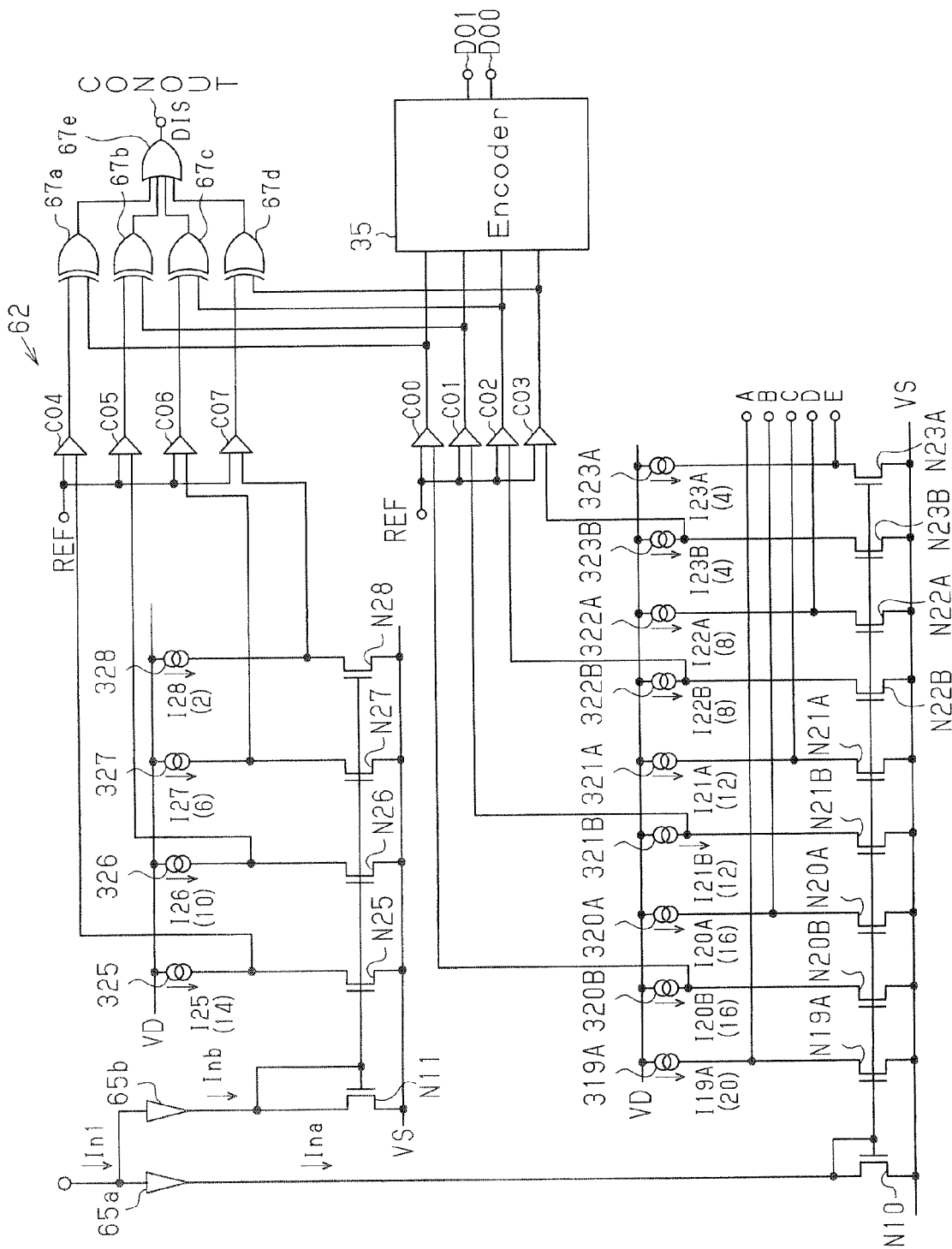
FIG. 34 is a circuit diagram showing a first-stage basic unit of the A/D conversion circuit shown in FIG. 31.

FIG. 34 is a circuit diagram showing a specific configuration of the first-stage basic unit 62 in the fifth embodiment.

In the circuit section of the lower stages of the basic unit 62, nine series-connected circuits including constant current source 319A to 323B and transistors N19A to N23B are arranged between a high-potential power supply VD and a low-potential power supply VS. The gate of the transistor N10 and the gates of the transistor N19A to N23B are connected to each other and to the drain of the transistor N10. The transistor N10 and the transistors N19A to N23B form a current mirror circuit, which functions as a first current transfer circuit. In accordance with the mirror ratio (1:1), the current mirror circuit transfers the input current Ina, which is supplied to the transistor N10 through the current buffer 65a, to nine current paths including the transistors N19A, N20A, N20B, N21A, N21B, N22A, N22B, N23A and N23B.

A reference current I20A supplied by a constant current source 320A has the same current value as the reference current I20B supplied by a constant current source 320B, and a reference current I21A supplied by a constant current source 321A has the same current value as a reference current I21B supplied by a constant current source 321B. A reference current I22A supplied by a constant current source 322A has the same current value as a reference current I22B, which is supplied by a constant current source 322B, and a reference current I23A supplied by a constant current source 323A has the same current value as a reference current I23B, which is supplied by a constant current source 323B.

The reference current I20A (I20B) is set to a maximum current value in the range of input currents input to the A/D conversion circuit 61. The reference currents I21A, I22A and I23A (I21B, I22B and I23B) are set by even allocation based on values obtained by dividing the input current range by the number of bits (divided current values) as described below. Further, the reference current I19A is set to a value obtained by adding the divided current value obtained by the even division to the maximum current value. Specifically, I19A is set to "maximum current value+(input current range÷N [decimal number])×1";

I20A and I20B are set to "maximum current value";

I21A and I21B are set to "maximum current value−(input current range÷N [decimal number])×1";

I22A and I22B are set to "maximum current value−(input current range÷N [decimal number])×2"; and I23A and I23B are set to "maximum current value−(input current range÷N [decimal number])×3".

Consequently, when the input current range is from 0 to 16, the reference currents are set as follows.

I19A=20

I20A=I20B=16

$I21A=I21B=16-(16÷4)×1=12$ $I22A=I22B=16-(16÷4)×2=8$ $I23A=I23B=16-(16÷4)×3=4$

The transistor N19A is connected to the output terminal A, the transistor N20A to the output terminal B, the transistor N21A to the output terminal C, the transistor N22A to the output terminal D, and the transistor N23A to the output terminal E. Further, the transistor N20B is connected to the comparator CO0, the transistor N21B to the comparator CO1, the transistor N22B to the comparator CO2, and the transistor N23B to the comparator CO3.

The comparators CO0 to CO3 are differential comparators as shown in FIG. 17, which output an L level signal when the input voltage is higher than the reference voltage REF and output an H level signal when the input voltage is lower than the reference voltage REF.

The output terminals of the comparators CO0 to CO3 are connected to the encoder 35 so that the encoder 35 outputs output signals according to the output levels of the comparators CO0 to CO3 from the output terminal DO1 and the output terminal DO0.

In the circuit section of the upper stages of the basic unit 62, four series-connected circuits including constant current sources 325 to 328 and transistors N25 to N28 are arranged between a high-potential power supply VD and a low-potential power supply VS. The gate of the transistor N11 and the gates of the transistors N25 to N28 are connected to each other and to the drain of the transistor N11. The transistor N11 and the transistors N25 to N28 form a current mirror circuit, which functions as a second current transfer circuit. In accordance with the mirror ratio (1:1), the current mirror circuit transfers the input current Inb, which is supplied to the transistor N11 through the current buffer 65b, to four current paths including the transistors N25, N26, N27 and N28.

A reference current I25 of a constant current source 325 connected to the transistor N25 is set as a current value between the reference currents I20A and I21A of the lower stages, and a reference current I26 of a constant current source 326 connected to the transistor N26 is set to a current value between the reference currents I21A and I22A in the lower stages. A reference current I27 of a constant current source 327 connected to the transistor N27 is set to a current value between the reference currents I22A and I23A in the lower stages, and a reference current I28 of a constant current source 328 connected to the transistor N28 is set to a current value smaller than the reference current of the lower stages. In the fifth embodiment, the reference currents I25 to I28 are set as I25=14, I26=10, I27=6, and I28=2.

The transistor N25 is connected to a comparator CO4, the transistor N26 to a comparator CO5, the transistor N27 to a comparator CO6, and the transistor N28 to a comparator CO7. The comparators CO4 to CO7 are also differential comparators shown in FIG. 17, which output an L level signal when the input voltage is higher than the reference voltage REF, and output an H level signal when the input voltage is lower than the reference voltage REF.

An output signal of the comparator CO0 is provided to a first input terminal of an EXOR circuit 67a, and an output signal of the comparator CO4 is provided to a second input terminal of the EXOR circuit 67a. An output signal of the comparator CO1 is provided to a first input terminal of an EXOR circuit 67b, and an output signal of the comparator CO5 is provided to a second input terminal of the EXOR circuit 67b. An output signal of the comparator CO2 is provided to a first input terminal of an EXOR circuit 67c, and an output signal of the comparator CO6 is provided to a second input terminal of the EXOR circuit 67c. An output signal of the comparator CO3 is provided to a first input terminal of an EXOR circuit 67d, and an output signal of the comparator CO7 is provided to a second input terminal of the EXOR circuit 67d.

An output signal of the EXOR circuit 67a is provided to a first input terminal of an OR circuit 67e, an output signal of the EXOR circuit 67b is provided to a second input terminal of the OR circuit 67e. An output signal of the EXOR circuit 67c is provided to a third input terminal of the OR circuit 67e, and an output signal of the EXOR circuit 67d is provided to a fourth input terminal of the OR circuit 67e. The OR circuit 67e outputs, from its output terminal CONOUT, an identification signal DIS according to the output signals of the EXOR circuits 67a to 67d, that is, the output signal levels of the comparator CO0 to CO7.

Specifically, as shown in FIG. 33, when the output signal levels of the lower comparators CO0 to CO3 are the same as the output signal levels of the upper comparators CO4 to CO7, an L level identification signal DIS is output from the output terminal CONOUT. When the output signal levels of the lower comparators CO0 to CO3 are not the same as the output signal levels of the upper comparators CO4 to CO7, an H level identification signal DIS is output from the output terminal CONOUT.

If the input current In1 input to the first-stage basic unit 62 is 4.5, the output terminals A to E respectively output currents obtained by subtracting 4.5 from the reference currents I19A to I23A as described below.

$A = I19A - 4.5 = 20 - 4.5 = +15.5$ $B = I20A - 4.5 = 16 - 4.5 = +11.5$ $C = I21A - 4.5 = 12 - 4.5 = +7.5$ $D = I22A - 4.5 = 8 - 4.5 = +3.5$ $E = I23A - 4.5 = 4 - 4.5 = -0.5$

In the meantime, the lower comparators CO0 to CO3 are supplied with currents obtained by subtracting 4.5 from the reference currents I20B to I23B. Specifically, the input currents to the comparators CO0 to CO3 are as described below.

Input current to $CO0 = I20B - 4.5 = 16 - 4.5 = +11.5$

Input current to $CO1 = I21B - 4.5 = 12 - 4.5 = -7.5$

Input current to $CO2 = I22B - 4.5 = 8 - 4.5 = +3.5$

Input current to $CO3 = I23B - 4.5 = 4 - 4.5 = -0.5$

Accordingly, the input voltage to the comparator CO0 shifts to an H level, and the output signal shifts to an L level. The input voltage to the comparator CO1 shifts to an H level, and the output signal shifts to an L level. The input voltage to the comparator CO2 shifts to an H level, and the output signal shifts to an L level. The input voltage to the comparator CO3 shifts to an L level, and the output signal shifts to an H level.

In the meantime, the upper comparators CO4 to CO7 are also supplied with currents obtained by subtracting 4.5 from the reference currents I25 to I28. Specifically, the input currents to the comparators CO4 to CO7 are as described below.

Input current to $CO4 = I25 - 4.5 = 14 - 4.5 = +9.5$

Input current to $CO5 = I26 - 4.5 = 10 - 4.5 = +5.5$

Input current to $CO6 = I27 - 4.5 = 6 - 4.5 = +1.5$

Input current to $CO7 = I28 - 4.5 = 2 - 4.5 = -2.5$

Accordingly, the input voltage to the comparator CO4 shifts to an H level, and the output signal shifts to an L level. The input voltage to the comparator CO5 shifts to an H level, and the output signal shifts to an L level. The input voltage to the comparator CO6 shifts to an H level, and the output signal shifts to an L level. The input voltage to the comparator CO7 shifts to an L level, and the output signal shifts to an H level.

Thus, when the input current is 4.5, the output terminal A=H level, the output terminal B=H level, the output terminal C=H level, the output terminal D=H level, and the output terminal E=L level are satisfied. Each of the outputs from the lower comparators CO0 to CO3 assume the levels as follows: CO0=L, CO1=L, CO2=L, and CO3=H. Further, each of the outputs from the upper comparators CO4 to CO7 assume the levels as follows: CO4=L, CO5=L, CO6=L, and CO7=H.

The encoder 35 outputs an L level signal D3 from the output terminal DO1 and an H level signal D2 from the output terminal DO0 based on the output levels of the comparators CO0 to CO3 (see the truth table of FIG. 35).

Since the EXOR circuit 67a is provided with an L level signal by the comparator CO0 and the comparator CO4, the EXOR circuit 67a outputs an L level signal. Since the EXOR circuit 67b is provided with an L level signal by the comparator CO1 and the comparator CO5, the EXOR circuit 67b outputs an L level signal. Since the EXOR circuit 67c is provided with an L level signal by the comparator CO2 and the comparator CO6, the EXOR circuit 67c outputs an L level signal. Since the EXOR circuit 67d is provided with an H level signal by the comparator CO3 and the comparator CO7, the EXOR circuit 67d outputs an L level signal. Accordingly, the OR circuit 67e outputs an L level identification signal DIS from the output terminal CONOUT.

When the input current In1 input to the basic unit 62 is 7.5, the output terminals A to E respectively output currents obtained by subtracting 7.5 from the reference currents I19A to I23A as described below.

$A = I19A - 7.5 = 20 - 7.5 = +12.5$ $B = I20A - 7.5 = 16 - 7.5 = +8.5$ $C=I21A-7.5=12-7.5=+4.5$ $D=122A-7.5=8-7.5=+0.5$ $E=123A-7.5=4-7.5=-3.5$

In this case, the input currents to the comparators CO0 to CO3 are as follows.

Input current to $CO0=I20B-7.5=16-7.5=+8.5$

Input current to $CO0=I21B-7.5=12-7.5=+4.5$

Input current to $CO2=122B-7.5=8-7.5=+0.5$

Input current to $CO3=123B-7.5=4-7.5=-3.5$

Accordingly, the output signal of the comparator CO0 shifts to an L level, and the output signal of the comparator CO1 shifts to an L level. The output signal of the comparator CO2 shifts to an L level, and the output signal of the comparator CO3 shifts to an H level.

In the meantime, the upper comparator CO4 to CO7 are also provided with currents obtained by subtracting 7.5 from the reference currents I25 to I28. Specifically, the input currents to the comparators CO4 to CO7 are as follows.

Input current to $CO4=I25-7.5=14-7.5=+6.5$

Input current to $CO5=I26-7.5=10-7.5=2.5$

Input current to $CO6=127-7.5=6-7.5=-1.5$

Input current to $CO7=128-7.5=2-7.5=-5.5$

Accordingly, the output signal of the comparator CO4 shifts to an L level, and the output signal of the comparator CO5 shifts to an L level. The output signal of the comparator CO6 shifts to an H level, and the output signal of the comparator CO7 shifts to an H level.

The encoder 35 outputs an L level signal D3 from the output terminal DO1, and an H level signal D2 from the output terminal DO0, based on the output levels of the comparators CO0 to CO3 (see the truth table of FIG. 35).

Since the EXOR circuit 67a is provided with L level signals by the comparator CO0 and the comparator CO4, the EXOR circuit 67a outputs an L level signal. Since the EXOR circuit 67b is provided with L level signals by the comparator CO1 and the comparator CO5, the EXOR circuit 67b outputs an L level signal. Since the EXOR circuit 67c is provided with an L level signal by the comparator CO2 and an H level signal by the comparator CO6, the EXOR circuit 67c outputs an H level signal. Since the EXOR circuit 67d is provided with H level signals by the comparator CO3 and the comparator CO7, the EXOR circuit 67d outputs an L level signal. Consequently, the OR circuit 67e outputs an H level identification signal DIS from the output terminal CONOUT.

Although the description above has been made in terms of the case when the input current In1 is 4.5 or 7.5, the same processing is conducted when the input current In1 assumes any other value. FIG. 33 specifically illustrates the relationship between the ranges of the input currents In1, the outputs of the comparators CO0 to CO7, and the outputs of the output terminal CONOUT (the levels of the identification signal DIS). FIG. 33 also shows the output currents of the first-stage basic unit 62.

In the second embodiment, as shown in FIG. 30, when the first-stage input current In1 is in the ranges of 2 to 4, 6 to 8, 10 to 12, and 14 to 16, the first-stage output current (the input current to the second-stage) is in the range of 2 to 0. In the fifth embodiment, as shown in FIG. 33, the output from the output terminal CONOUT shifts to an H level when the first-stage input current In1 is in these ranges, and the output from the output terminal CONOUT shifts to an L level when the first-stage input current In1 is in the other ranges. Therefore, it is determined that the input current In1 is in the range of 2 to 4, 6 to 8, 10 to 12, or 14 to 16 based on the output level (H level identification signal DIS) from the output terminal CONOUT, and an output terminal having an output current value that is larger by a value corresponding to one stage when the output terminal CONOUT has an L level is selected.

More specifically, as shown FIG. 31, the switch SWA10 arranged between the first-stage basic unit 62 and the second-stage A unit 62a is connected to the output terminal A of the first-stage unit 62 at its first contact a, and to the output terminal B at its second contact b. The switch SWB10 arranged between the first-stage basic unit 62 and the second-stage B unit 62b is connected to the output terminal B of the first-stage unit 62 at its first contact a, and to the output terminal C at its second contact b. The switch SWC10 arranged between the first-stage basic unit 62 and the second-stage C unit 62c is connected to the output terminal C of the first-stage unit 62 at its first contact a, and to the output terminal D at its second contact b. The switch SWD10 arranged between the first-stage basic unit 62 and the second-stage D unit 62d is connected to the output terminal D of the first-stage unit 62 at its first contact a, and to the output terminal E at its second contact b.

When the output terminal CONOUT (identification signal DIS) has an L level, the switches SWA10 to SWD10 are switched to the second contact b, and the output currents from the output terminal B to E are supplied to the second-stage units 62a to 62d via the switches SWA1 to SWD1. In this case, the input currents provided to the second-stage units 62a to 62d assumes the same values as that in the second embodiment.

In contrast, when the output terminal CONOUT has an H level, the switches SWA10 to SWD10 are switched to the first contact a. In this case, an output current that is one level higher than when the output terminal CONOUT has an L level, that is an output current from the output terminal next closer to the terminal A among the output terminals A to E, is provided to the second-stage units 62a to 62d.

For example, when the input current is in the range of 2 to 4, the switch SWD10 is switched to the first contact a, and the upper output terminal D that outputs the output current of 6 to 4 is selected instead of the output terminal E that outputs the output current of 2 to 0. Thus, the output current from the output terminal D is provided to the second-stage D unit 62d. Accordingly, this prevents a current with a current value of "0" or an extremely small current value from being supplied to the second-stage D unit 62d.

Figure 36:
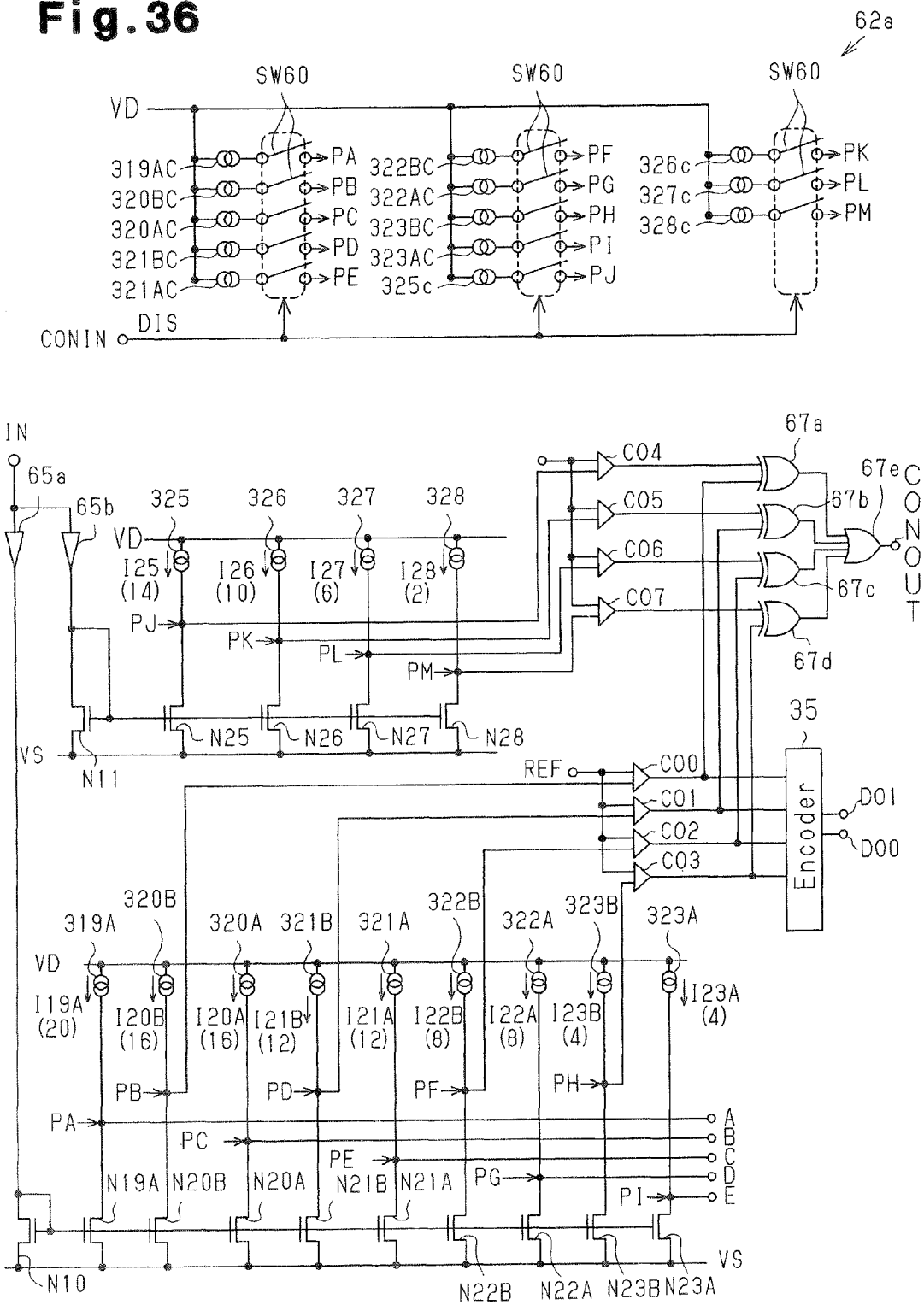
FIG. 36 is a circuit diagram showing a second-stage basic unit of the A/D conversion circuit of FIG. 31.

FIG. 36 is a circuit diagram illustrating a specific configuration of the second-stage basic units 62a to 62d in the fifth embodiment.

In the second-stage basic units 62a to 62d like in the first-stage basic units, the transistor N10 and the transistors N19A to N23B form a current mirror circuit, and the transistor N11 and the transistors N25 to N28 form a current mirror circuit. The mirror ratio of these second-stage current mirror circuits is also set to 1:4 in the same manner as the second embodiment.

The second-stage basic units 62a to 62d have a circuit configuration similar to that of the first-stage basic unit 62. Specifically, the circuit configuration of the current buffers 65a and 65b, transistors, constant current sources 319A to 323B, and 325 to 328, comparators CO0 to CO7, an encoder 35, EXOR circuits 67a to 67d, and an OR circuit 67e are the same as the first stage.

Unlike the first-stage basic unit 62, the second-stage basic units 62a to 62d additionally include a plurality of constant current sources 319AC to 323BC, and 325C to 328C connected to a high-potential power supply VD and switches SW60 connected in series to the constant current sources. The switches SW60 are controlled based on an identification signal DIS input from the input terminal CONIN. Specifically, the input terminal CONIN receives an identification signal DIS from the output terminal CONOUT of the first-stage basic unit 62. The switches SW60 are turned on when the identification signal DIS has an H level, and are turned off when the identification signal DIS has an L level.

The switches SW60 are respectively connected to nodes PA to PM between the constant current sources 319A to 323B and 325 to 328 and the transistors N19A to N23B and N25 to N28. When the identification signal DIS has an H level and the switches SW60 are turned on, constant current flowing from the constant current sources 319AC to 323BC and 325C to 328C are added to reference currents I19A to I23B, and I25 to I28. The reference currents I19A to I23B and I25 to I28 are set to the same values as the reference currents in the first-stage basic unit 62. The constant currents added to the reference currents, namely, the constant currents supplied by the constant current sources 319AC to 323BC and 325C to 328C are set to 16.

When an L level identification signal DIS is output from the output terminal CONOUT of the first-stage basic unit 62, the output current from the first stage to the second-stage units 62a to 62d is the same as in the second embodiment described above. Since the switches SW60 are turned off in the second-stage units 62a to 62d, the constant currents from the constant current sources 319AC to 323BC and 325C to 328C will not flow into the nodes PA to PM. Accordingly, when the output terminal CONOUT of the first-stage basic unit 62 has an L level, the same operation and determination as in the second embodiment are performed in second-stage basic units 62a to 62d.

FIG. 37 shows output currents output from the output terminal A to E when the input current In1 is in the range of 0 to 4. When the output terminal CONOUT has an L level, however, the input current provided from the first-stage basic unit to the second-stage basic units 62a to 62d is in the range of 2 to 4.

When the output terminal CONOUT has an H level, the input current supplied to the second-stage basic units 62a to 62d is not in the range of 0 to 2, but in the range of 4 to 6 and larger by a value corresponding to one stage.

When the input current provided from the first stage to the second-stage is 4.5, the switches SW60 are turned on, and the constant currents (=16) from the constant current source 319AC to 323BC and 325C to 328C flow into the nodes PA to PM. Accordingly, the output terminals A to E output currents obtained by adding the current value (=16) of the constant current sources 319AC to 323BC and 325C to 328C to the reference currents I19A to I23A, and further subtracts the fourfold value of the input current (=4.5) from the added value. Specifically, the current values of the currents output from the output terminals A to E are as described below.

$A = (20-16) - 4.5 \times 4 = +18.0$ $B = (16+16) - 4.5 \times 4 = +14.0$ $C = (12+16) - 4.5 \times 4 = +10.0$ $D = (8+16) - 4.5 \times 4 = +6.0$ $E = (4+16) - 4.5 \times 4 = +2.0$ In this case, the input currents to the lower comparators CO0 to CO3 assume the values as described below.

Input current to $CO0 = (16+16) - 4.5 \times 4 = +14.0$

Input current to $CO1 = (12+16) - 4.5 \times 4 = +10.0$

Input current to $CO2 = (8+16) - 4.5 \times 4 = +6.0$

Input current to $CO3 = (4+16) - 4.5 \times 4 = +2.0$

As a result, the output signal of the comparator CO0 shifts to an L level, and the output signal of the comparator CO1 shifts to an L level. The output signal of the comparator CO2 shifts to an L level, and the output signal of the comparator CO3 shifts to an L level. The encoder 35 thus outputs an L level signal from the output terminals DO1 and DO0.

When the input current supplied from the first stage to the second stage is 5.5, the output terminals A to E output currents as described below. Specifically, the current values of the currents output from the output terminals A to E are as described below.

$A = (20-16) - 5.5 \times 4 = +14.0$ $B = (16+16) - 5.5 \times 4 = +10.0$ $C = (12+16) - 5.5 \times 4 = +6.0$ $D = (8+16) - 5.5 \times 4 = +2.0$ $E = (4+16) - 5.5 \times 4 = -2.0$ In this case, the input currents to the lower comparators CO0 to CO3 assume the values as described below.

Input current to $CO0 = (16+16) - 5.5 \times 4 = +10.0$

Input current to $CO1 = (12+16) - 5.5 \times 4 = +6.0$

Input current to $CO2 = (8+16) - 5.5 \times 4 = +2.0$

Input current to $CO3 = (4+16) - 5.5 \times 4 = -2.0$

Accordingly, the output signal of the comparator CO0 shifts to an L level, and the output signal of the comparator CO1 shifts to an L level. The output signal of the comparator CO2 shifts to an L level, and the output signal of the comparator CO3 shifts to an H level. The encoder 35 outputs an L level signal from the output terminal DO1, and outputs an H level signal from the output terminal DO0.

Although the description above has been made in terms of the examples in which the input current assumes a value of 4.5 or 5.5, similar processing is conducted even if the input current assumes any other value. FIG. 38 shows output currents output from the output terminals A to E when the input current In1 is in the range of 4 to 6. As shown in FIG. 38, the output currents assume the same values when the input current is in the range of 0 to 2 as shown in FIG. 37.

As shown in FIG. 35, the conversion results of the A/D conversion circuit 61, that is, the output signals D3 and D2 corresponding to two high-order bits output by the first-stage basic unit 62 and the output signals D1 and D0 (D1a to D1d and D0a to D0d) corresponding to two low-order bits output by the second-stage units 62a to 62d are the same as those in the second embodiment above.

The features of the A/D conversion circuit 61 in the fifth embodiment of the present invention will now be described.

In the A/D conversion circuit 61, an input current identification circuit is formed by a logic circuit including the EXOR circuits 67a to 67d and the OR circuit 67e, and the comparators CO0 to CO7. Based on an identification signal DIS output by the input current identification circuit, it can be determined which of the evenly divided current ranges (the current ranges of 0 to 4, 4 to 8, 8 to 12, and 12 to 16) the current value of the input current In1 belongs to. When the input current In1 is determined to belong to any of the current ranges of 2 to 4, 6 to 8, 10 to 12, and 14 to 16 based on the H level identification signal DIS, an output current from the output terminal CONOUT that is higher than when the identification signal DIS has an L level by a current value corresponding to one stage is provided as an input current to the second-stage basic units. As a result, the input current supplied from the first-stage basic unit 62 to the second-stage basic units 62a to 62d assumes a current value of "0" or an extremely small current value. Accordingly, an appropriate input current is supplied to the second-stage basic units 62a to 62d without being affected by ambient noise. This realizes a highly accurate A/D conversion circuit 61 which resists noise.

In each of the second-stage basic units 62a to 62d, a current adjustment circuit is formed by the constant current sources 319AC to 323BC and 325C to 328C and the switches SW60. When the identification signal DIS has an H level, the output terminal is switched to the one where the output current is greater by one level. The constant currents of the constant current sources 319AC to 323BC and 325C to 328C are added to the reference currents I19A to I23B and I25C to I28C so as to cancel the increase of the current values caused by the switching. This makes it possible to adjust the output currents of the second-stage basic units 62a to 62d and prevent them from being changed after the switching of the output terminals.

In the fifth embodiment, a first current subtraction circuit is formed by the current mirror circuit (transistors N10 and N19 to N23) in the circuit section for the lower stages of the basic unit 62 and the constant current sources 319 to 323. A second current subtraction circuit is formed by the current mirror circuit (transistors N11 and N25 to N228) in the circuit section for the upper stages and the constant current sources 325 to 328. The constant currents of the second constant current source group (constant current sources 325 to 328) are set so as to finely divide the set values of the first constant current source group (constant current sources 319 to 323) that are set in correspondence with the amplitude range (from 0 to 16) of the input current In1. The setting of the constant currents of the constant current source group in this manner enables the input current identification circuit to accurately identify the current range of the input current In1. This is preferable in practice.

An A/D conversion circuit according to a sixth embodiment of the present invention will now be described.

Figure 39:
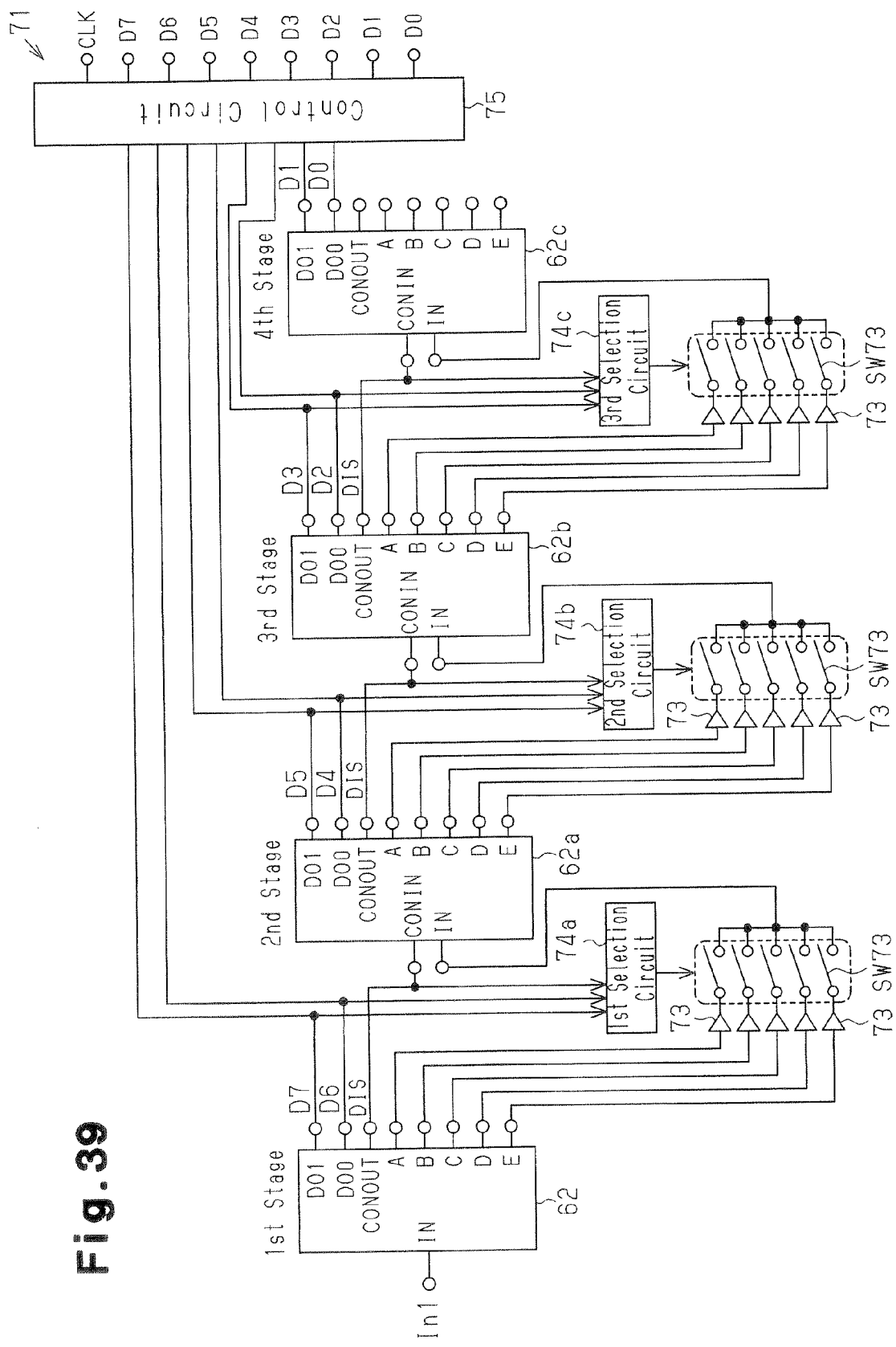
FIG. 39 is a circuit diagram showing an A/D conversion circuit according to a sixth embodiment of the present invention.

As shown in FIG. 39, an A/D conversion circuit 71 of the sixth embodiment is a pipeline-connected 8-bit A/D conversion circuit, in which basic units 72a to 72d are series-connected in four stages via sample-and-hold circuits (S/H circuits) 73 and switches SW73. According to the sixth embodiment, the basic unit shown in FIG. 34 is connected in the first stage, and the basic units 62a to 62c shown in FIG. 36 are connected in the second to fourth stages. The operation of the basic units 62, and 62a to 62c is the same as in the fifth embodiment and thus will not be described in detail. Configuration of the S/H circuit 73 is the same as that of the fourth embodiment (see FIG. 27).

In the A/D conversion circuit 71 of the sixth embodiment, the output terminals A to E of the first-stage basic unit 62 are connected to the input terminal IN of the second-stage basic unit 62a via the respective S/H circuits 73 and the respective switches SW73. The output terminal CONOUT of the first-stage basic unit 62 is connected to the input terminal CONIN of the second-stage basic unit 62a. The data output terminals DO1 and DO0 and the output terminal CONOUT of the first-stage basic unit 62 are connected to a first selection circuit 74a. The selection circuit 74a selectively turns on one of the switches SW73 based on output signals D7 and D6 from the data output terminals DO1 and DO0 and an identification signal DIS from the output terminal CONOUT. Thus, an output terminal suitable for the range of the input current In1 input to the first-stage basic unit 62 is selected from among the output terminal A to E, and a current flowing through the selected output terminal is supplied to the second-stage basic unit 62a.

The output terminals A to E of the second-stage basic unit 62a are connected to the input terminal IN of the third-stage basic unit 62b via the respective S/H circuits 73 and the respective switches SW73. The output terminal CONOUT of the second-stage basic unit 62a is connected to the input terminal CONIN of the third-stage basic unit 62b. The data output terminals DO1 and DO0 and the output terminal CONOUT of the second-stage basic unit 62a are connected to a second selection circuit 74b. The selection circuit 74b selectively turns on one of the switches SW73 based on output signals D7 and D6 from the data output terminals DO1 and DO0 and an identification signal DIS from the output terminal CONOUT. Thus, an output terminal suitable for the range of the input current In1 input to second-stage basic unit 62a is selected from the output terminals A to E, and a current flowing through the selected output terminal is provided to the third-stage basic unit 62b.

The output terminals A to E of the third-stage basic unit 62b are connected to the input terminal IN of fourth-stage basic unit 62c via the respective S/H circuits 73 and the respective switches SW73. The output terminal CONOUT of the third-stage basic unit 62b is connected to the input terminal CONIN of the fourth-stage basic unit 62c. The data output terminals DO1 and DO0 and the output terminal CONOUT of the third-stage basic unit 62b are connected to a third selection circuit 74c. The selection circuit 74c selectively turns on one of the switches SW73 based on output signals D7 and D6 from the data output terminals DO1 and DO0 and an identification signal DIS from the output terminal CONOUT. Thus, an output terminal suitable for the range of the input current In1 input to third-stage basic unit 62b is selected from among the output terminal A to E, and a current flowing through the selected output terminal is provided to the fourth-stage basic unit 62c.

The A/D conversion circuit 71 includes a control circuit 75 like the one in the fourth embodiment described above. The control circuit 75 latches output signals D7 to D0 output from the basic units 62 and 62a to 62c in the first to fourth stages at a predetermined timing, and outputs them as 8-bit digital codes. In the meantime, the control circuit 75 outputs a control signal to the S/H circuits 73 to control the sampling (retrieval operation) and the holding (holding operation) of the S/H circuits 73.

The operation of the A/D conversion circuit 71 in the sixth embodiment will now be described with reference to FIG. 40.

Figure 40:
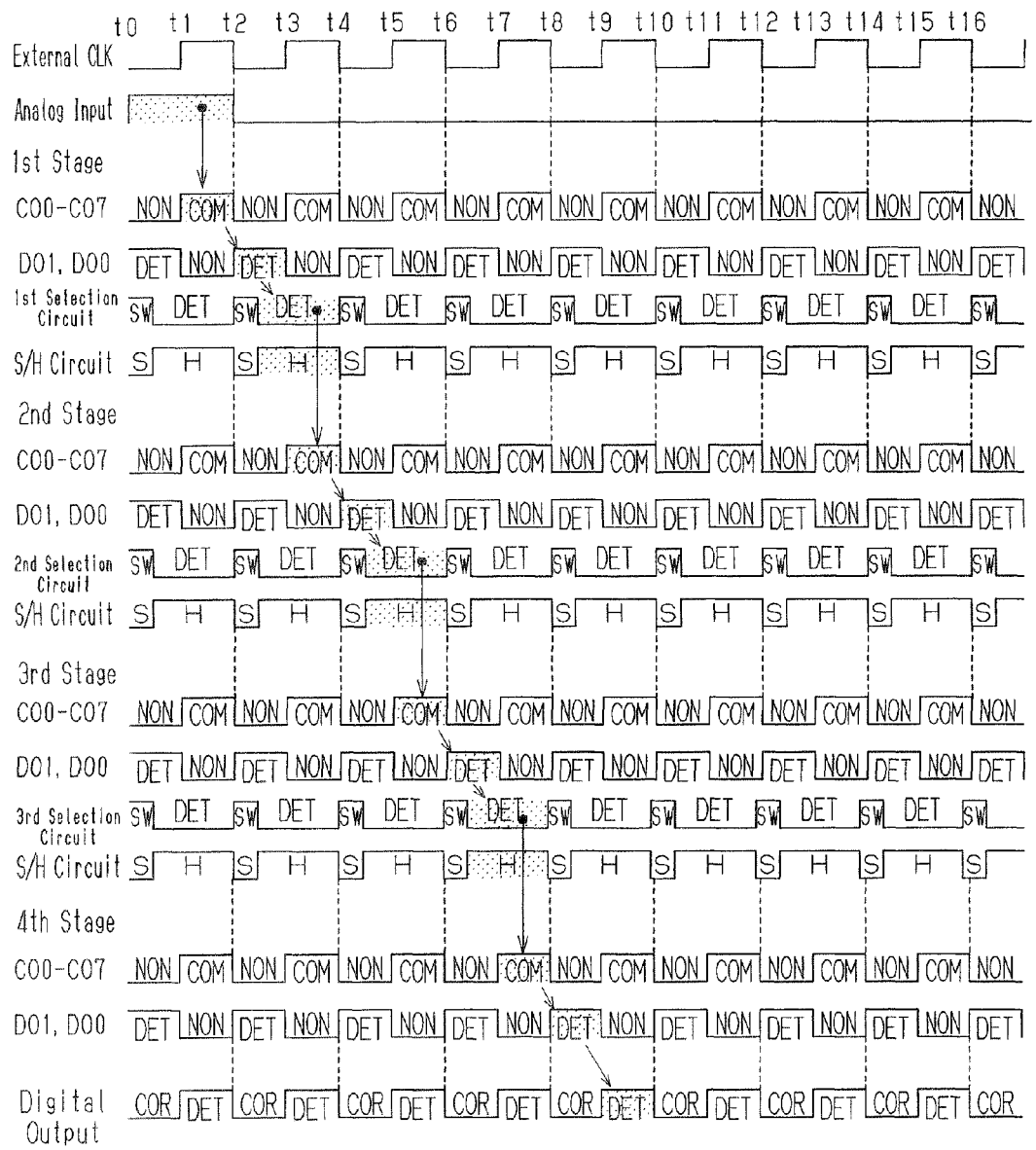
FIG. 40 is a timing chart illustrating operation of the A/D conversion circuit shown in FIG. 39.

As shown in FIG. 40, the input current In1, which is an analog input, is held at a fixed value in the period from time t0 to t2, and is varied at time t2. The first-stage basic unit 62 determines the result of the comparison operation of the comparators CO0 to CO7 based on the input current In1 in the period from time t1 to t2, determines a digital output according to the determination, and outputs the digital output from the data output terminals DO1 and DO0 in the period from time t2 to t3. At time t2, the first selection circuit 74a starts the operation to select and switch the output terminals A to E based on the output levels of the output terminals DO1, DO2 and CONOUT, completes the switching of the switches SW73 at a predetermined timing without depending on the external clock CLK, and determines and holds this state till time t4. The S/H circuit 73 samples the input current during the selecting and switching operation of the output terminals A to E, and holds the sampled input current during the period of determining and holding of the switching to output a current according to the input current. During the period of determining and holding the switching (the hold period), output current from the S/H circuit 73 is supplied to the second-stage basic unit 62a via the switch SW73 selected by the first selection circuit 74a.

The second-stage basic unit 62a determines the result of the comparison operation of the comparators CO0 to CO7 based on the input current provided by the first-stage basic unit 62 in the period from time t3 to t4, determines the digital output according to the determination, and outputs the digital output from the data output terminals DO1 and DO0 in the period from time t4 to t5. At time t4, the second selection circuit 74b starts the operation to select and switch the output terminals A to E based on the output levels of the output terminals DO1, DO2 and CONOUT, completes the switching of the switches SW73 at a predetermined timing that does not depend on the external clock CLK, and determines and holds this state until time t6. The S/H circuit 73 samples the input current during the selecting and switching operation of the output terminals A to E, and holds the sampled input current during the period of determining and holding of the switching to output a current according to the input current. During the period of determining and holding the switching (the hold period) an output current from the S/H circuit 73 is supplied to the third-stage basic unit 62b via the switch SW73 selected by the second selection circuit 74b.

The third-stage basic unit 62b determines the comparison result of the comparators CO0 to CO7 based on the input current supplied by the first-stage basic unit 62 in the period from t5 to t6, determines the digital output according to the determination, and outputs the digital output from the data output terminals DO1 and DO0 in the period from time t6 to t7. At time t6, the third selection circuit 74c starts the operation to select and switch the output terminals A to E based on the output levels of the output terminals DO1, DO2 and CONOUT, completes the switching of the switches SW73 at a predetermined timing that does not depend on the external clock CLK, and determines and holds this state until time t8. The S/H circuit 73 samples the input current during the selecting and switching operation of the output terminals A to E, and holds the sample input current during the period of determining and holding of the switching to output a current according to the input current. During the period of determining and holding the switching (the hold period), an output current from the S/H circuit 73 is provided to the fourth-stage basic unit 62c via the switch SW73 selected by third selection circuit 74c.

The fourth-stage basic unit 62c determines the comparison result of the comparators CO0 to CO7 based on the input current supplied by third-stage basic unit 62b in the period from time t7 to t8, determines the digital output according to the determination to output the digital output from the data output terminals DO1 and DO0 in the period from time t8 to t9.

The control circuit 75 outputs 8-bit digital output (output signals D7 to D0) as the A/D conversion result from the output terminals in the period from time t9 to time 10.

The features of the A/D conversion circuit 71 in the sixth embodiment of the present invention will now be described.

In the A/D conversion circuit 71, the basic units 62, and 62a to 62c having the same configuration are series-connected in four stages. This realizes highly accurate A/D conversion with a simple circuit configuration. Further, the simplification of the circuit configuration reduces the production cost of the A/D conversion circuit 71.

The above embodiments may be modified as described below.

In the D/A conversion circuit 21 of the first embodiment, the switches SWA2, SWB2, SWC2 and SWD2 of the third switch group are connected in parallel to the switches SW1, SW5, SW9 and SW13 that select the second lowest voltage among the first switch group connected to the nodes N0 to N3. However, the present invention is not limited to this. For example, the switches SWA2, SWB2, SWC2 and SWD2 may be connected in parallel to the switches SW0, SW4, SW8, SW12 that selects the lowest voltage, or may be connected in parallel to the switches SW3, SW7, SW11, SW15 that selects the highest voltage among the first switch group connected to the nodes N0 to N3. Particularly, when the order for turning on the switches SW0 to SW15 is set previously, the charge transfer amount during the switching of the switches can be reduced by determining the connection of the switches SWA2, SWB2, SWC2 and SWD2 in accordance with the order. More specifically, when the switches SW0 to SW15 are sequentially selected such that the voltages are output sequentially from the lowest voltage V0 to the highest voltage V15, the switches SWA2, SWB2, SWC2 and SWD2 are connected in parallel to the switches SW0, SW4, SW8 and SW12. In this case, when the output voltage from the output terminal OUT is switched from the voltage V3 to the voltage V4, for example, the voltage applied to the parasitic capacitors C4 to C7 and CB11 of the switches SW4 to SW7 and SWB1 connected to the node N1 after the switching of the voltage is the same voltage V4 as before the switching of the voltage. With this configuration, no charge is moved among the parasitic capacitors of the switches SW4 to SW7 and SWB1. This increases the conversion speed.

Figure 41:
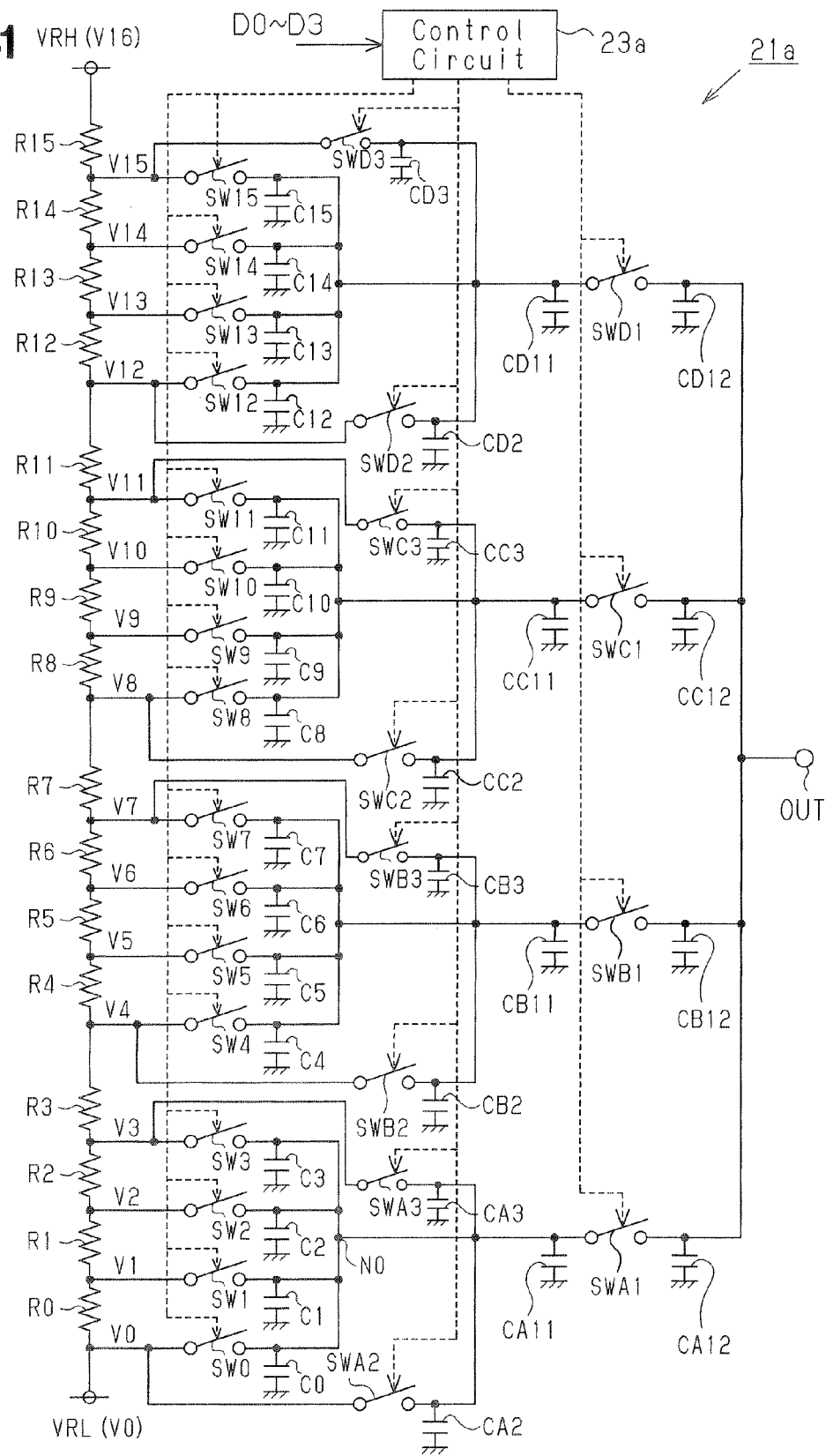
FIG. 41 is a circuit diagram showing a D/A conversion circuit of a further embodiment.

As shown in FIG. 41, a D/A conversion circuit 21a may include two third switches for each node so as to switch the voltages applied to the nodes N0 to N3 in accordance with the input signal. In this D/A conversion circuit 21a, the third switch group (switches SWA2, SWA3, SWB2, SWB3, SWC2, SWC3, SWD2 and SWD3) are controlled by a control circuit 23a based on the current input signals D0 to D3 (the output voltages at the output terminal OUT).

More particularly, the switch SWA2 is connected in parallel to the switch SW0 that selects the lowest voltage V0 among the switches SW0 to SW3 forming the A group, and the switch SWA3 is connected in parallel to the switch SW3 that selects the highest voltage V3. The switch SWB2 is connected in parallel to the switch SW4 that selects the lowest voltage V4 among the switches SW4 to SW7 forming the B group, and the switch SWB3 is connected in parallel to the switch SW7 that selects the highest voltage V7. The switch SWC2 is connected in parallel to the switch SW8 that selects the lowest voltage V8 among the switches SW8 to SW11 forming the C group, and the switch SWC3 is connected in parallel to the switch SW11 that selects the highest voltage V11. The switch SWD2 is connected in parallel to the switch SW12 that selects the lowest voltage V12 among the switches SW12 to SW15 forming the D group, and the switch SWD3 is connected in parallel to the switch SW15 that selects the highest voltage V15.

In the D/A conversion circuit 21a, the control circuit 23a controls the switches SWA2, SWA3, SWB2, SWB3, SWC2, SWC3, SWD2 and SWD3 based on the input signals D0 to D3, for example, to apply voltage that is close to the selected voltage (the voltage of the output terminal OUT) to the nodes N0 to N3.

If the voltage of the A group (e.g., the voltage V3) is selected as the output voltage, the control circuit 23a turns on only the switch SW3 among the switches SW0 to SW15 forming the first switch group, and turns on only the switch SWA1 among the switches SWA1 to SWD1 forming the second switch group. The control circuit 23a controls the switches forming the third switch group so that both switches SWA2 and SWA3 of the A group are turned off, and the switch SWB2 of the B group is turned on while the switch SWB3 is turned off. Further, the switch SWC2 of the C group is turned on while the switch SWC3 is turned off, and the switch SWD2 of the D group is turned on while the switch SWD3 is turned off.

When the output voltage of the output terminal OUT is then switched to the voltage of the B group (e.g., voltage V4), only the switch SW4 among the switches SW0 to SW15 forming the first switch group is turned on, and only the switch SWB1 among the switches SWA1 to SWD1 forming the second switch group is turned on. The control circuit 23a controls the switches forming the third switch group so that the switch SWA2 of the A group is turned off while the switch SWA3 is turned on, and both switches SWB2 and SWB3 of the B group are turned off. The switch SWC2 of the C group is turned on while the switch SWC3 is turned off, and the switch SWD2 of the D group is turned on while the switch SWD3 is turned off.

In this case, the voltage applied to the parasitic capacitors C4 to C7 and CB1 of the switches SW4 to SW7 and SWB1 connected to the node N1 after the switching of the voltage is the same voltage V4 as before the switching. In other words, no charge is moved in the parasitic capacitors. Therefore, D/A conversion is quickly performed.

Figure 42:
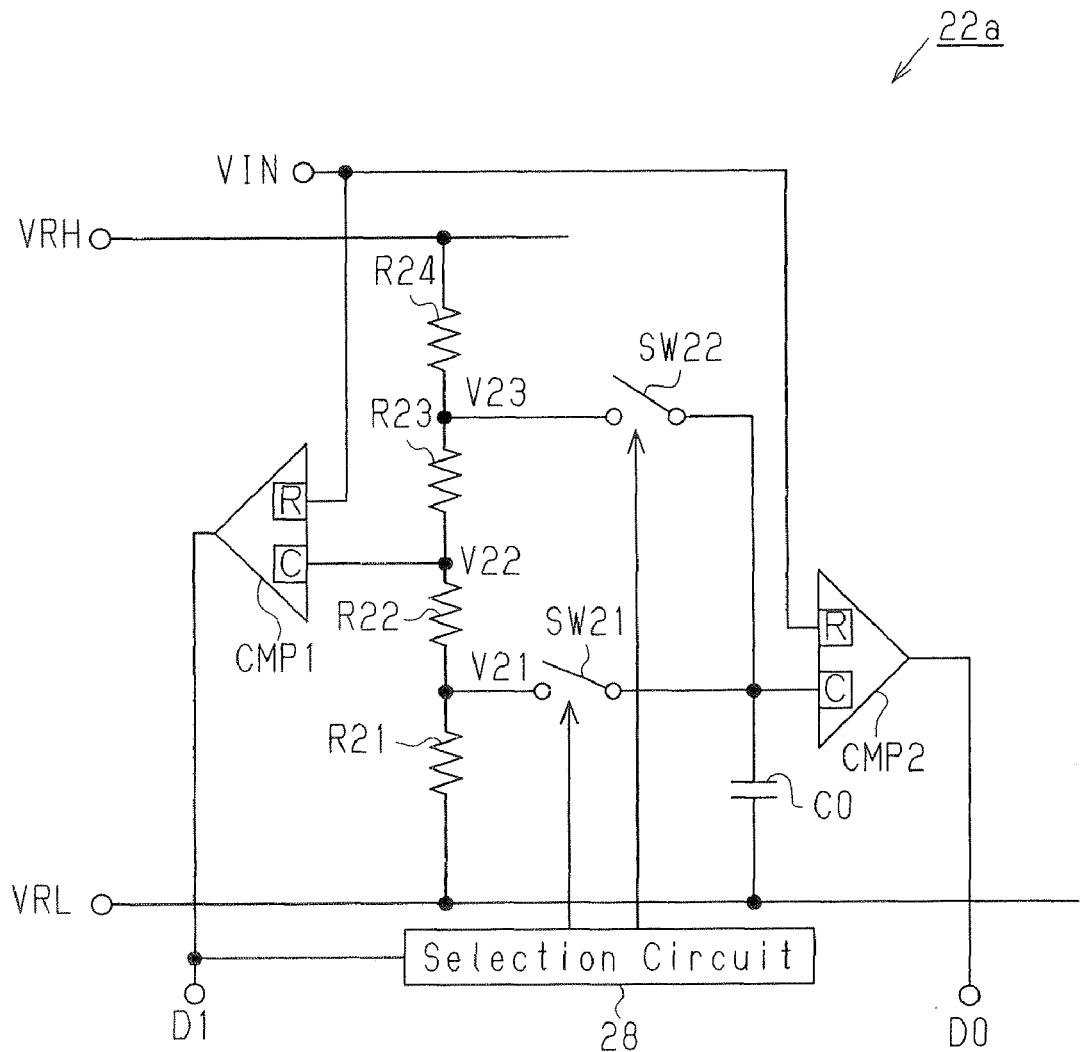
FIG. 42 is a circuit diagram showing an A/D conversion circuit of another embodiment.

In the A/D conversion circuit 22 of the first embodiment described above, the comparator CMP1 uses the reference voltage V22 as a sampling source (source subject to charging) and the input voltage VIN as the source subject to comparison, and the comparator CMP2 uses the input voltage VIN as the sampling source and the reference voltage V21 or V23 as the source subject to comparison. The present invention is not limited in such a manner, and as in the A/D conversion circuit 22a shown in FIG. 42, the comparator CMP1 and the comparator CMP2 may use the same input voltage VIN as the sampling source (source subject to charging).

Specifically, in the comparator CMP1 of the A/D conversion circuit 22a, the connection of the input terminals (comparing and sampling) are reversed from the A/D conversion circuit shown in FIG. 6. An output signal from the comparator CMP1 is directly output as a high-order bit signal D1. Otherwise the circuit configuration of the A/D conversion circuit 22a is the same as that of the A/D conversion circuit 22 shown in FIG. 6.

Figure 43:
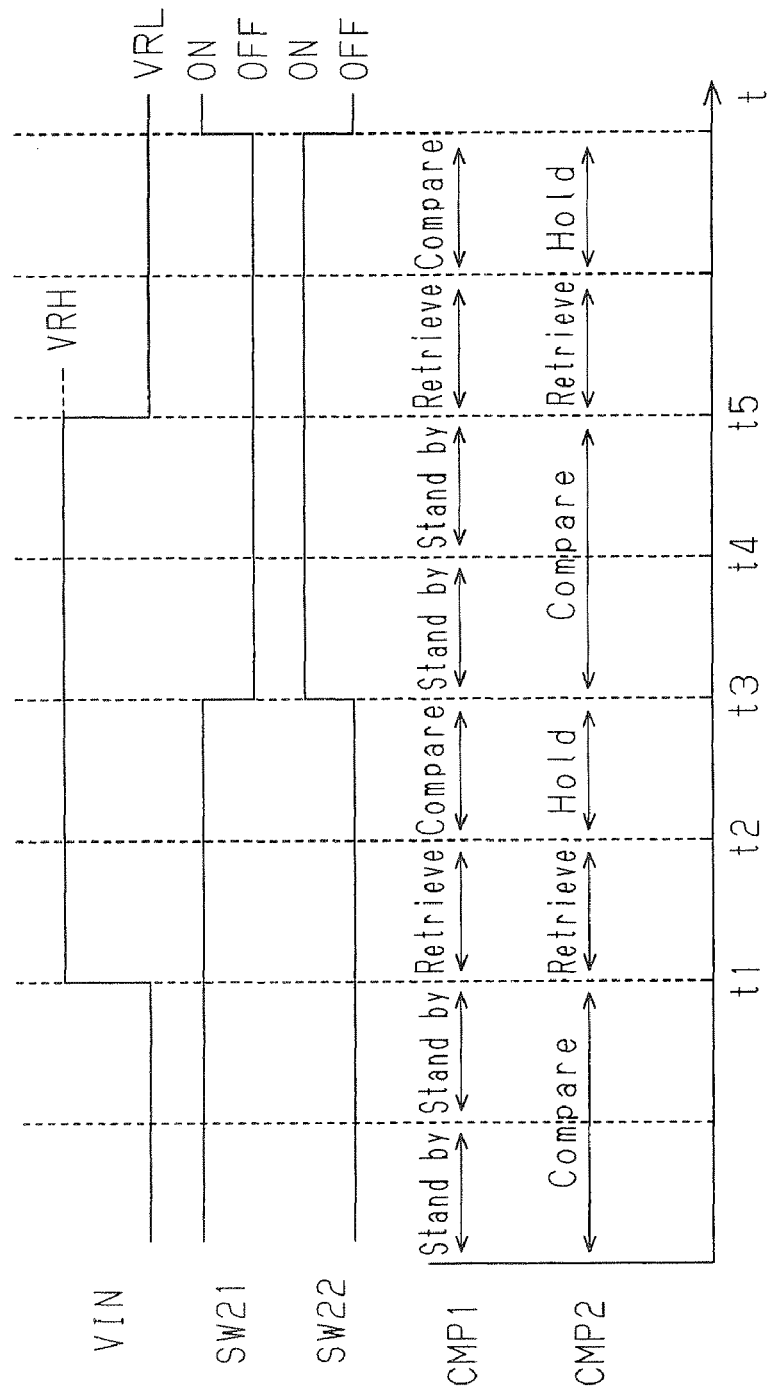
FIG. 43 is an explanatory diagram illustrating operation of the A/D conversion circuit of FIG. 42.
Figures 44, 45:
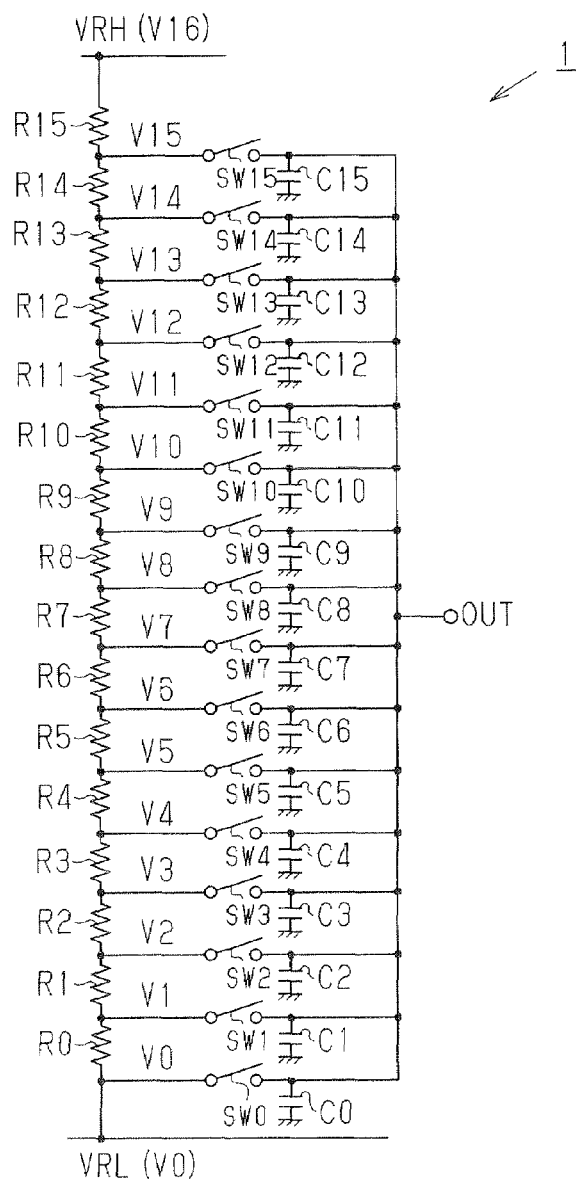
FIG. 44 is an explanatory diagram illustrating operation of the comparators.
FIG. 45 is a circuit diagram showing a conventional D/A conversion circuit.
Figure 46:
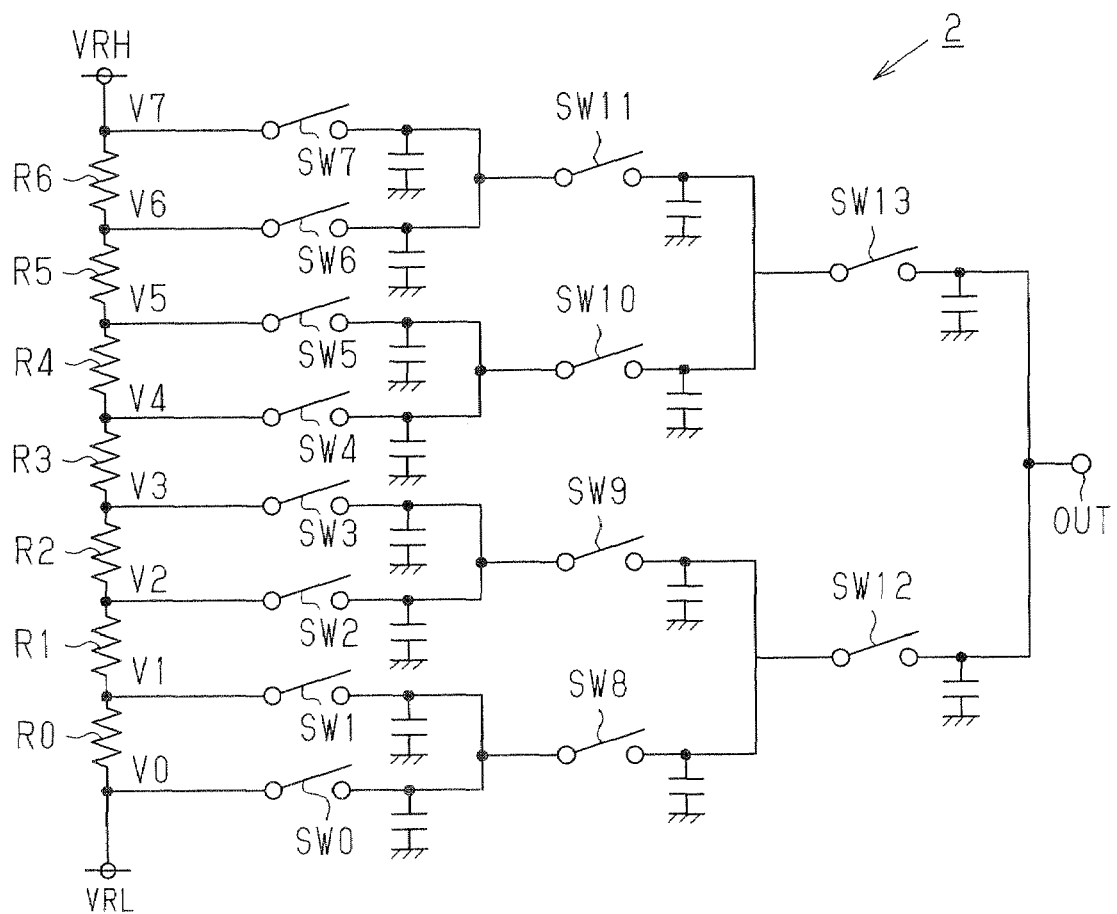
FIG. 46 is a circuit diagram showing a conventional D/A conversion circuit.

FIG. 43 is an explanatory diagram showing the operation of the A/D conversion circuit 22a, and FIG. 44 is an operation table of the comparators CMP1 and CMP2 in the A/D conversion circuit 22a. In the operation example shown in FIG. 43, an input voltage VIN equivalent to a high-potential power supply VRH is input in the period from time t1 to t5 in the same manner as in the first embodiment.

In the period from time t1 to t2, the switches SWA and SWC are turned on and the switch SWB is turned off. Thus, the comparators CMP1 and CMP2 retrieve the input voltage VIN that is applied thereto via the switch SWA into the capacitor C21.

In the period from time t2 to t3, the switches SWA and SWC are turned off and the switch SWB is turned on. Thus, the comparator CMP1 compares the reference voltage V22 that is input to capacitor C21 via the switch SWB with the input voltage VIN, and outputs an H level (=1) signal D1. In the meantime, the comparator CMP2 holds the input voltage VIN retrieved in the capacitor C21 since the switches SWA and SWB are turned off. The switch SWC may be controlled to be either on or off when the comparator CMP2 holds the input voltage VIN.

At time t3, the selection circuit 28 switches the first switch SW21 from on to off and the second switch SW22 from off to on, based on the comparison result (H level signal D1) of the comparator CMP1. Consequently, a reference voltage V23 is input to the comparator CMP2 via the second switch SW22.

During the period from time t3 to t5, the comparator CMP1 performs the comparison operation in continuation from the previous period (from time t2 to t3) and holds the comparison result. During this period, the comparator CMP1 compares the voltage held in the capacitor C21. Thus, the comparison result is not reversed until the comparator CMP1 starts the next retrieval operation of an input voltage VIN.

In the period from time t3 to t5, the switches SWA and SWC are turned off and the switch SWB is turned on. Thus, the comparator CMP2 compares the reference voltage V23 input to the capacitor C21 via the switch SWB with the input voltage VIN to output an H level (=1) signal D0.

In this manner, the A/D conversion circuit 22a repeats the operations in the period from time t1 to t5. Thus, continuous analog signals (input voltages VIN) are converted into 2-bit digital signals D0 and D1. Although the comparison operation of the comparator CMP2 is performed in the period from time t3 to t5 in the A/D conversion circuit 22a, it may be performed in the period from t3 to t4.

Figure 47:
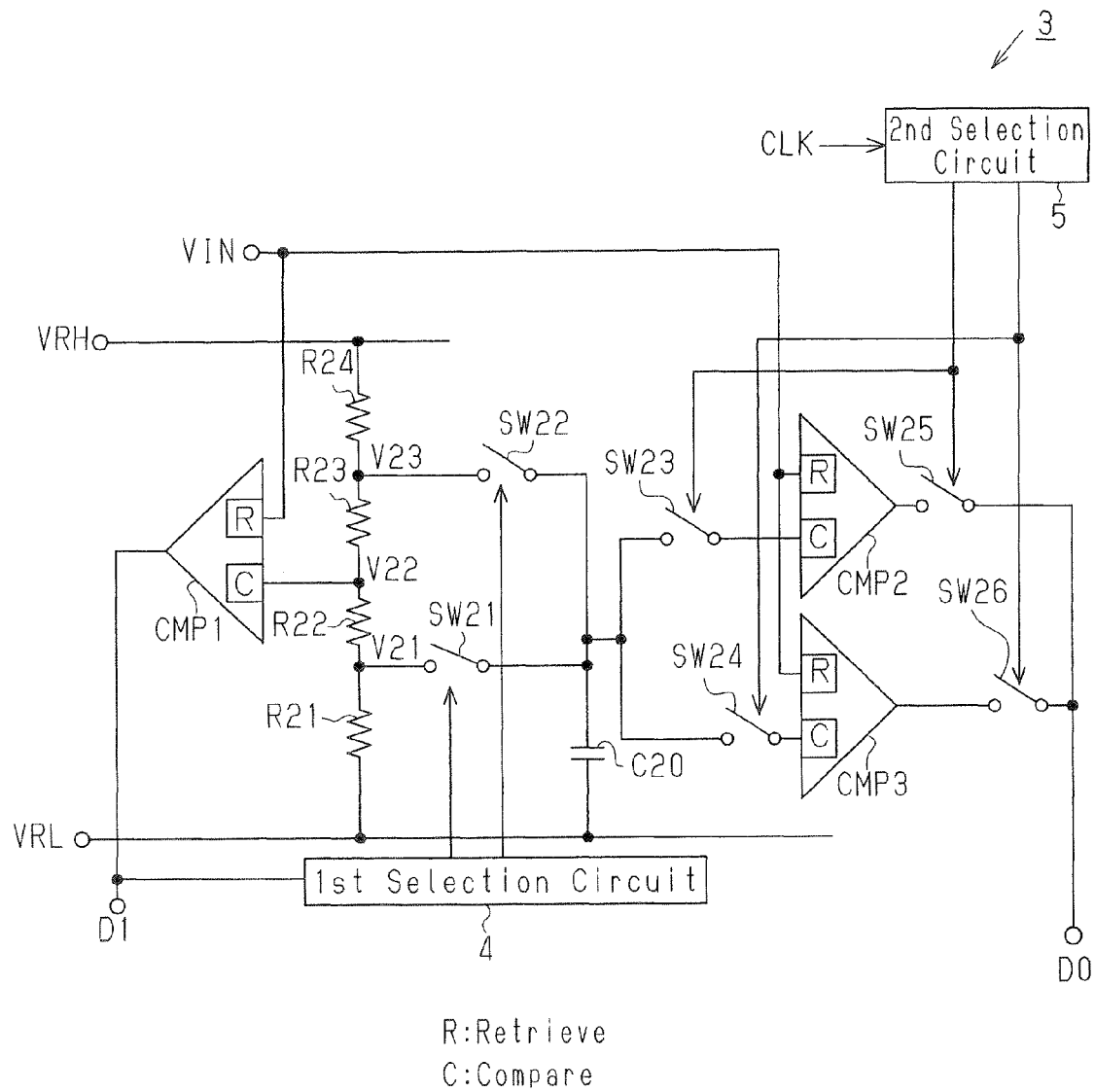
FIG. 47 is a circuit diagram showing a conventional A/D conversion circuit.
Figure 48:
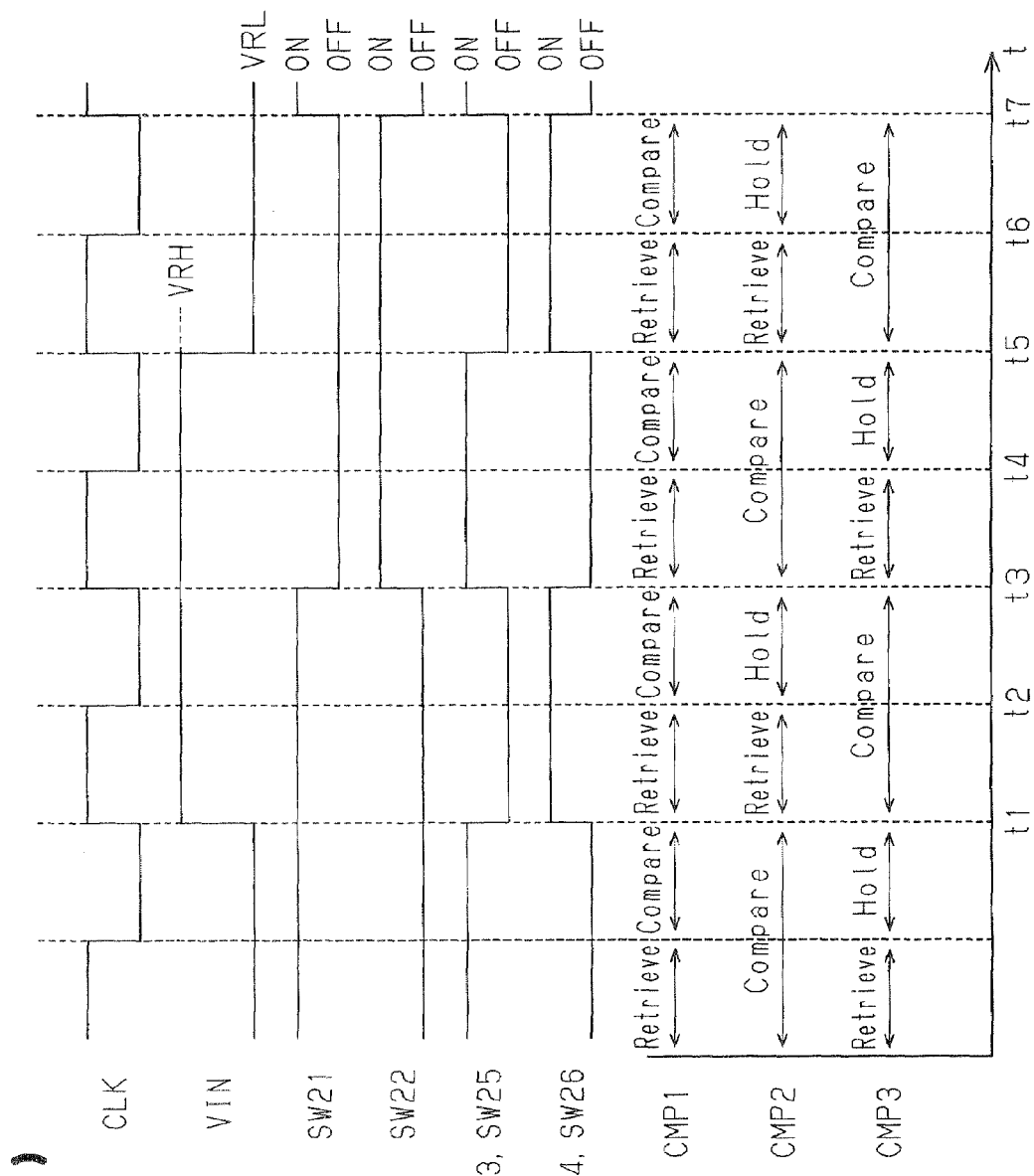
FIG. 48 is an explanatory diagram illustrating operation of the A/D conversion circuit of FIG. 47.
Figure 49:
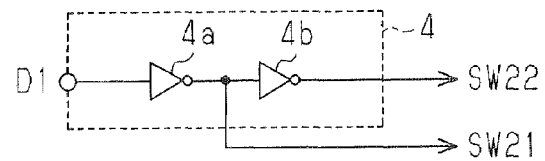
FIG. 49 is a circuit diagram showing a first selection circuit of the A/D conversion circuit of FIG. 47.

In the A/D conversion circuit 22a, the comparator CMP1 and the comparator CMP2 retrieve the input voltage VIN at the same timing. Therefore, the comparator CMP1 is required to wait for the comparator CMP2 to complete the comparison operation. Consequently, the conversion speed of the A/D conversion circuit 22a is restricted in comparison with the conventional A/D conversion circuit 3 (see FIG. 47), but the low-order bits can be converted by the single comparator CMP2. This makes it possible to reduce the consumption current in the A/D conversion circuit 22a.

In the second to sixth embodiments described above, the basic units 32, 42, 52, 62 forming the A/D conversion circuits 31, 41, 51, 61, 71 are designed to output 2-bit signals as the A/D conversion result. However, the basic units may be designed to output 1-bit signals or N-bit signals (N is 3 or larger). Further, although the basic units are connected to form a tree structure with two stages in the A/D conversion circuit 31, 41, 61, the basic units may be connected to form a tree structure with three or more stages. When the basic units are designed to output N-bit signals, the mirror ratio of the current mirror circuit in the second-stage basic unit may be set to $1:2^N$.

In the fifth embodiment, the reference currents I25 to I28 of the second constant current source group in the basic unit 62 are set to the intermediate current values (14, 10, 6, and 2) of the reference currents I20 to I23 of the first constant current source group. However, the present invention is not limited to this. For example, when the mirror ratio of the current mirror circuit formed by the transistors N11 and N25 to N28 is set to 2:1, the set values of the reference currents I25 to I28 may be changed to 7, 5, 3, and 1. The range of the input currents In1 may be determined with this configuration in the same manner as the fifth embodiment.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A serial and parallel A/D conversion circuit for use with low-potential and high-potential power supplies and for separating a high-order bit and a low-order bit and sequentially performing A/D conversion, the A/D conversion circuit comprising:
   a plurality of resistor elements connected in series between the low-potential power supply and the high-potential power supply;
   a plurality of comparators for comparing a reference voltage divided by each of the resistor elements with an analog input voltage, the comparators having a sample-and-hold function for holding a sampled analog input voltage, and the plurality of comparators including a high-order bit comparator and a low-order bit comparator having different sampling sources,
   wherein the high-order bit comparator is configured to compare the analog input voltage and one of the reference voltages to obtain a determination result; and
   selection circuitry configured to select one of the other reference voltages to be input to the low-order bit comparator for comparison with the analog input voltage according to the determination result of the high-order bit comparator.

2. The A/D conversion circuit according to claim 1, wherein the high-order bit comparator uses the reference voltage as a sampling source, and the low-order bit comparator uses the analog input voltage as the sampling source.

3. The A/D conversion circuit according to claim 2, wherein the high-order bit comparator uses the analog input voltage as a comparison subject source, and the low-order bit comparator uses the reference voltage as a comparison subject source.

4. The A/D conversion circuit according to claim 3, wherein the high-order bit comparator completes comparison at substantially the same timing as when the low-order bit comparator completes sampling.

5. The A/D conversion circuit according to claim 3, wherein the high-order bit comparator and the low-order bit comparator have the same circuit configuration and the same characteristics.

6. A serial and parallel A/D conversion circuit for use with low-potential and high-potential power supplies and for separating a high-order bit and a low-order bit and sequentially performing A/D conversion, the A/D conversion circuit comprising:
   a plurality of resistor elements connected in series between the low-potential power supply and the high-potential power supply; and
   a plurality of comparators for comparing a reference voltage divided by each of the resistor elements with an analog input voltage, the comparators having a sample-and-hold function for holding a sampled analog input voltage, and the plurality of comparators including a high-order bit comparator and a low-order bit comparator having sampling sources that are the same, wherein the high-order bit comparator remains in a standby state from when comparison is completed to when the low-order bit comparator completes comparison,
   wherein the low-order bit comparator holds the analog input voltage from the time that the low-order bit comparator retrieves the analog input voltage until the low-order bit comparator performs comparison.

* * * * *

UNITED STATES PATENT AND TRADEMARK OFFICE
CERTIFICATE OF CORRECTION

| | | |
|---|---|---|
| PATENT NO. | : 7,760,125 B2 | Page 1 of 1 |
| APPLICATION NO. | : 12/026901 | |
| DATED | : July 20, 2010 | |
| INVENTOR(S) | : Yoshiaki Shimizu et al. | |

It is certified that error appears in the above-identified patent and that said Letters Patent is hereby corrected as shown below:

TITLE PAGE-

In (73) Assignee:

Please Delete:

"FUJITSU MICROELECTRONICS LIMITED"

Please Add:

--FUJITSU SEMICONDUCTOR LIMITED--

Signed and Sealed this
Twenty-eighth Day of June, 2011

David J. Kappos
*Director of the United States Patent and Trademark Office*